United States Patent
Ono et al.

(10) Patent No.: US 10,136,091 B2
(45) Date of Patent: Nov. 20, 2018

(54) SOLID-STATE IMAGE PICKUP ELEMENT AND IMAGE PICKUP SYSTEM

(71) Applicant: CANON KABUSHIKI KAISHA, Tokyo (JP)

(72) Inventors: Toshiaki Ono, Ebina (JP); Masatsugu Itahashi, Yokohama (JP); Naoki Inatani, Kawasaki (JP); Yu Maehashi, Yokohama (JP); Hidekazu Takahashi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 44 days.

(21) Appl. No.: 14/809,753

(22) Filed: Jul. 27, 2015

(65) Prior Publication Data

US 2016/0037117 A1 Feb. 4, 2016

(30) Foreign Application Priority Data

Jul. 31, 2014 (JP) ................................ 2014-156789

(51) Int. Cl.
  *H04N 5/3745* (2011.01)
  *H04N 5/217* (2011.01)
  *H01L 27/146* (2006.01)

(52) U.S. Cl.
  CPC ..... *H04N 5/3745* (2013.01); *H01L 27/14667* (2013.01); *H04N 5/2173* (2013.01)

(58) Field of Classification Search
  CPC ............ H01L 27/14643; H01L 31/028; H01L 27/307; H01L 27/14627; H01L 31/095; H01L 27/14609; H01L 27/14621; H01L 27/14623; H01L 27/14629; H01L 27/1463; H01L 27/14665; H01L 27/14667; H04N 5/3765; H04N 5/378; H04N 5/3745; H04N 5/2173
  See application file for complete search history.

(56) References Cited

U.S. PATENT DOCUMENTS

| 9,288,382 B2 * | 3/2016 | Fujii | H04N 5/347 |
| 2005/0219392 A1 * | 10/2005 | Suzuki | H04N 5/235 |
| | | | 348/294 |

(Continued)

FOREIGN PATENT DOCUMENTS

| CN | 1751501 A | 3/2006 |
| FR | 2893765 A1 | 5/2007 |

(Continued)

OTHER PUBLICATIONS

The partial European search report (R. 64 EPC) for European Application No. 15176841.3—1552/2980851, dated Mar. 23, 2016.

*Primary Examiner* — Albert Cutler
(74) *Attorney, Agent, or Firm* — Canon U.S.A., Inc. IP Division

(57) ABSTRACT

At least one solid-state image pickup element includes a plurality of pixels that are arranged in a two-dimensional manner. Each of the plurality of pixels includes a plurality of photoelectric conversion units each including a pixel electrode, a photoelectric conversion layer disposed on the pixel electrode, and a counter electrode disposed such that the photoelectric conversion layer is sandwiched between the pixel electrode and the counter electrode. In one or more embodiments, each of the plurality of pixels also includes a microlens disposed on the plurality of photoelectric conversion units.

22 Claims, 37 Drawing Sheets

(56) References Cited

U.S. PATENT DOCUMENTS

| | | | |
|---|---|---|---|
| 2007/0138470 A1 | 6/2007 | Alieu et al. | |
| 2009/0026379 A1* | 1/2009 | Yaegashi | G01T 1/2018 |
| | | | 250/370.09 |
| 2010/0060769 A1* | 3/2010 | Inuiya | H01L 27/14623 |
| | | | 348/311 |
| 2011/0049591 A1* | 3/2011 | Nakatani | H01L 27/307 |
| | | | 257/292 |
| 2012/0200752 A1 | 8/2012 | Matsunaga | |
| 2013/0088621 A1* | 4/2013 | Hamada | H04N 5/3696 |
| | | | 348/281 |
| 2013/0182173 A1* | 7/2013 | Murata | H01L 27/14605 |
| | | | 348/349 |
| 2016/0182794 A1* | 6/2016 | Aoki | H04N 5/243 |
| | | | 348/229.1 |

FOREIGN PATENT DOCUMENTS

| | | |
|---|---|---|
| JP | 2014-067948 A | 4/2014 |
| JP | 2014-135451 A | 7/2014 |
| JP | 2015-207594 A | 11/2015 |
| WO | 2012/035702 A1 | 3/2012 |
| WO | 2014/118868 A1 | 8/2014 |

\* cited by examiner

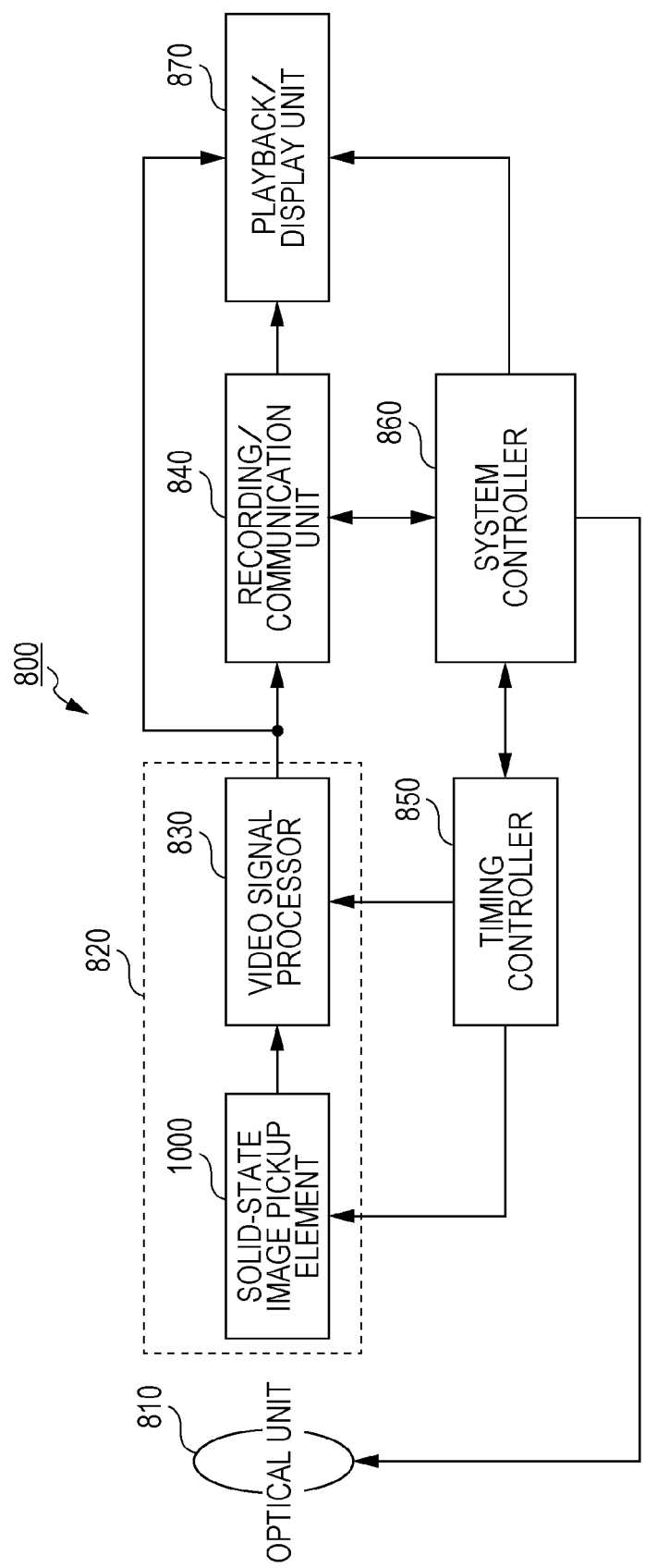

SOLID-STATE IMAGE PICKUP ELEMENT AND IMAGE PICKUP SYSTEM

BACKGROUND OF THE INVENTION

Field of the Invention

The present disclosure relates to at least one solid-state image pickup element in which a photoelectric conversion layer is disposed on a substrate and at least one image pickup system.

Description of the Related Art

There is a solid-state image pickup element including pixels that include a light receiver in which a photoelectric conversion layer is disposed on a substrate. Japanese Patent Laid-Open No. 2014-67948 describes a technique of using an organic photoelectric conversion layer as a photoelectric conversion layer. Further, Japanese Patent Laid-Open No. 2014-67948 describes a technique of providing a pair of phase difference detection pixels to realize pupil-split phase difference detection. The phase difference detection pixels have a light shielding film that blocks part of incident light and that is disposed between a protective layer on the photoelectric conversion layer and a microlens.

However, according to the technique described in Japanese Patent Laid-Open No. 2014-67948, the positions of the phase difference detection pixels are fixed and thus the position of a ranging point for realizing phase difference detection is fixed. Accordingly, the present disclosure is directed to easily changing the positions of phase difference detection pixels.

SUMMARY OF THE INVENTION

A solid-state image pickup element according to an aspect of the present disclosure includes a plurality of pixels that are arranged in a two-dimensional manner. Each of the plurality of pixels includes a plurality of photoelectric conversion units each including a pixel electrode, a photoelectric conversion layer disposed on the pixel electrode, and a counter electrode disposed such that the photoelectric conversion layer is sandwiched between the pixel electrode and the counter electrode. In one or more embodiments, light collected by one microlens enters the plurality of photoelectric conversion units. In one or more embodiments, each of the plurality of pixels also includes a microlens disposed on the plurality of photoelectric conversion units.

A solid-state image pickup element according to another aspect of the present disclosure includes a plurality of pixels that are arranged in a two-dimensional manner. Each of the plurality of pixels includes a photoelectric conversion unit including a pixel electrode, a photoelectric conversion layer disposed on the pixel electrode, and a counter electrode disposed such that the photoelectric conversion layer is sandwiched between the pixel electrode and the counter electrode, and also includes a microlens disposed on the photoelectric conversion unit. At least one of the pixel electrode and the counter electrode included in each of the plurality of pixels includes a plurality of partial electrodes that are controllable independently of one another.

Further features of the present disclosure will become apparent from the following description of exemplary embodiments with reference to the attached drawings.

BRIEF DESCRIPTION OF THE DRAWINGS

FIG. 36 is a block diagram illustrating an example configuration of an image pickup system according to a ninth embodiment.

DESCRIPTION OF THE EMBODIMENTS

First Embodiment

Figure 1:
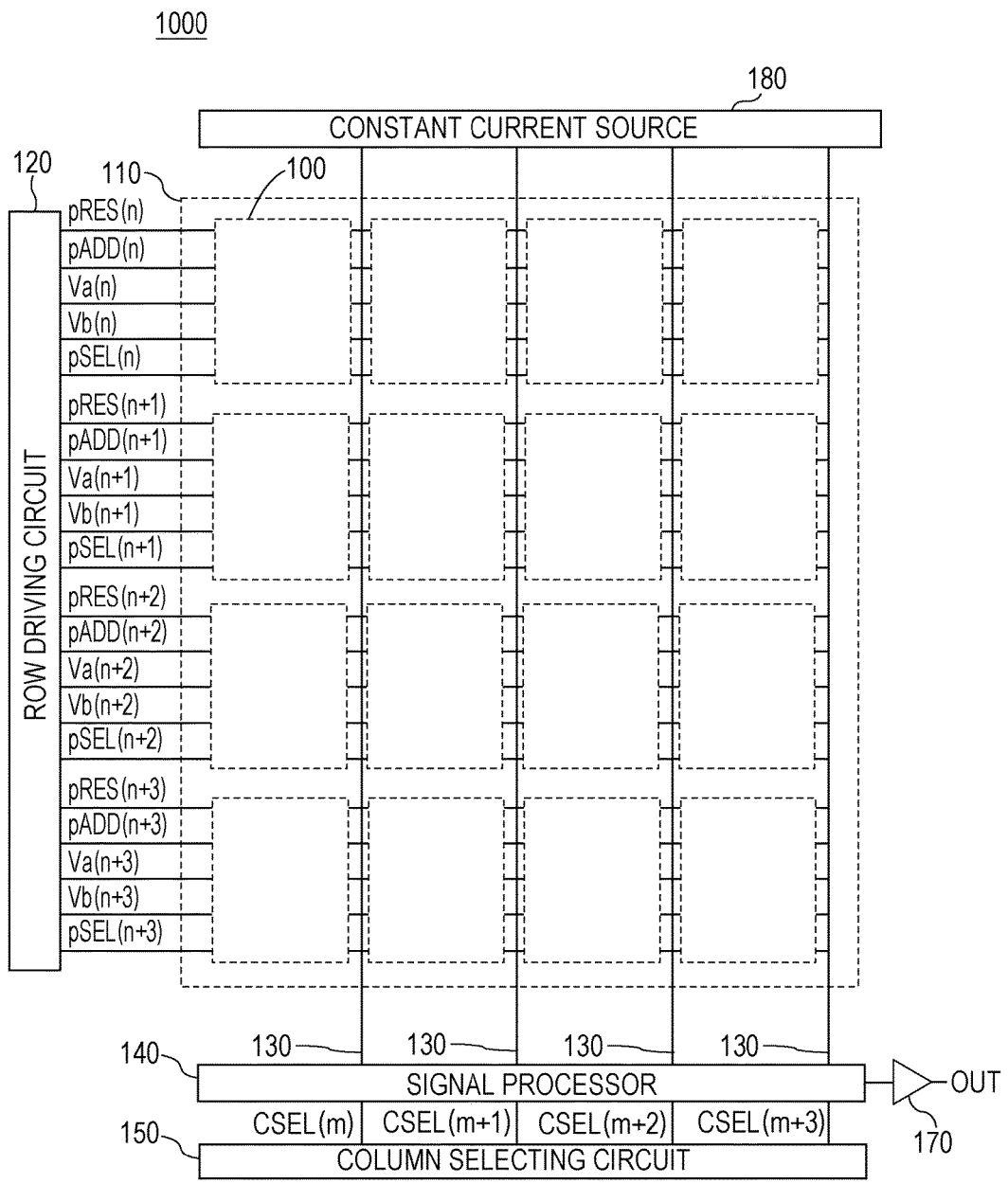
FIG. 1 is a block diagram illustrating an example configuration of a solid-state image pickup element according to a first embodiment.

FIG. 1 is a block diagram illustrating an example configuration of a solid-state image pickup element 1000. The solid-state image pickup element 1000 includes a pixel array 110 including a plurality of pixels 100 that are arranged in a two-dimensional manner, a row driving circuit 120, vertical signal lines 130, a signal processor 140, a column selecting circuit 150, an output amplifier 170, and a constant current source 180.

FIG. 1 illustrates a case where the pixel array 110 includes the pixels 100 arranged in four rows×four columns, but the number of pixels 100 included in the pixel array 110 is not limited thereto.

The row driving circuit 120 is a circuit that controls the plurality of pixels 100 in units of rows, and includes, for example, a shift register and an address decoder. In this embodiment, the row driving circuit 120 outputs signals pRES(n), pADD(n), Va(n), Vb(n), and pSEL(n). Here, n is a number representing a row. The row driving circuit 120 functions as a pixel electrode controller that controls the potentials of pixel electrodes included in the pixels 100 via a drive capacitor (described below).

The plurality of pixels 100 belonging to the same column are connected to the same vertical signal line 130. Signals output from the pixels 100 are transmitted to the signal processor 140 through the vertical signal lines 130.

The signal processor 140 includes a plurality of column signal processors, each of which is provided for a corresponding one of the columns of the pixel array 110. Each column signal processor may include a CDS circuit for reducing noise, an amplifier for amplifying a signal, and a sample-and-hold circuit for holding a signal. The column signal processor outputs a signal upon being selected by a signal CSEL(m) supplied from the column selecting circuit 150. The output signal is transmitted to the output amplifier 170. Here, m is a number representing a column.

Figure 2:
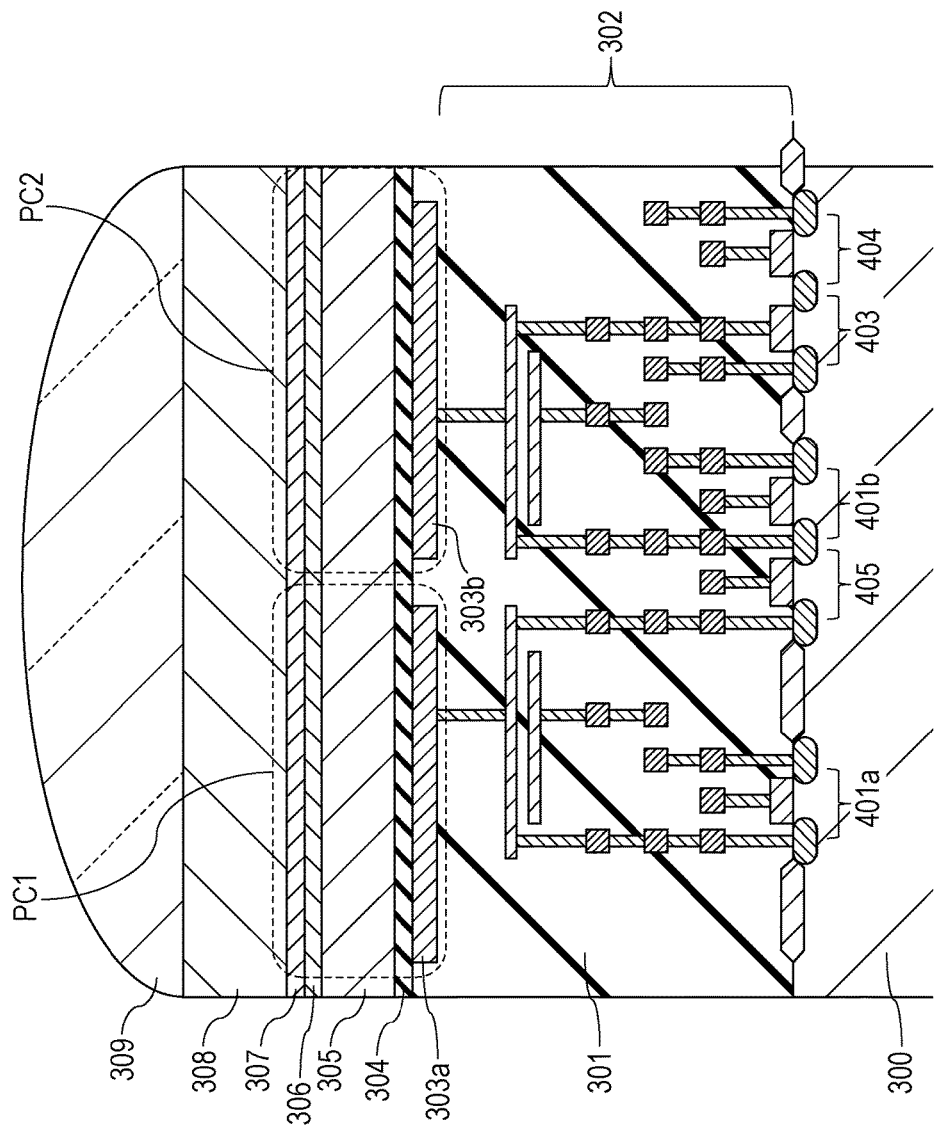
FIG. 2 is a diagram illustrating an example of a cross-sectional structure of a pixel according to the first embodiment.

FIG. 2 illustrates an example structure along a cross-section of one of the pixels 100. In this embodiment, the pixel 100 includes two photoelectric conversion units PC1 and PC2. The two photoelectric conversion units PC1 and PC2 share an amplification transistor 403 and a selection transistor 404 described below. The pixel array 110 includes a silicon substrate (Si substrate) 300, a lower insulating layer 301 disposed on the Si substrate 300, and a wiring layer 302 disposed in the lower insulating layer 301. A MOS transistor is disposed on the Si substrate 300. A wiring line for supplying power to the MOS transistor and a wiring line for transmitting a signal for controlling the MOS transistor are included in the wiring layer 302. Some of wiring lines included in the wiring layer 302 connect a signal reading circuit (not illustrated) disposed on the Si substrate 300 to a pixel electrode 303. On the pixel electrode 303, there are disposed an interlayer insulating layer 304, a photoelectric conversion layer 305, a blocking layer 306, a counter electrode 307, a color filter layer 308, and a microlens layer 309 including a plurality of microlenses. In this embodiment, two pixel electrodes 303a and 303b are disposed in one pixel 100, whereas the counter electrode 307 is disposed for a plurality of photoelectric conversion units in common. In this structure, light collected by one microlens enters a plurality of photoelectric conversion units. Bayer arrangement may be used for arranging color filters in the color filter layer 308. The two pixel electrodes 303a and 303b disposed in one pixel 100 may also be referred to as partial electrodes that are controllable independently of each other.

The two pixel electrodes 303a and 303b provided for the same microlens are separated from each other with a distance d therebetween and constitute two photoelectric conversion units. Although not illustrated in the figure, pixel electrodes of adjacent pixels may be separated from each other with a distance D therebetween, which is larger than the distance d. The pixel electrode 303a of a certain pixel is disposed at the distance d from the pixel electrode 303b of the certain pixel, and at the distance D from the pixel electrode 303b of an adjacent pixel. With such a disposition of pixel electrodes, the occurrence of a phenomenon can be suppressed in which charges generated in accordance with light that has entered a certain pixel are stored in the photoelectric conversion unit of an adjacent pixel. In a case where each pixel includes color filters, mixture of colors can be reduced.

The interlayer insulating layer 304 disposed on the pixel electrode 303 inhibits passage of electrons and holes between the pixel electrode 303 and the photoelectric conversion layer 305, and is formed of, for example, hydrogenated amorphous silicon nitride (a-SiN:H). The interlayer insulating layer 304 has such a thickness that passage of electrons and holes is not caused by a tunnel effect. Specifically, the interlayer insulating layer 304 may have a thickness of 50 nm or more.

The photoelectric conversion layer 305 disposed on the pixel electrode 303 via the interlayer insulating layer 304 has a photoelectric conversion ability for generating an electron-hole pair in response to incident light. The photoelectric conversion layer 305 may be formed of an intrinsic hydrogenated amorphous silicon (a-Si:H), a compound semiconductor, or an organic semiconductor. Examples of the compound semiconductor include a III-VI compound semiconductor such as BN, GaAs, GaP, AlSb, and GaAlAsP, and a II-IV compound semiconductor such as CdSe, ZnS, and HdTe. Examples of the organic semiconductor include a phthalocyanine material and a naphthalocyanine material such as fullerene, coumarin 6 (C6), rhodamine 6G (R6G), quinacridon, and zinc phthalocyanine (ZnPc).

A quantum dot film made of the above-described compound semiconductor may be used as the photoelectric conversion layer 305. An amorphous silicon film, an organic semiconductor film, and a quantum dot film may be used because a thin film can be easily formed therewith.

An intrinsic semiconductor has a low carrier density, and thus use of this for the photoelectric conversion layer 305 results in a large width of a depletion layer. Alternatively, an N− type or P− type semiconductor may be used.

The blocking layer 306 is disposed on the photoelectric conversion layer 305. The blocking layer 306 according to this embodiment has a function of inhibiting injection of holes from the counter electrode 307 into the photoelectric conversion layer 305, and is formed of, for example, an N+ type hydrogenated amorphous silicon. In this example, N+ type a-SiH is used to inhibit injection of holes. A P+ type a-SiH may be used to inhibit injection of electrons. The blocking layer 306 is required to inhibit injection of carriers of one of conductivity types, electrons or holes, from the counter electrode 307 into the photoelectric conversion layer 305. A P-type or N-type semiconductor of the semiconductor material used for the photoelectric conversion layer 305 may be used for the blocking layer 306. In this case, the impurity concentration of the semiconductor used for the blocking layer 306 is higher than the impurity concentration of the semiconductor used for the photoelectric conversion layer 305.

The counter electrode 307, which is disposed on the photoelectric conversion layer 305 via the blocking layer 306, is formed of a material that transmits light that has entered via the microlens layer 309 and the color filter layer 308 to the photoelectric conversion layer 305. Specifically, a compound or an oxide containing indium and tin, such as ITO, may be used.

Further, a light transmission layer may be disposed between the counter electrode 307 and the microlens layer 309. The microlens layer 309, the color filter layer 308, and the light transmission layer may be designed such that the focal point of the microlens layer 309 is in the photoelectric conversion layer 305. The light transmission layer may be formed of an inorganic material, such as silicon oxide or silicon nitride, or may be formed of an organic material.

Figure 3:
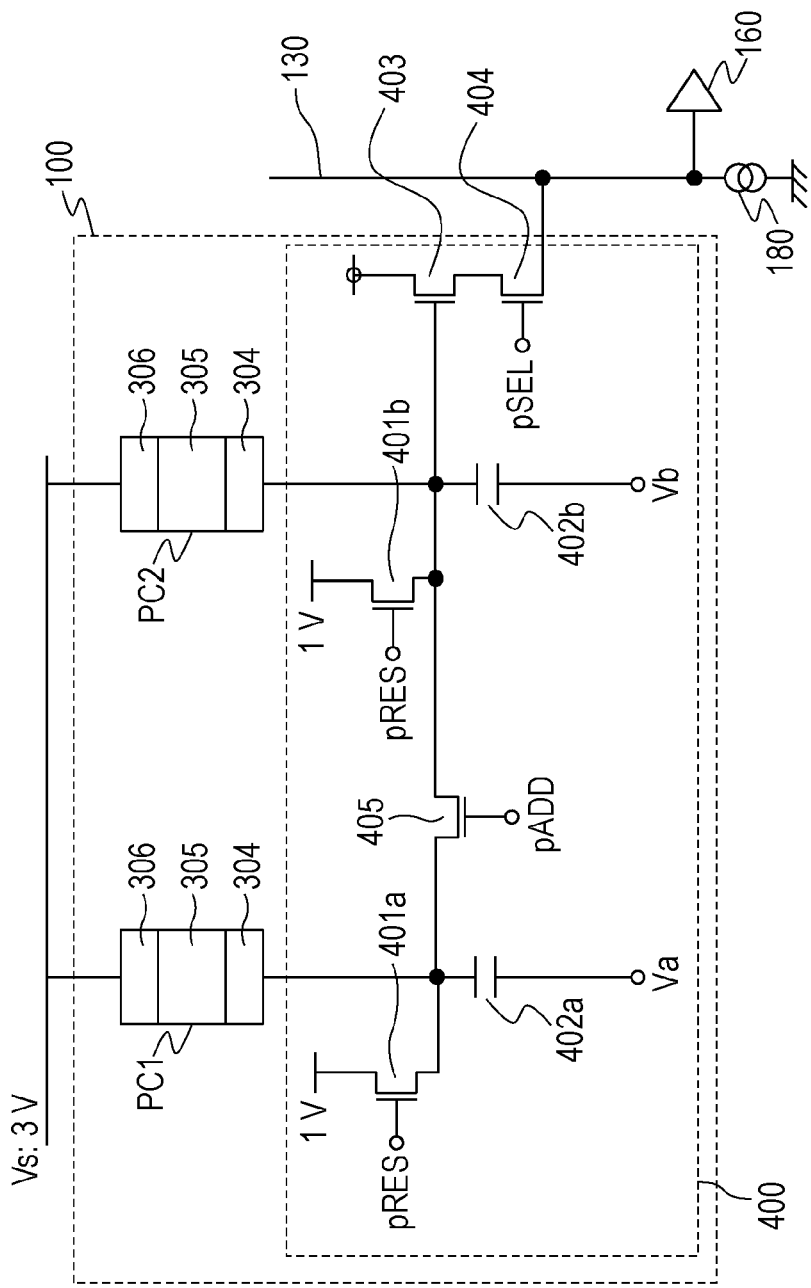
FIG. 3 is an equivalent circuit diagram illustrating an example configuration of the pixel according to the first embodiment.

FIG. 3 is an equivalent circuit diagram of the pixel 100 according to this embodiment. The pixel 100 includes the photoelectric conversion units PC1 and PC2 that are made up of the blocking layer 306, the photoelectric conversion layer 305, and the interlayer insulating layer 304, and a signal reading circuit 400.

The signal reading circuit 400 includes reset transistors 401a and 401b, drive capacitors 402a and 402b, the amplification transistor 403, the selection transistor 404, and a switch 405. A reset voltage is supplied to one main node of the reset transistor 401a, and the other main node is connected to the pixel electrode 303a of the photoelectric conversion unit PC1. A common node of the other main node of the reset transistor 401a and the pixel electrode 303a is referred to as a node N1. A reset signal pRES1 is supplied to a control node of the reset transistor 401a. A bias voltage Va is supplied to one node of the drive capacitor 402a, and the other node is connected to the node N1. The node N1 is connected to a control node of the amplification transistor 403 via the switch 405. The control node of the amplification transistor 403 is referred to as a node N2. The switch 405 is controlled by a signal pADD. The pixel electrode 303b of the photoelectric conversion unit PC2 is connected to the node N2. Further, the reset transistor 401b and the drive capacitor 402b are connected to the node N2. A reset signal pRES2 is supplied to a control node of the reset transistor 401b. A bias voltage Vb is applied to one node of the drive capacitor 402b, and the other node is connected to the node N2. The photoelectric conversion unit PC2 is connected to the node N2 via the pixel electrode 303b. A fixed voltage is applied to one main node of the amplification transistor 403, and the other main node is connected to the vertical signal line 130 via the selection transistor 404. A pixel selection signal pSEL is supplied to a control node of the selection transistor 404. Upon turn-on of the selection transistor 404, the amplification transistor 403 functioning as an in-pixel amplifier operates as a source follower circuit together with the constant current source 180, and a voltage output corresponding to the potential of the node N1 is input to the signal processor 140 as a pixel signal from the pixel 100. The node N1 is an input unit of the in-pixel amplifier. The in-pixel amplifier is not limited to a source follower circuit, but may be a source-grounded amplification circuit, or may be an inverter or differential amplifier constituted by a plurality of transistors.

Figure 4:
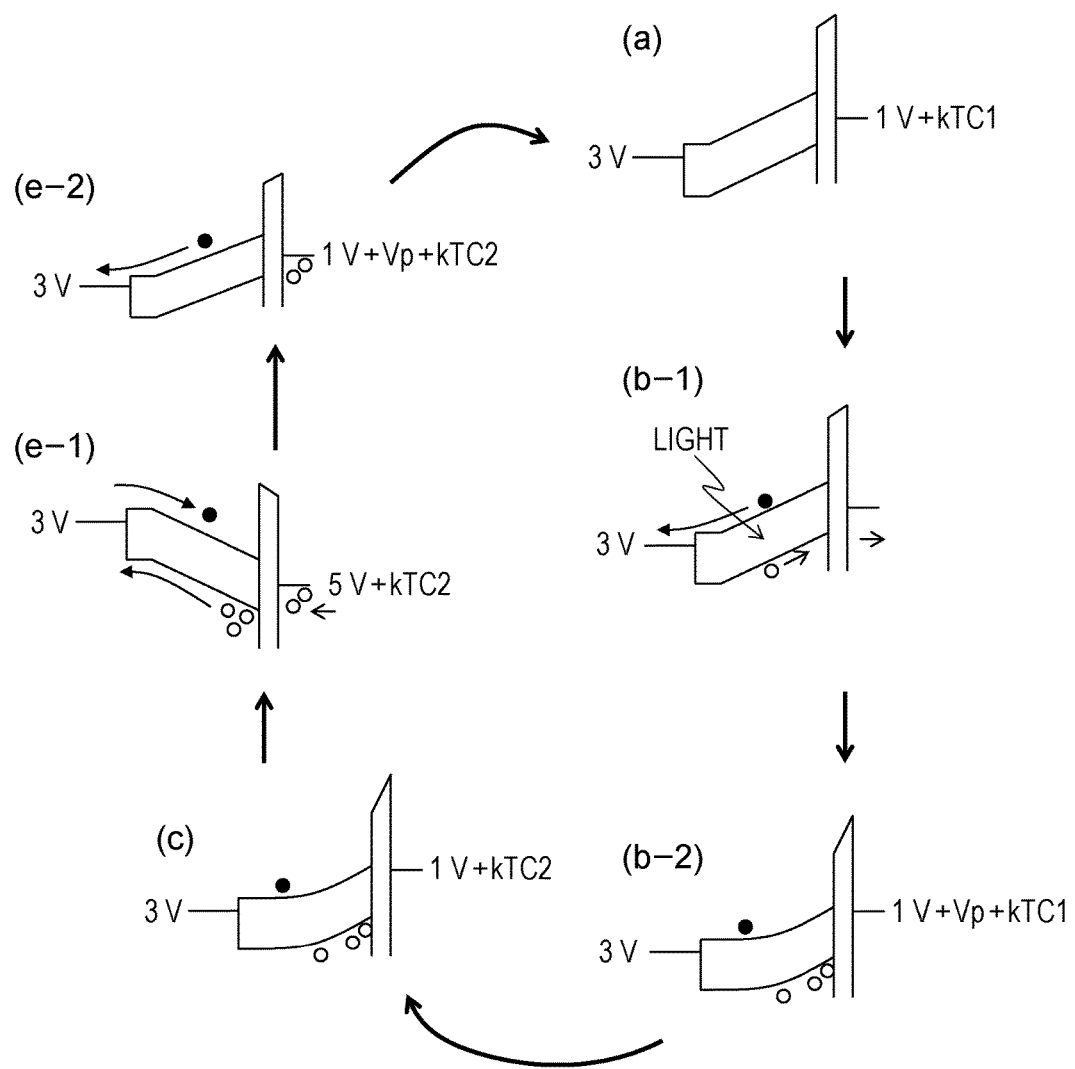
FIG. 4 is a diagram illustrating the potential of a photoelectric conversion unit and describing a signal reading operation according to the first embodiment.

Next, a description will be given of an operation of reading a signal from the pixel 100 according to this embodiment. For simplicity, a description will be given here of the case of reading a signal from the photoelectric conversion unit PC2 when the switch 405 is in an OFF-state. FIG. 4 is a diagram illustrating the potential of the photoelectric conversion unit and describes a signal reading operation. In FIG. 4, the potential with respect to electrons decreases toward the lower side. FIG. 4 illustrates the state of the potential in each region in the order of, from the left, the counter electrode 307 (corresponding to the node N2), the photoelectric conversion layer 305, the interlayer insulating layer 304, and the pixel electrode 303b. Here, illustration of the blocking layer 306 is omitted to simplify the description. In FIG. 4, a black circle represents an electron, and a white circle represents a hole.

In this embodiment, it is assumed that a reset voltage is 1 V, and a bias voltage Vs for driving the photoelectric conversion unit applied to an upper electrode is 3 V. Further, it is assumed that the bias voltage Vb can be switched to 5 V or 0 V by a control circuit (not illustrated). The number given here is an example, and the value of the bias voltage is not limited.

The reading operation for the pixel 100 is implemented by performing the following operations a) to f).
a) Pre-storage reset
b) Photocharge storage
c) Post-storage reset
d) N-signal reading
e) Charge transfer
f) S-signal reading Hereinafter, the individual operations will be described in detail below.

a) Pre-Storage Reset

The reset transistor 401b is turned on in a state where the bias voltage Vb is set to 0 V, and thereby the node N2 is reset to 1 V. After that, the reset transistor 401b is turned off, and thereby kTC noise (kTC1) resulting from the operation of the reset transistor 401b is generated. Accordingly, the potential of the node N2, that is, the pixel electrode 303b, becomes 1 V+kTC1 (part (a) of FIG. 4).

b) Photocharge Storage

After the pre-storage reset is completed in a state where light has entered the photoelectric conversion layer 305, a photocharge storage operation is started. The bias voltage Vb is kept at 0 V while the photocharge storage operation is in progress. Thus, the potential of the pixel electrode 303b becomes negative relative to the counter electrode 307 to which a voltage of 3 V is applied. Accordingly, the electrons in the photoelectric conversion layer 305 are led toward the counter electrode 307, and discharged from the counter electrode 307 via the blocking layer 306. On the other hand, holes are led toward the pixel electrode 303. Since the blocking layer 306 exists, injection from the counter electrode 307 into the photoelectric conversion layer 305 is not performed (part (b-1) of FIG. 4).

Absorption of incident light into the photoelectric conversion layer 305 generates electron-hole pairs in accordance with the amount of incident light. The electrons that have been generated are discharged from the counter electrode 307, whereas the holes that have been generated move in the photoelectric conversion layer 305 and reach the interface between the photoelectric conversion layer 305 and the interlayer insulating layer 304. However, the holes are not able to move into the interlayer insulating layer 304, and are thus stored in the photoelectric conversion layer 305 (part (b-2) of FIG. 4). The holes stored in this manner are used as signal charges based on incident light. The holes stored in the photoelectric conversion layer 305 raises the potential of the node N2 by Vp, and the potential of the node N1 becomes 1 V+kTC1+Vp1.

c) Post-Storage Reset

The reset transistor 401b is temporarily brought into an ON-state, and thereby the node N2 is reset to 1 V. Since noise (kTC2) is generated in accordance with the operation of the reset transistor 401b, the potential of the node N2 becomes 1 V+kTC2. The noise kTC1 generated in the pre-storage reset and the noise kTC2 generated in the post-storage reset are so-called random noise components that are not related to each other.

Even if the node N2 is reset by the reset transistor 401b, the holes stored in the photoelectric conversion layer 305 remain in the photoelectric conversion layer 305 (part (c) of FIG. 4).

d) N-Signal Reading

The selection transistor 404 is turned on, and a signal corresponding to the potential of the node N2 at this time is output to the vertical signal line 130. The output signal is held by, for example, the column signal processor.

e) Charge Transfer

The bias voltage Vb is changed from 0 V to 5 V. Accordingly, the potential of the node N2 is changed. The amount of change in the potential is determined by the ratio of the capacitance of the photoelectric conversion unit to the capacitance of the drive capacitor 402b. If it is assumed that the capacitance of the photoelectric conversion unit is represented by C1, the capacitance of the drive capacitor 402b is represented by C2, and a positive amount of change in the bias voltage Vb is represented by ΔVb, an amount of change ΔVN2 in the potential of the node N2 is expressed by the following equation.

$$\Delta VN2 = \Delta Vb \times C1/(C1+C2) \qquad (1)$$

In this embodiment, in a case where the capacitance C1 of the drive capacitor 402b is four times the capacitance C2 of the photoelectric conversion unit, the amount of change in the potential of the node N2 when the bias voltage Vb is changed by 5 V is 4 V.

When the potential of the node N2 increases by 4 V and becomes 5 V+kTC2, the potential of the node N2 and the potential of the counter electrode 307 are reversed. As a result, the gradient of the potential in the photoelectric conversion layer 305 is reversed (part (e-1) of FIG. 4). Accordingly, electrons are injected from the counter electrode 307 into the photoelectric conversion layer 305 via the blocking layer 306. The holes stored in the photoelectric conversion layer 305 are led toward the counter electrode 307, and are recoupled to the electrons in the blocking layer 306 to disappear. As a result, all the holes stored in the photoelectric conversion layer 305 are discharged from the photoelectric conversion layer 305. That is, the photoelectric conversion layer 305 is completely depleted and thereby complete transfer is performed (part (e-2) of FIG. 4).

Subsequently, when the bias voltage Vb is set to 0 V again, the potential of the node N2 becomes negative relative to the potential of the counter electrode 307. Thus, the electrons that are injected into the photoelectric conversion layer 305 when the bias voltage Vb is 5 V are discharged from the photoelectric conversion layer 305 via the blocking layer 306. In this way, the amount of electrons that are discharged and the amount of electrons that are injected into the photoelectric conversion layer 305 are ideally equal to each other, which does not affect signal reading. With the bias voltage Vb being set to 0 V, the potential of the node N2 attempts to return to 1 V+kTC2. However, the blocking layer 306 disposed between the counter electrode 307 and the photoelectric conversion layer 305 inhibits injection of holes into the photoelectric conversion layer 305. Thus, a signal based on the holes stored in the photoelectric conversion layer 305 through the photocharge storage operation remains as an optical signal component Vp, and thus the potential of the node N2 becomes 1 V+kTC2+Vp.

f) S-Signal Reading

The selection transistor 404 is turned on, and a signal corresponding to the potential of the node N2 at this time is output to the vertical signal line 130. The output signal is held by, for example, the column signal processor. Differential processing performed on the signal obtained in this step and the signal obtained through d) N-signal reading results in offset of kTC2, which is a noise component, and thus a signal corresponding to the optical signal component Vp is eventually obtained.

The selection transistor 404 may be kept in an ON-state after N-signal reading.

With the above-described operations, pixel signals can be read.

Next, a description will be given of an operation of discharging charges without reading a pixel signal based on charge generated by the photoelectric conversion unit. Here, a description will be given by focusing on an operation of only the photoelectric conversion unit PC2 in a case where the switch 405 is in an OFF-state.

Figure 5:
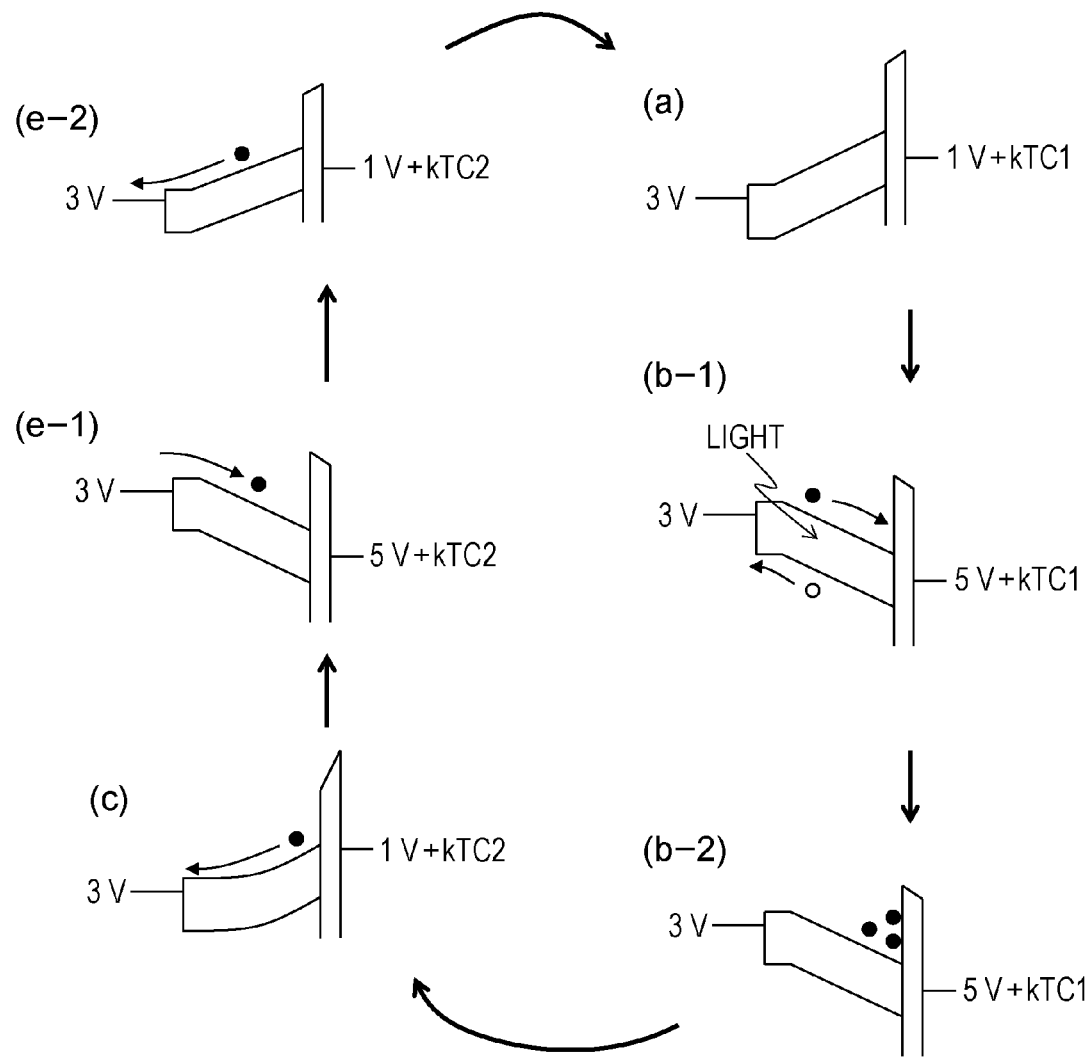
FIG. 5 is a diagram illustrating the potential of the photoelectric conversion unit and describing a charge discharging operation according to the first embodiment.

FIG. 5 is a diagram illustrating the potential of the photoelectric conversion unit and describes a charge discharge operation. In FIG. 5, the potential with respect to electrons decreases toward the lower side. FIG. 5 illustrates the state of the potential in each region in the order of, from the left, the counter electrode 307, the photoelectric conversion layer 305, the interlayer insulating layer 304, and the pixel electrode 303b. Here, illustration of the blocking layer 306 is omitted to simplify the description. In FIG. 5, a black circle represents an electron, and a white circle represents a hole.

A difference from the pixel signal reading operation described above with reference to FIG. 4 is that the bias voltage Vb applied to the drive capacitor 402b during the photocharge storage period in parts (b-1) and (b-2) of FIG. 4 is 5 V (parts (b-1) and (b-2) of FIG. 5). In a state where the bias voltage Vb=5 V is applied to the drive capacitor 402b, the pixel electrode is given a positive potential relative to the counter electrode. Thus, when light enters the photoelectric conversion layer 305, the holes generated thereby are led toward the counter electrode by an electric filed between the pixel electrode and the counter electrode and discharged.

On the other hand, the electrons generated in the photoelectric conversion layer 305 are led toward the interlayer insulating layer 304 by an electric field between the pixel electrode and the counter electrode, and stored in the interface between the photoelectric conversion layer 305 and the interlayer insulating layer 304. However, the stored electrons are discharged from the counter electrode by resetting the potential of the pixel electrode 303b to 1 V by the reset transistor 401b in the step illustrated in part (c) of FIG. 5. As a result, among the charges generated in the photoelectric conversion layer 305 in accordance with incident light, both holes and electrons are discharged from the counter electrode, and thus the optical signal component Vp becomes 0.

Figure 6:
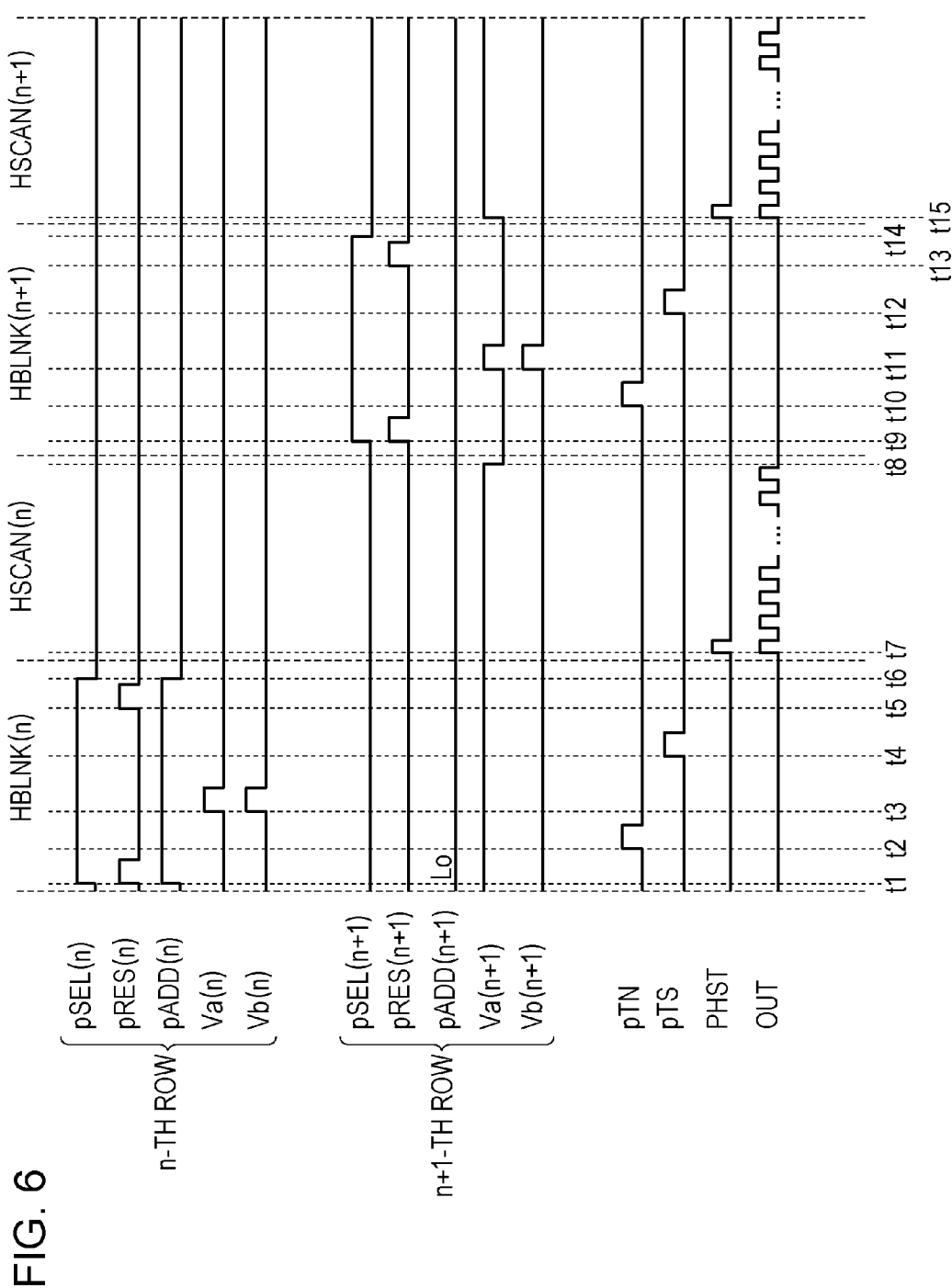
FIG. 6 is a timing chart for describing an operation of the solid-state image pickup element according to the first embodiment.

An example of the operation of the solid-state image pickup element 1000 according to this embodiment will be described. FIG. 6 is a timing chart of the operation related to the pixels in the n-th row and the n+1-th row in the pixel array in a case where a so-called rolling shutter operation is performed. Here, a description will be given of an operation of reading pixel signals based on the two photoelectric conversion units PC1 and PC2 from the pixels in the n-th row and reading pixel signals based on only the photoelectric conversion unit PC2 from the pixels in the n+1-th row. Thus, in the pixels in the n+1-th row, the switch 405 is kept in an OFF-state.

A period for reading signals in each row roughly includes a horizontal blanking period HBLNK and a horizontal scanning period HSCAN. The numeral in parentheses after HBLNK, HSCAN, a signal, and a bias voltage represents a row in the pixel array. For example, HBLNK(n) represents a horizontal blanking period for pixels in the n-th row in the pixel array. It is assumed that the signals pRES1 and pRES2 are the same as the signal pRES.

Before start of HBLNK(n), which is a horizontal blanking period for the pixels in the n-th row, charges generated through photoelectric conversion are stored in the photoelectric conversion units PC1 and PC2 of the pixels in the n-th row, which is the state illustrated in part (b-1) of FIG. 4.

At time t1, the levels of the signals pSEL(n), pRES(n), and pADD(n) become high (H). The levels of the other signals, except Va(n+1), are low (L). Accordingly, the pixels in the n-th row are selected, and signals from the pixels in the n-th row appear in the vertical signal lines 130. Further, with the levels of the signals pADD(n) and pRES(n) being H-level, the nodes N1 and N2 are short-circuited, and the node is reset to 1 V. This is the state illustrated in part (b-2) of FIG. 4.

When the level of the signal pTN is temporarily brought into H-level from time t2, a signal corresponding to the potential of the node N2 at this time is sampled and held by the signal processor 140. That is, N-signal reading is performed.

When the levels of the bias voltages Va(n) and Vb(n) are temporarily brought into H-level from time t3, the potential of the node N2 is changed in accordance with the amount of charges stored in the photoelectric conversion units PC1 and PC2. This is the charge transfer operation illustrated in parts (e-1) and (e-2) of FIG. 4.

When the level of the signal pTS is temporarily brought into H-level from time t4, a signal corresponding to the potential of the node N2 at this time is sampled and held by the signal processor 140. That is, S-signal reading is performed. The S-signal read at this time is based on the two photoelectric conversion units PC1 and PC2 disposed under the same microlens, and thus can be used as an image pickup signal.

When the level of the signal pRES(n) becomes H-level at time t5, the node N2 is reset to 1 V again. This state corresponds to the state in which pre-storage reset has been performed illustrated in part (a) of FIG. 4.

When the levels of the signals pSEL(n) and pADD(n) become L-level at time t6, the selection state of the pixels in the n-th row is cancelled, and the nodes N1 and N2 are electrically disconnected.

After that, the horizontal scanning period HSCAN(n) is started, and the level of the signal PHST becomes H-level at time t7. In response to this, the column selecting circuit 150 starts scanning of the column signal processors. The column selecting circuit 150 operates in synchronization with a clock signal (not illustrated) and thus signals from the column signal processors are sequentially output from the output amplifier 170.

After the scanning by the column selecting circuit 150 has finished, the level of the bias voltage Va(n+1) becomes L-level at time t8. Accordingly, charges generated by the photoelectric conversion unit PC1 are stored.

At time t9, the levels of the signals pSEL(n+1) and pRES(n+1) become H-level. Accordingly, the pixels in the n+1-th row are selected, and signals from the pixels in the n+1-th row appear in the vertical signal lines 130. Further, with the level of the signal pRES(n+1) being H-level, the node N2 is reset to 1 V.

When the level of the signal pTN is temporarily brought into H-level from time t10, a signal corresponding to the potential of the node N2 at this time is sampled and held by the signal processor 140. That is, N-signal reading is performed.

With the levels of the bias voltages Va(n+1) and Vb(n+1) temporarily being H-level from time t11, the potential of the node N1 is changed in accordance with the amount of charges stored in the photoelectric conversion unit PC1, and the potential of the node N2 is changed in accordance with the amount of charges stored in the photoelectric conversion unit PC2. This is the charge transfer operation illustrated in parts (e-1) and (e-2) of FIG. 4.

When the level of the signal pTS is temporarily brought into H-level from time t12, a signal corresponding to the potential of the node N2 at this time is sampled and held by the signal processor 140. That is, S-signal reading is performed. The S-signal read at this time is based on only the photoelectric conversion unit PC2 among the two photoelectric conversion units PC1 and PC2 disposed under the same microlens, and thus can be used as a phase difference detection signal.

When the level of the signal pRES(n+1) becomes H-level at time t13, the nodes N1 and N2 are reset to 1 V again. This state corresponds to the state in which the pre-storage reset illustrated in part (a) of FIG. 4 has been performed.

When the level of the signal pSEL(n) becomes L-level at time t14, the selection state of the pixels in the n+1-th row is cancelled.

After that, when the horizontal scanning period HSCAN (n+1) is started, the level of the bias voltage Va(n+1) becomes H-level at time t15, and a state in which the photoelectric conversion unit PC1 does not store holes occurs again.

At time t15, the level of the signal PHST becomes H-level. In response to this, the column selecting circuit 150 starts scanning of the column signal processors. The column selecting circuit 150 operates in synchronization with a clock signal (not illustrated) and thus signals from the column signal processors are sequentially output from the output amplifier 170.

As described above, as for the pixels in the n-th row, pixel signals based on the two photoelectric conversion units provided for the same microlens are read and used as image pickup signals. On the other hand, as for the pixels in the n+1-th row, pixel signals based on only one of the two photoelectric conversion units provided for the same microlens are read. A phase difference can be detected by performing differential processing on two pixel signals by reading a pixel signal based on only the photoelectric conversion unit PC1 from a pixel and reading a pixel signal based on only the photoelectric conversion unit PC2 from another pixel. In a pixel, the photoelectric conversion unit on the left in FIG. 2 may be used as the photoelectric conversion unit PC2, and in another pixel, the photoelectric conversion unit on the right in FIG. 2 may be used as the photoelectric conversion unit PC2.

The operation of the solid-state image pickup element 1000 is not limited to the above-described operation. The pixel from which an image pickup signal is to be read and the pixel from which a phase difference detection signal is to be read may be switched in the case of, for example, capturing a still image and capturing a moving image, or may be switched in accordance with the number of pixels from which pixel signals are to be read.

As described above, according to this embodiment, an image pickup signal and a phase difference detection signal can be obtained. Each of the pixels according to this embodiment includes two partial electrodes (pixel electrodes 303) that are controlled independently of each other, and thus the pixel can be used as both of an image pickup pixel and a phase difference detection pixel. Accordingly, unlike in Japanese Patent Laid-Open No. 2014-67948, the position of a phase difference detection pixel can be dynamically changed. Further, in the structure described in Japanese Patent Laid-Open No. 2014-67948, a light shielding film is provided to cover part of the phase difference detection pixel, and thus the phase difference detection pixel and the image pickup pixel may have different optical characteristics. In contrast, the pixels according to this embodiment are advantageous in that a pixel used as a phase difference detection pixel and a pixel used as an image pickup pixel have optical characteristics equivalent to each other.

Second Embodiment

Figure 7:
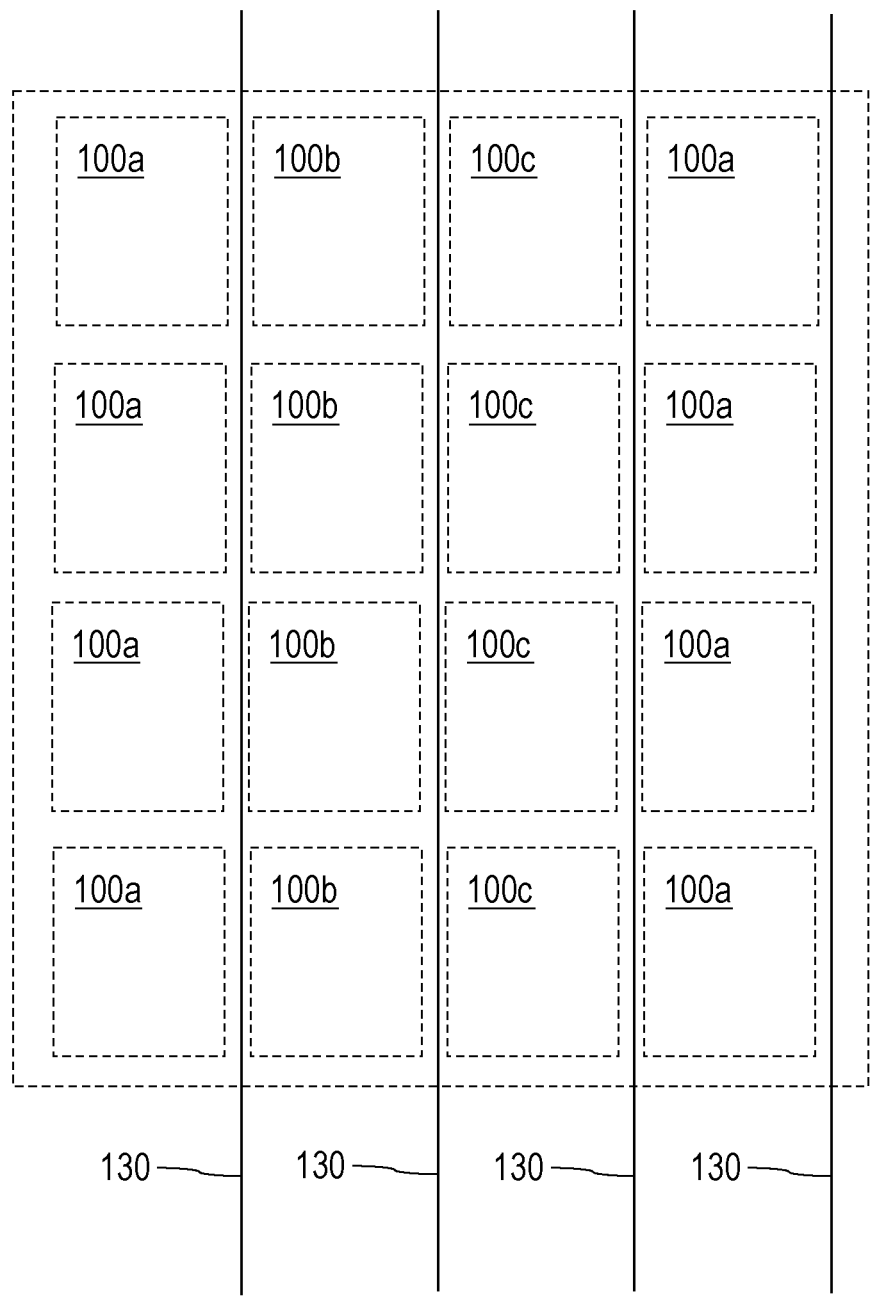
FIG. 7 is a diagram illustrating the configuration of a pixel array according to a second embodiment.

FIG. 7 is a diagram illustrating the pixel array 110 according to a second embodiment. Here, a description will be given of a case where pixels in four rows×four columns are arranged.

Here, a description will be given of an example in which the pixels in the first column from the left and the pixels in the first column from the right are used as image pickup pixels in a fixed manner, and the pixels in the two columns in the middle are used as phase difference detection pixels or image pickup pixels in a switching manner.

The pixels 100a in the first column from the left and the first column from the right are operated as image pickup pixels by fixing the level of the signal pADD to H-level or fixing the control node of the switch 405 to the power in the configuration illustrated in FIG. 3.

The pixels 100b in the second column from the left are configured such that the photoelectric conversion unit on the left in the figure is the photoelectric conversion unit PC2. The pixels 100c in the second column from the right are configured such that the photoelectric conversion unit on the right in the figure is the photoelectric conversion unit PC2. With this configuration, a phase difference detection operation can be implemented in the second column from the left and the second column from the right.

The pixels in the second column from the left and the second column from the right may be operated as image pickup pixels in accordance with an operation mode. For example, these pixels may be operated as phase difference detection pixels during moving image capturing, and may be operated as image pickup pixels during still image capturing. Alternatively, operation of the pixels 100b and 100c as phase difference detection pixels or image pickup pixels may be switched by a user operation.

Third Embodiment

Figure 8:
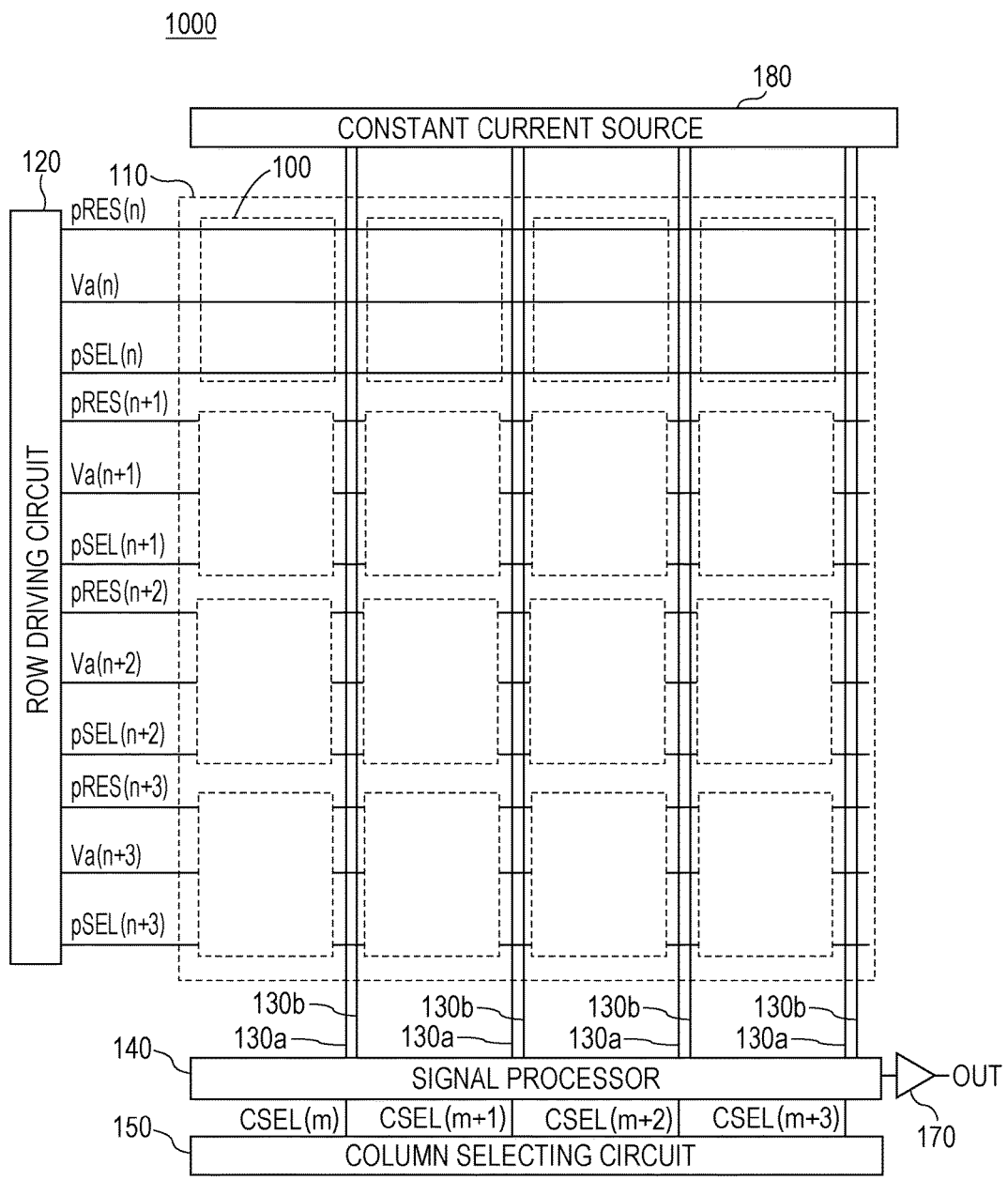
FIG. 8 is a block diagram illustrating an example configuration of a solid-state image pickup element according to a third embodiment.

FIG. 8 illustrates an example configuration of a solid-state image pickup element according to a third embodiment. The same components as those of the solid-state image pickup element illustrated in FIG. 1 are denoted by the same reference numerals. Hereinafter, a description will be given mainly of a difference from the configuration illustrated in FIG. 1.

The solid-state image pickup element according to this embodiment is different from the solid-state image pickup element illustrated in FIG. 1 in that each pixel 100 includes signal reading circuits 400a and 400b that are provided for individual photoelectric conversion units and are independent of each other, and that two vertical signal lines 130a and 130b are provided for each column of the pixel array.

Figure 9:
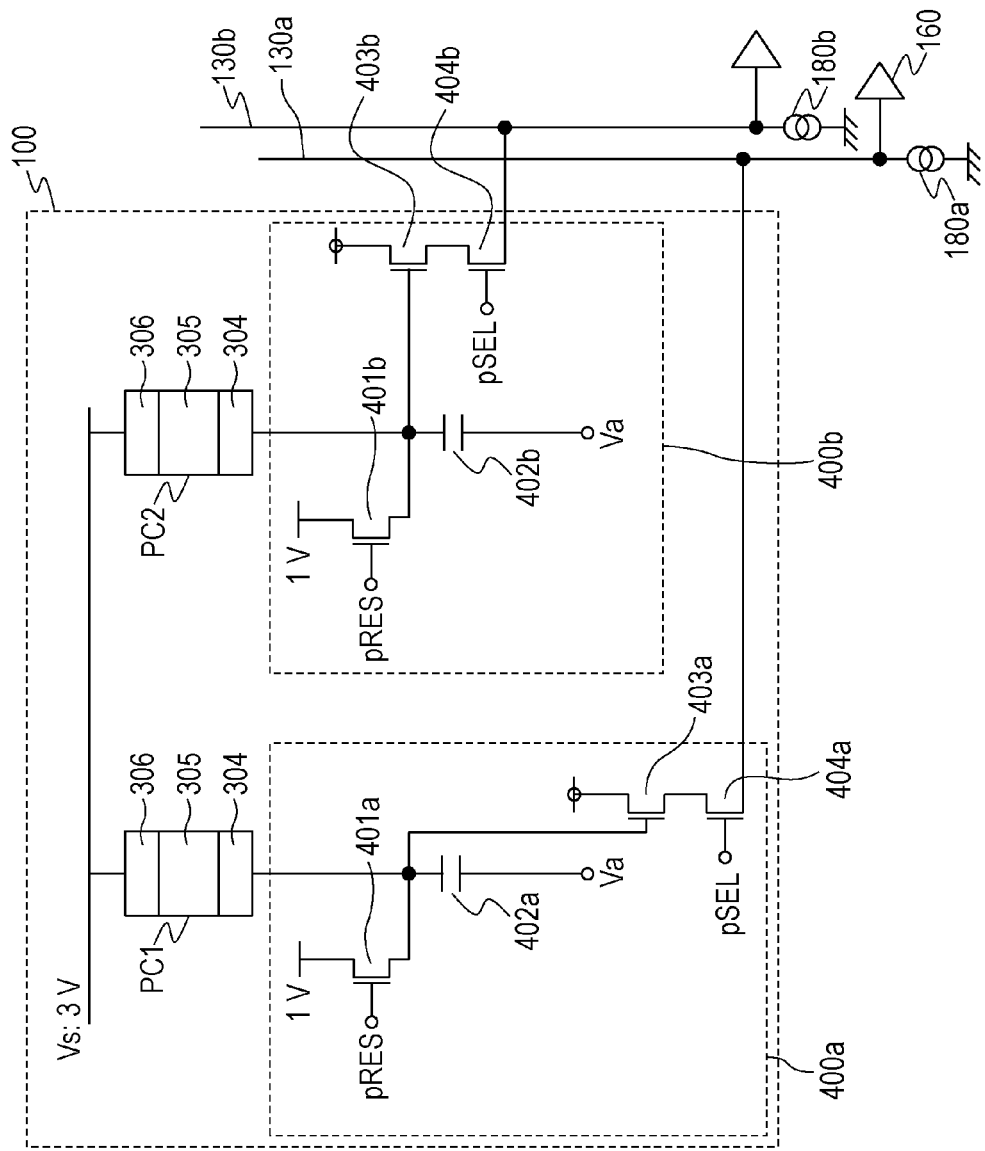
FIG. 9 is an equivalent circuit diagram illustrating an example configuration of a pixel according to the third embodiment.

FIG. 9 is an equivalent circuit diagram illustrating an example configuration of the pixel 100 according to this embodiment. This configuration is equivalent to a configuration obtained by removing the switch from the pixel 100 illustrated in FIG. 3 and adding an amplification transistor and a selection transistor. The signal reading circuit 400a is provided for the photoelectric conversion unit PC1, and an output of the signal reading circuit 400a is supplied to the vertical signal line 130a. The signal reading circuit 400a includes an amplification transistor 403a, a selection transistor 404a, the reset transistor 401a, and the drive capacitor 402a. Upon turn-on of the selection transistor 404a, the amplification transistor 403a operates as a source follower circuit together with a constant current source 180a provided along the vertical signal line 130a. Likewise, the signal reading circuit 400*b* is provided for the photoelectric conversion unit PC2, and an output of the signal reading circuit 400*b* is supplied to the vertical signal line 130*b*. The signal reading circuit 400*b* includes an amplification transistor 403*b*, a selection transistor 404*b*, the reset transistor 401*b*, and the drive capacitor 402*b*. Upon turn-on of the selection transistor 404*b*, the amplification transistor 403*b* operates as a source follower circuit together with a constant current source 180*b* provided along the vertical signal line 130*b*.

In this embodiment, two vertical signal lines 130*a* and 130*b* are provided for each column of the pixel array 110, and thus signals based on the two photoelectric conversion units PC1 and PC2 provided in the same pixel 100 can be read in parallel. Therefore, the signal reading circuits 400*a* and 400*b* are controlled by a common signal.

Figure 10:
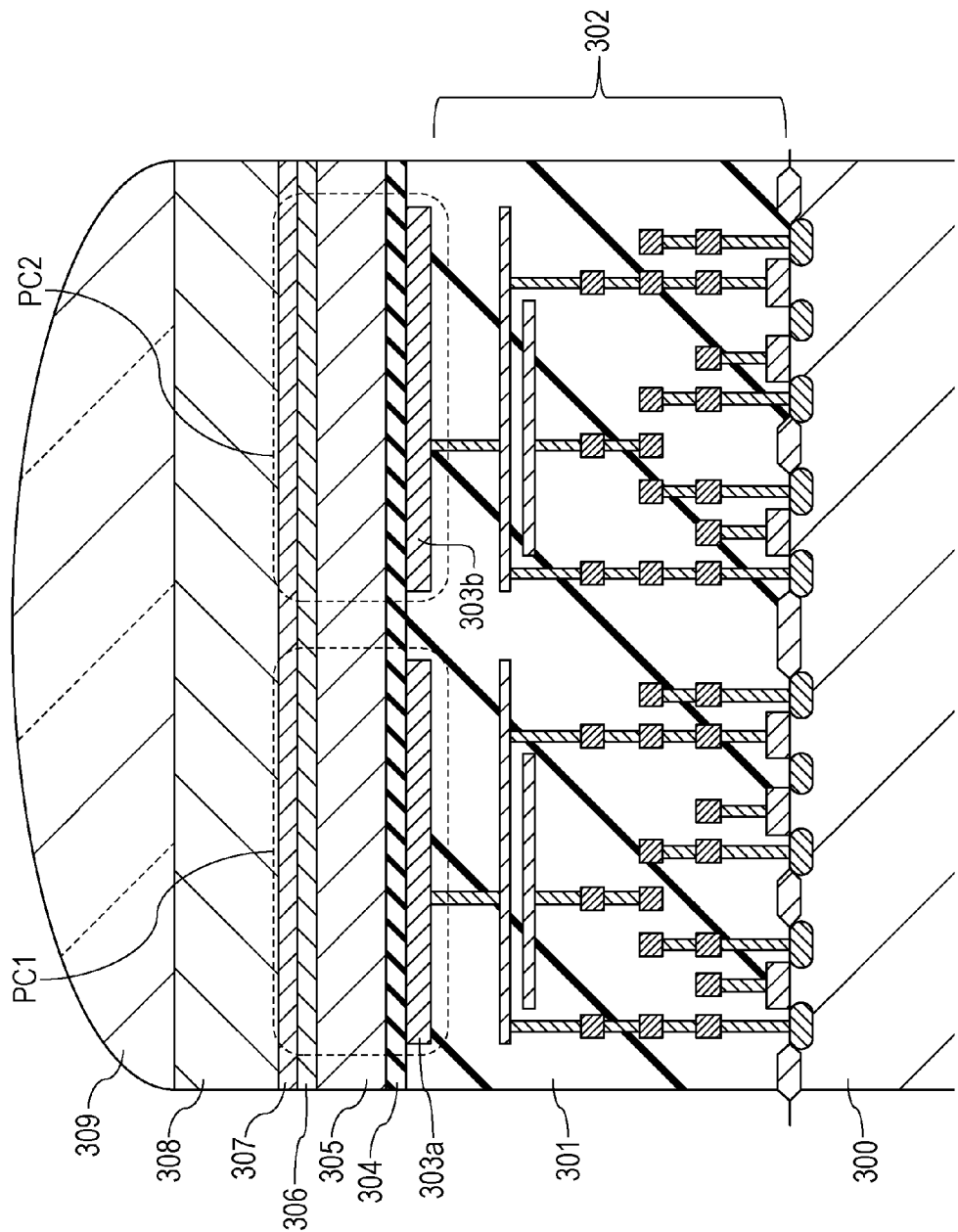
FIG. 10 is a diagram illustrating an example of a cross-sectional structure of the pixel according to the third embodiment.

FIG. 10 is a cross-sectional view of the pixel 100 according to this embodiment. As is clear from the view, signal reading circuits are provided for the two individual photoelectric conversion units that are provided under the same microlens.

Figure 11:
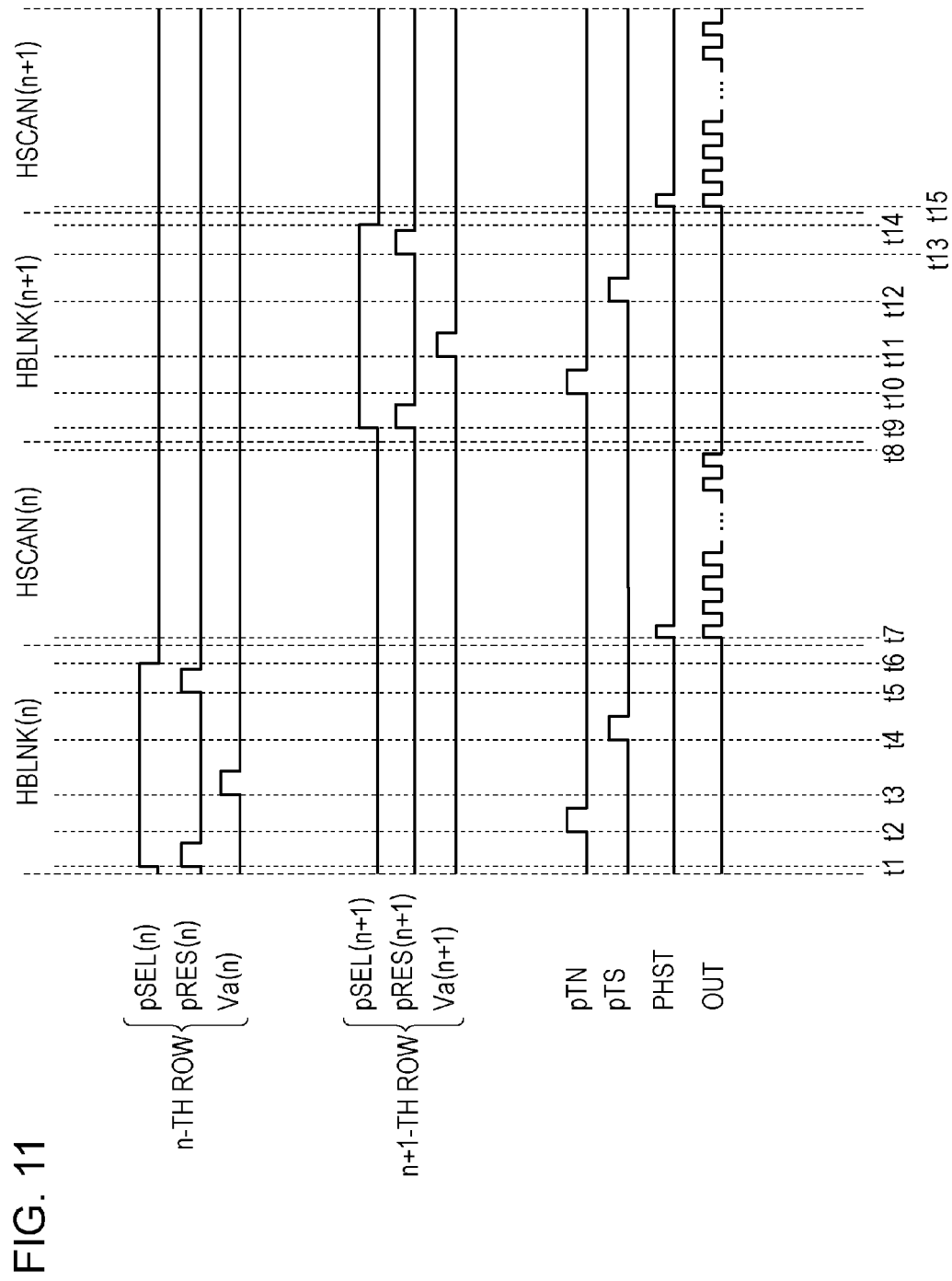
FIG. 11 is a timing chart for describing an operation of the solid-state image pickup element according to the third embodiment.

FIG. 11 is a timing chart for describing an operation according to this embodiment. Also in this embodiment, a description will be given of a rolling shutter operation. A difference from the operation illustrated in FIG. 6 is that signals based on two photoelectric conversion units are read in both the n-th row and the n+1-th row.

In this embodiment, the signals based on the two photoelectric conversion units are sampled and held by the column signal processor at time t4. A difference between these signals and the signals that are sampled and held by the column signal processor at time t2 is obtained to perform correlated double sampling (CDS) processing. As a result of adding the signals that have been subjected to differential processing, a signal based on the two photoelectric conversion units can be obtained. This signal can be used as an image pickup signal. On the other hand, the individual signals that have been subjected to differential processing can be used as phase difference detection signals. Accordingly, phase difference detection can be performed while obtaining an image pickup signal.

The same applies to the signals that are sampled and held at time t12.

In this embodiment, as in the first embodiment, each pixel includes two pixel electrodes 303 that are controlled independently of each other, and thus the pixel can be used as both of an image pickup pixel and a phase difference detection pixel. Accordingly, the position of a phase difference detection pixel can be dynamically changed. Further, according to this embodiment, each pixel includes signal reading circuits, and thus a phase difference detection signal and an image pickup signal can be obtained in parallel.

Fourth Embodiment

Figure 12:
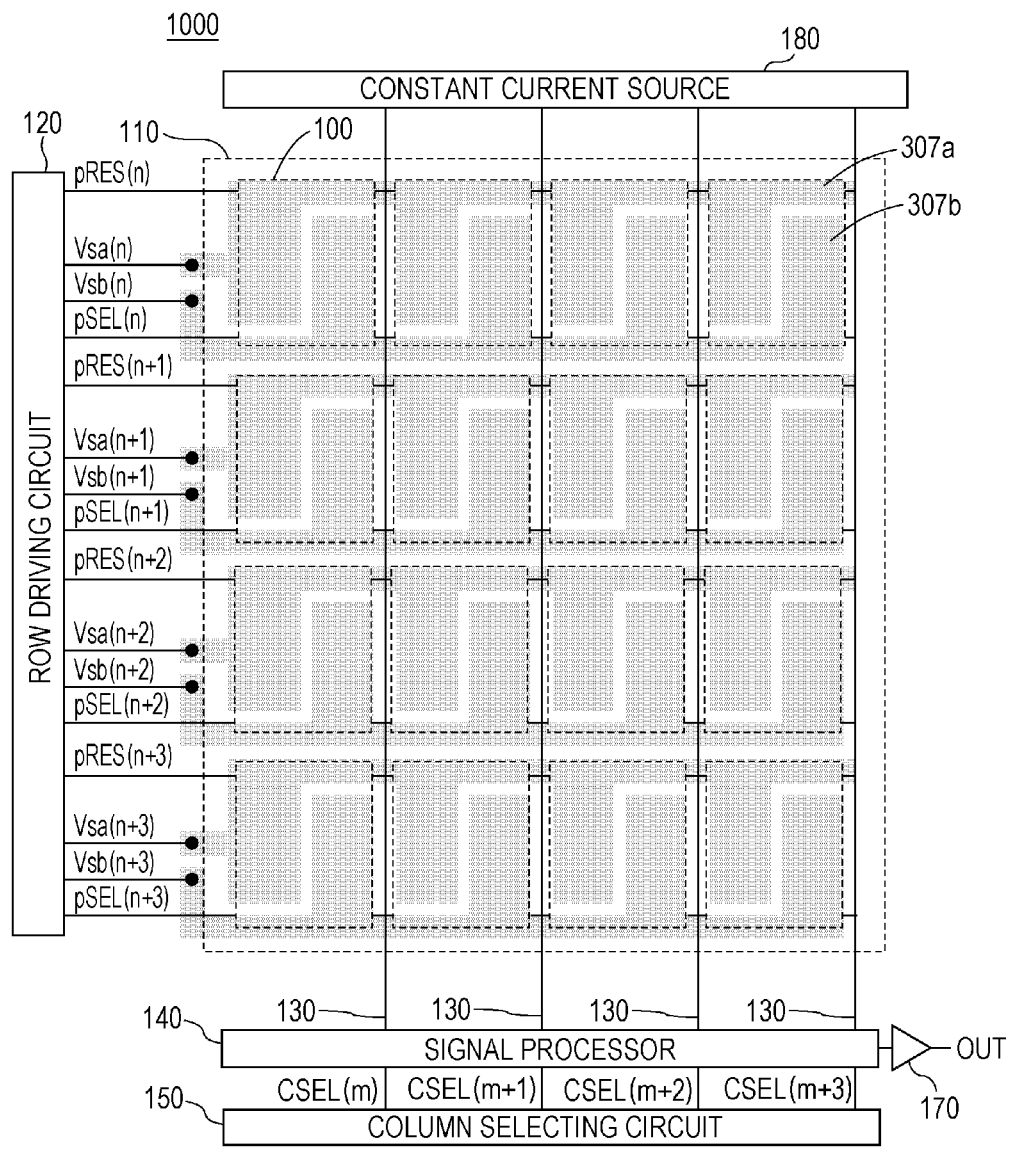
FIG. 12 is a block diagram illustrating an example configuration of a solid-state image pickup element according to a fourth embodiment.

FIG. 12 is a block diagram illustrating an example configuration of a solid-state image pickup element according to a fourth embodiment.

The solid-state image pickup element according to the fourth embodiment is different from the solid-state image pickup element illustrated in FIG. 1 in that each pixel 100 includes two counter electrodes 307*a* and 307*b* and one pixel electrode 303 and that no switch 405 is provided, and further in that a bias voltage applied to the drive capacitor is a fixed bias voltage. In the first embodiment, each pixel includes two pixel electrodes serving as partial electrodes that are controllable independently of each other. In contrast, in this embodiment, two counter electrodes are used as partial electrodes that are controllable independently of each other.

The two counter electrodes 307*a* and 307*b* are configured so as to be controllable independently of each other. The row driving circuit 120 supplies bias voltages Vsa and Vsb to the two counter electrodes 307*a* and 307*b*. On the other hand, the pixel electrode 303 is shared by the two photoelectric conversion units.

Figure 13:
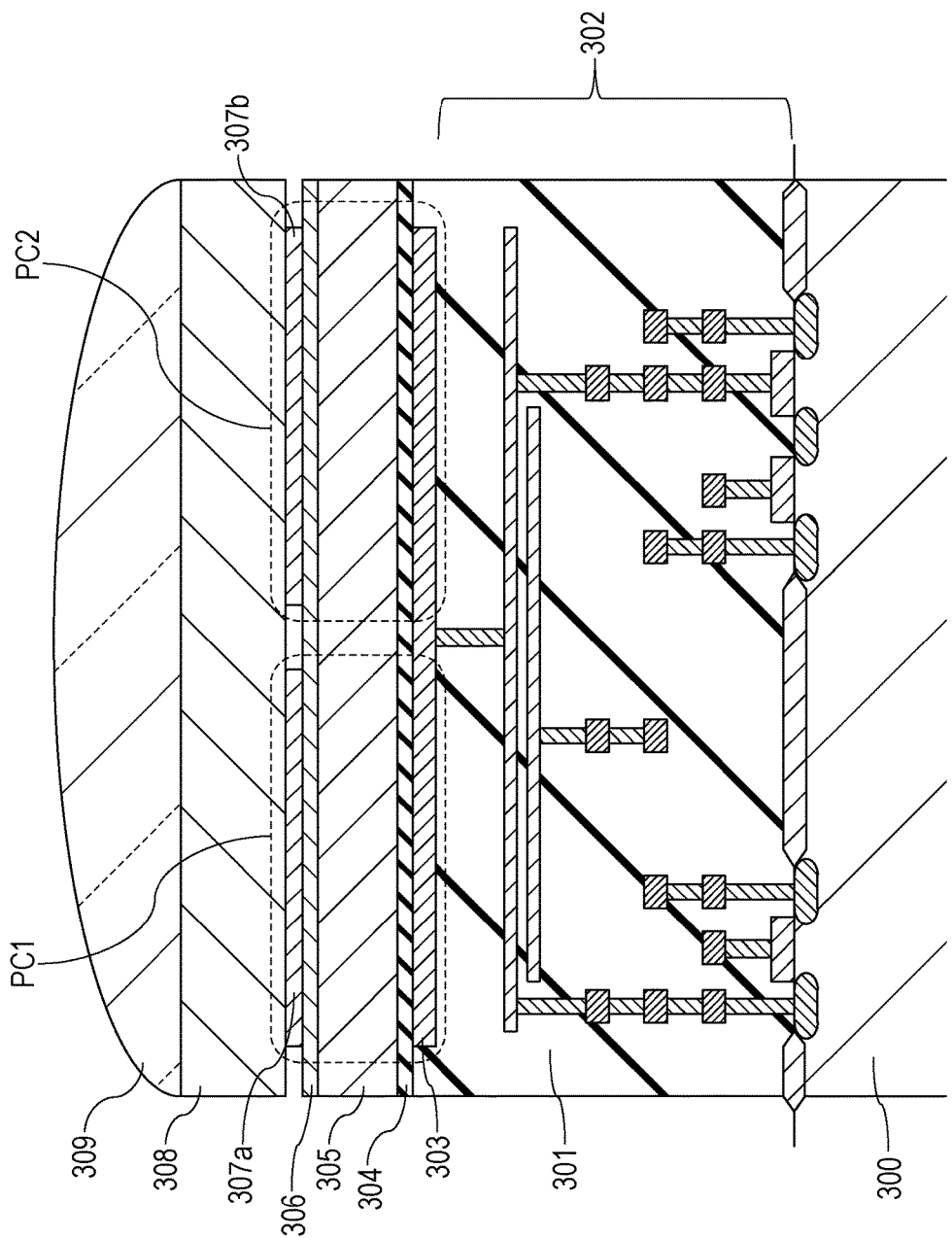
FIG. 13 is a diagram illustrating an example of a cross-sectional structure of a pixel according to the fourth embodiment.

FIG. 13 is a cross-sectional view of the pixel 100 according to this embodiment. In FIG. 2, one pixel includes one counter electrode 307. In contrast, in this embodiment, one pixel includes two counter electrodes 307*a* and 307*b*. Further, two pixel electrodes 303*a* and 303*b* are provided in FIG. 2, whereas one pixel electrode 303 is provided in this embodiment. Accordingly, the switch 405 is not provided, and one reset transistor is provided although two reset transistors 401*a* and 401*b* are provided in FIG. 2. In this embodiment, each pixel includes photoelectric conversion units PC1 and PC2 constituted by the pixel electrode 303 and the counter electrodes 307*a* and 307*b*.

The two counter electrodes 307*a* and 307*b* provided for the same microlens are separated from each other with a distance d therebetween and constitute two photoelectric conversion units. Although not illustrated in the figure, counter electrodes of adjacent pixels may be separated from each other with a distance D therebetween, which is larger than the distance d. The counter electrode 307*a* of a certain pixel is disposed at the distance d from the counter electrode 307*b* of the certain pixel, and at the distance D from the counter electrode 307*b* of an adjacent pixel. With such a disposition of counter electrodes, the occurrence of a phenomenon can be suppressed in which charges generated in accordance with light that has entered a certain pixel are stored in the photoelectric conversion unit of an adjacent pixel. In a case where each pixel includes color filters, mixture of colors can be reduced. The color filters are provided, for example, between the counter electrode and the microlens. Further, a light shielding film may be provided between the color filters and the counter electrodes 307 and between two adjacent pixels, so as to further suppress the occurrence of color mixture. A protective film may be provided between the color filters and the microlens, so as to reduce a step generated by forming the color filters.

Figure 14:
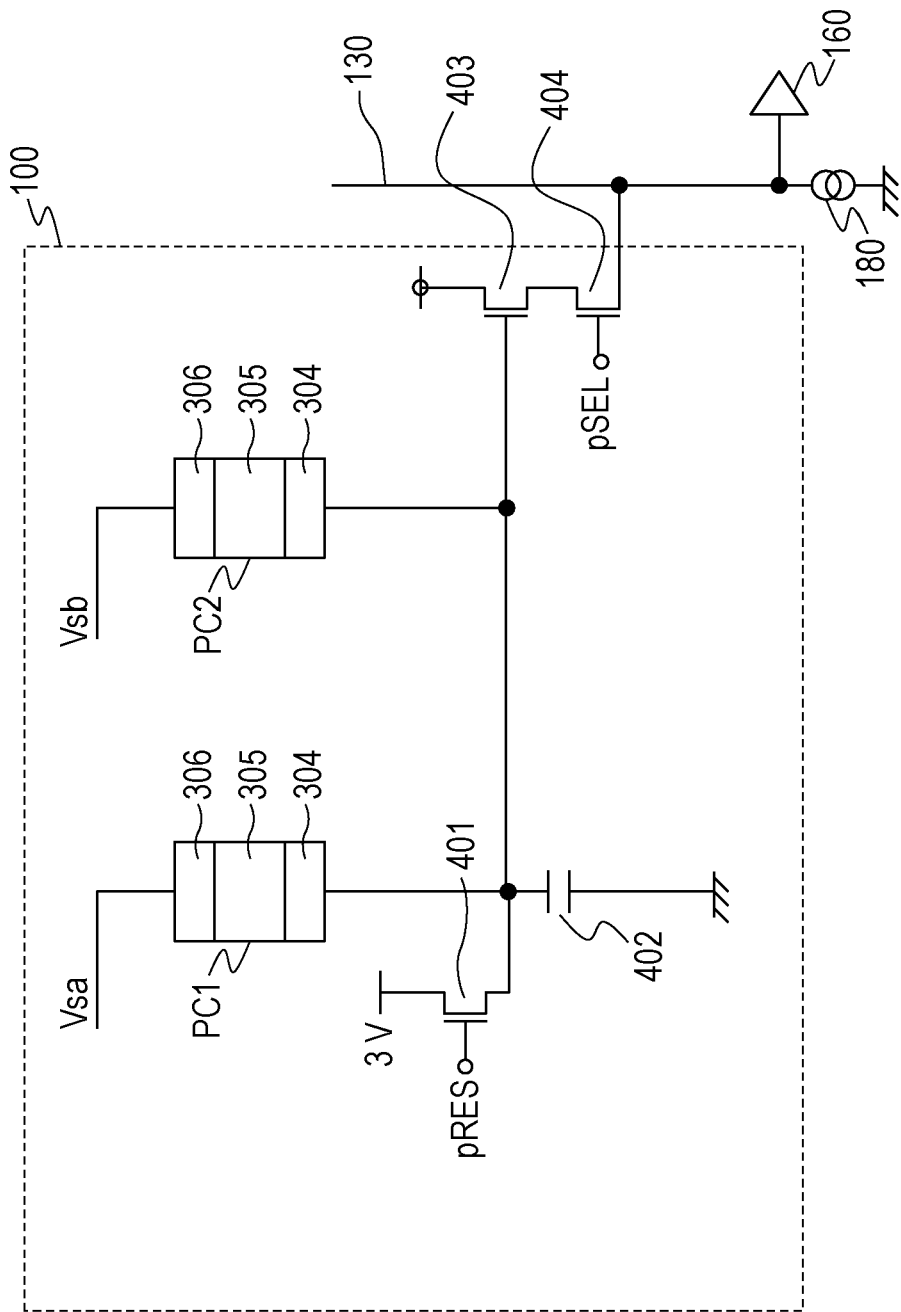
FIG. 14 is an equivalent circuit diagram illustrating an example configuration of the pixel according to the fourth embodiment.

FIG. 14 is an equivalent circuit diagram of the pixel 100 according to this embodiment. In this embodiment, one node of the drive capacitor 402 is connected to the node N1, and the other node is fixed to the ground potential. The bias voltages Vsa and Vsb are supplied to the counter electrodes 307*a* and 307*b*, respectively.

Figure 15:
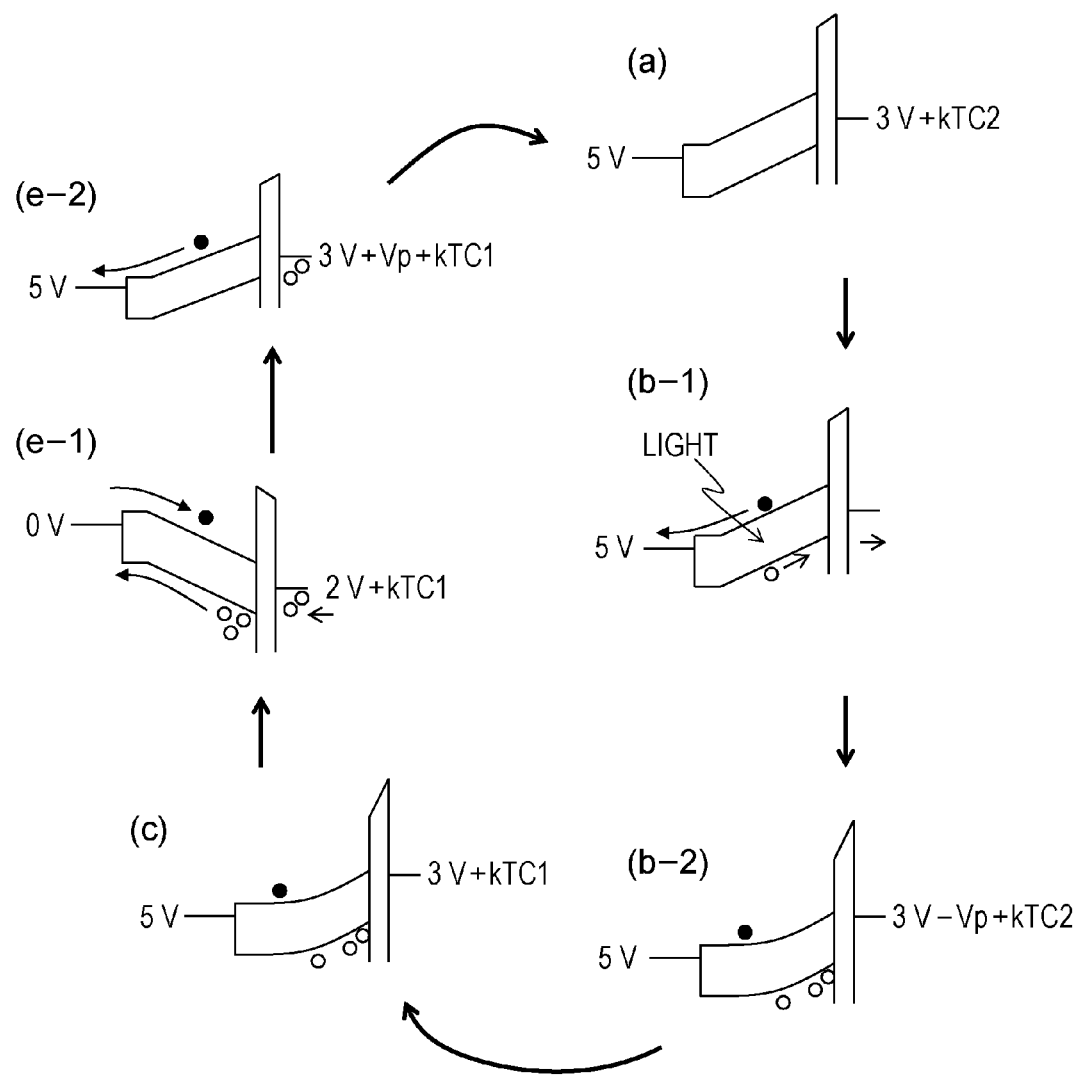
FIG. 15 is a diagram illustrating the potential of a photoelectric conversion unit and describing a signal reading operation according to the fourth embodiment.

FIG. 15 is a diagram illustrating the potential of a photoelectric conversion unit and describes a signal reading operation according to this embodiment. Here, the operation will be described by focusing on the photoelectric conversion unit PC1 for simplicity.

The reading operation for the pixel 100 is implemented by performing the following operations a) to f).

a) Pre-storage reset b) Photocharge storage c) Post-storage reset d) N-signal reading e) Charge transfer f) S-signal reading Hereinafter, the individual operations will be described in detail below.

a) Pre-Storage Reset

The reset transistor 401 is turned on in a state where a bias voltage Vsa of 5 V is applied to the counter electrode 307, and thereby the node N1 is reset to 3 V. After that, the reset transistor 401 is turned off, and thereby kTC noise (kTC1) resulting from the operation of the reset transistor 401 is generated. Accordingly, the potential of the node N1, that is, the pixel electrode 303, becomes 3 V+kTC1 (part (a) of FIG. 15).

b) Photocharge Storage

After the pre-storage reset is completed in a state where light has entered the photoelectric conversion layer 305, a photocharge storage operation is started. The bias voltage Vsa is kept at 5 V while the photocharge storage operation is in progress. Thus, the potential of the pixel electrode 303b becomes negative relative to the counter electrode 307 to which a voltage of 3 V is applied. Accordingly, the electrons in the photoelectric conversion layer 305 are led toward the counter electrode 307, and discharged from the counter electrode 307 via the blocking layer 306. On the other hand, holes are led toward the pixel electrode 303. Since the blocking layer 306 exists, injection from the counter electrode 307 into the photoelectric conversion layer 305 is not performed (part (b-1) of FIG. 15).

Absorption of incident light into the photoelectric conversion layer 305 generates electron-hole pairs in accordance with the amount of incident light. The electrons that have been generated are discharged from the counter electrode 307, whereas the holes that have been generated move in the photoelectric conversion layer 305 and reach the interface between the photoelectric conversion layer 305 and the interlayer insulating layer 304. However, the holes are not able to move into the interlayer insulating layer 304, and are thus stored in the photoelectric conversion layer 305 (part (b-2) of FIG. 15). The holes stored in this manner are used as signal charges based on incident light. The holes stored in the photoelectric conversion layer 305 raises the potential of the node N2 by Vp, and the potential of the node N1 becomes 3 V+kTC1+Vp1.

c) Post-Storage Reset

The reset transistor 401 is temporarily brought into an ON-state, and thereby the node N1 is reset to 3 V. Since noise (kTC2) is generated in accordance with the operation of the reset transistor 401, the potential of the node N2 becomes 3 V+kTC2. The noise kTC1 generated in the pre-storage reset and the noise kTC2 generated in the post-storage reset are so-called random noise components that are not related to each other.

Even if the nose N1 is reset by the reset transistor 401, the holes stored in the photoelectric conversion layer 305 remain in the photoelectric conversion layer 305 (part (c) of FIG. 15).

d) N-Signal Reading

The selection transistor 404 is turned on, and a signal corresponding to the potential of the node N1 at this time is output to the vertical signal line 130. The output signal is held by, for example, the column signal processor.

e) Charge Transfer

The bias voltage Vsa that is applied to the counter electrode 307a is changed from 5 V to 0 V. Accordingly, the potential of the node N1 is changed. The amount of change in the potential is determined by the ratio of the capacitance of the photoelectric conversion unit to the capacitance of the drive capacitor 402. If it is assumed that the capacitance of the photoelectric conversion unit is represented by C1, the capacitance of the drive capacitor 402 is represented by C2, and a positive amount of change in the bias voltage Vsa is represented by $\Delta Vsa$, an amount of change $\Delta VN1$ in the potential of the node N1 is expressed by the following equation.

$$\Delta VN1 = \Delta Vsa \times C1/(C1+C2) \quad (1)$$

In this embodiment, in a case where the capacitance C1 of the drive capacitor 402 is four times the capacitance C2 of the photoelectric conversion unit, the amount of change in the potential of the node N1 when the bias voltage Vsa is changed by 5 V is 4 V.

When the potential of the node N1 increases by 4 V and becomes 5 V+kTC2, the potential of the node N1 and the potential of the counter electrode 307a are reversed. As a result, the gradient of the potential in the photoelectric conversion layer 305 is reversed (part (e-1) of FIG. 15). Accordingly, electrons are injected from the counter electrode 307 into the photoelectric conversion layer 305 via the blocking layer 306. The holes stored in the photoelectric conversion layer 305 are led toward the counter electrode 307a, and are recoupled to the electrons in the blocking layer 306 to disappear. As a result, all the holes stored in the photoelectric conversion layer 305 are discharged from the photoelectric conversion layer 305. That is, the photoelectric conversion layer 305 is completely depleted and thereby complete transfer is performed (part (e-2) of FIG. 15).

Subsequently, when the bias voltage Vsa is set to 5 V again, the potential of the node N1 becomes negative relative to the potential of the counter electrode 307a. Thus, the electrons that are injected into the photoelectric conversion layer 305 when the bias voltage Vsa is 0 V are discharged from the photoelectric conversion layer 305 via the blocking layer 306. In this way, the amount of electrons that are discharged and the amount of electrons that are injected into the photoelectric conversion layer 305 are ideally equal to each other, which does not affect signal reading. With the bias voltage Vsa being set to 5 V, the potential of the node N1 attempts to return to 3 V+kTC2. However, the blocking layer 306 disposed between the counter electrode 307a and the photoelectric conversion layer 305 inhibits injection of holes into the photoelectric conversion layer 305. Thus, a signal based on the holes stored in the photoelectric conversion layer 305 through the photocharge storage operation remains as an optical signal component Vp, and thus the potential of the node N1 becomes 3 V+kTC2+Vp.

f) S-Signal Reading

The selection transistor 404 is turned on, and a signal corresponding to the potential of the node N1 at this time is output to the vertical signal line 130. The output signal is held by, for example, the column signal processor. Differential processing performed on the signal obtained in this step and the signal obtained through d) N-signal reading results in offset of kTC2, which is a noise component, and thus a signal corresponding to the optical signal component Vp is eventually obtained.

The selection transistor 404 may be kept in an ON-state after N-signal reading.

With the above-described operations, pixel signals can be read.

Figure 16:
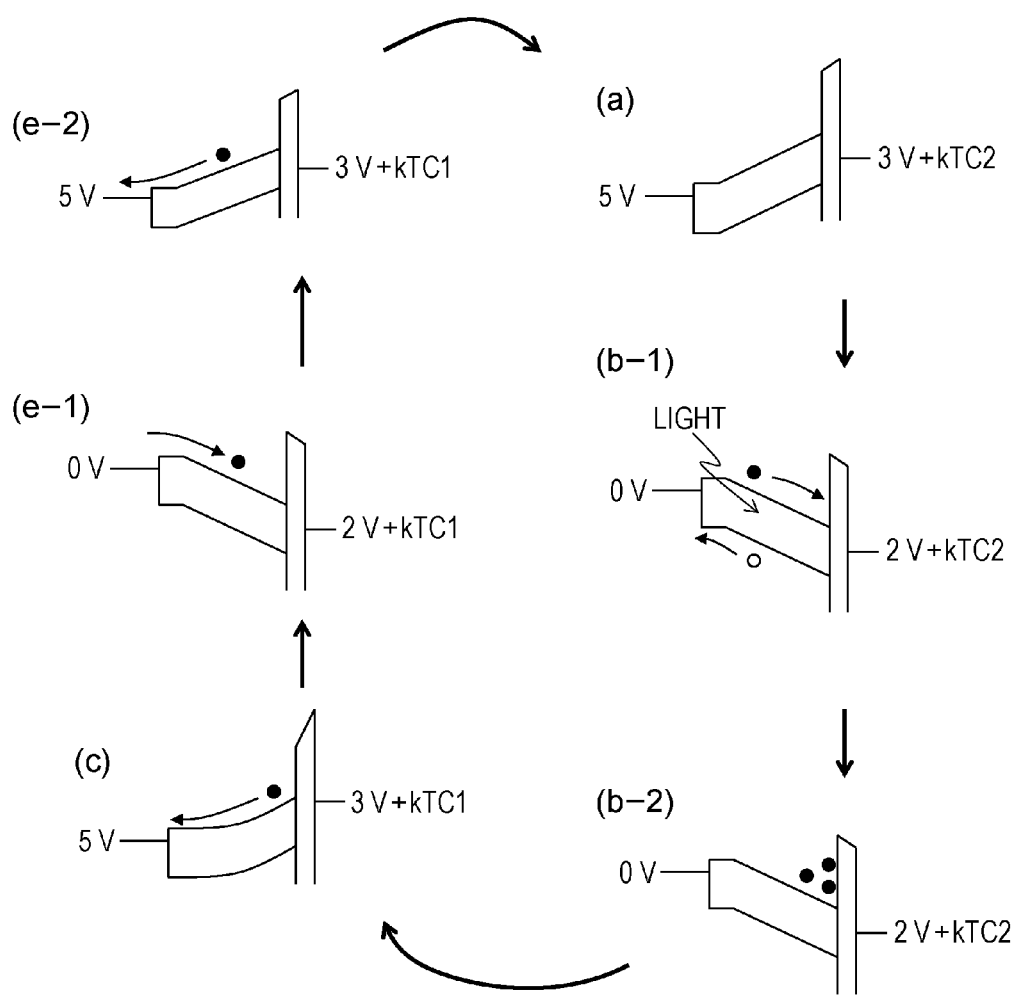
FIG. 16 is a diagram illustrating the potential of the photoelectric conversion unit and describing a charge discharging operation according to the fourth embodiment.

FIG. 16 is a diagram illustrating the potential of the photoelectric conversion unit and describes a charge discharge operation according to this embodiment. In FIG. 16, the potential with respect to electrons decreases toward the lower side. FIG. 16 illustrates the state of the potential in each region in the order of, from the left, the counter electrode 307a, the photoelectric conversion layer 305, the interlayer insulating layer 304, and the pixel electrode 303. Here, illustration of the blocking layer 306 is omitted to simplify the description. In FIG. 16, a black circle represents an electron, and a white circle represents a hole.

A difference from the pixel signal reading operation described above with reference to FIG. 15 is that the bias voltage Vsa applied to the counter electrode 307a during the photocharge storage period in parts (b-1) and (b-2) of FIG. 15 is 0 V (parts (b-1) and (b-2) of FIG. 16). In a state where the bias voltage Vsa=0 V is applied to the counter electrode 307a, the pixel electrode is given a positive potential relative to the counter electrode. Thus, when light enters the photoelectric conversion layer 305, the holes generated thereby are led toward the counter electrode by an electric filed between the pixel electrode and the counter electrode and discharged.

On the other hand, the electrons generated in the photoelectric conversion layer 305 are led toward the interlayer insulating layer 304 by an electric field between the pixel electrode and the counter electrode, and stored in the interface between the photoelectric conversion layer 305 and the interlayer insulating layer 304. However, the stored electrons are discharged from the counter electrode by resetting the potential of the pixel electrode 303 to 3 V by the reset transistor 401 in the step illustrated in part (c) of FIG. 16. As a result, among the charges generated in the photoelectric conversion layer 305 in accordance with incident light, both holes and electrons are discharged from the counter electrode, and thus the optical signal component Vp becomes 0.

Figure 17:
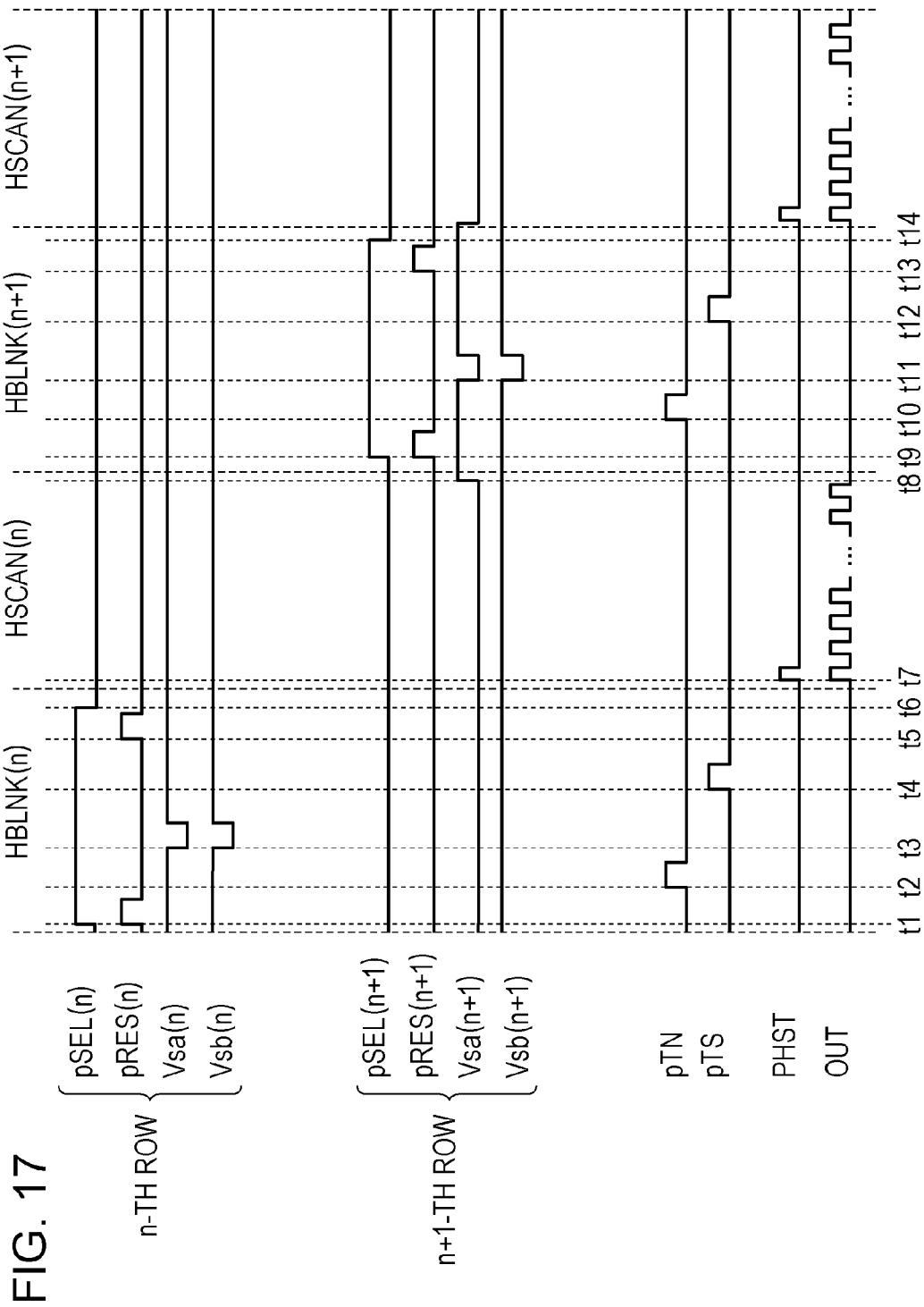
FIG. 17 is a timing chart for describing an operation of the solid-state image pickup element according to the fourth embodiment.

An example of the operation of the solid-state image pickup element 1000 according to this embodiment will be described. FIG. 17 is a timing chart of the operation related to the pixels in the n-th row and the n+1-th row in the pixel array in a case where a so-called rolling shutter operation is performed. Here, a description will be given of an operation of reading pixel signals based on the two photoelectric conversion units PC1 and PC2 from the pixels in the n-th row and reading pixel signals based on only the photoelectric conversion unit PC2 from the pixels in the n+1-th row.

Before start of HBLNK(n), which is a horizontal blanking period for the pixels in the n-th row, charges generated through photoelectric conversion are stored in the photoelectric conversion units PC1 and PC2 of the pixels in the n-th row, which is the state illustrated in part (b-1) of FIG. 15.

At time t1, the levels of the signals pSEL(n) and pRES(n) become H-level. Accordingly, the pixels in the n-th row are selected, and signals from the pixels in the n-th row appear in the vertical signal lines 130, and the node N1 is reset to 3 V. This is the state illustrated in part (b-2) of FIG. 15.

When the level of the signal pTN is temporarily brought into H-level from time t2, a signal corresponding to the potential of the node N1 at this time is sampled and held by the signal processor 140. That is, N-signal reading is performed.

With the levels of the bias voltages Vsa(n) and Vsb(n) temporarily being L-level from time t3, the potential of the node N1 is changed in accordance with the amount of charges stored in the photoelectric conversion units PC1 and PC2. This is the charge transfer operation illustrated in parts (e-1) and (e-2) of FIG. 15.

When the level of a signal pTS is temporarily brought into H-level from time t4, a signal corresponding to the potential of the node N1 at this time is sampled and held by the signal processor 140. That is, S-signal reading is performed. The S-signal read at this time is based on the two photoelectric conversion units PC1 and PC2 disposed under the same microlens, and thus can be used as an image pickup signal.

When the level of the signal pRES(n) becomes H-level at time t5, the node N1 is reset to 3 V again. This state corresponds to the state in which the pre-storage reset illustrated in part (a) of FIG. 15 has been performed.

When the level of the signal pSEL(n) becomes L-level at time t6, the selection state of the pixels in the n-th row is cancelled.

After that, the horizontal scanning period HSCAN(n) is started, and the level of the signal PHST becomes H-level at time t7. In response to this, the column selecting circuit 150 starts scanning of the column signal processors. The column selecting circuit 150 operates in synchronization with a clock signal (not illustrated) and thus signals from the column signal processors are sequentially output from the output amplifier 170.

Until the level of the bias voltage Vsa(n+1) becomes H-level (here, 5 V) at time t8, the charges generated by the photoelectric conversion unit are not stored in the photoelectric conversion layer and discharged.

At time t9, the levels of the signals pSEL(n+1) and pRES(n+1) become H-level. Accordingly, the pixels in the n+1-th row are selected, and signals from the pixels in the n+1-th row appear in the vertical signal lines 130. Further, with the level of the signal pRES(n+1) being H-level, the node N1 is reset to 3 V.

When the level of the signal pTN is temporarily brought into H-level from time t10, a signal corresponding to the potential of the node N2 at this time is sampled and held by the signal processor 140. That is, N-signal reading is performed.

When the levels of the bias voltages Vsa(n+1) and Vsb(n+1) are temporarily brought into L-level from time t11, the potential of the node N1 is changed in accordance with the amount of charges stored in the photoelectric conversion units PC1 and PC2. This is the charge transfer operation illustrated in parts (e-1) and (e-2) of FIG. 15. The photoelectric conversion unit PC1 is in the state of not storing charges until time t8. Thus, only the charges stored in the photoelectric conversion unit PC1 from time t8 to time t11 contribute to a signal component.

When the level of the signal pTS is temporarily brought into H-level from time t12, a signal corresponding to the potential of the node N1 at this time is sampled and held by the signal processor 140. That is, S-signal reading is performed. The S-signal read at this time is based on only the photoelectric conversion unit PC2 among the two photoelectric conversion units PC1 and PC2 disposed under the same microlens, and thus can be used as a phase difference detection signal.

When the level of the signal pRES(n+1) becomes H-level at time t13, the nodes N1 is reset to 3 V again. This state corresponds to the state in which the pre-storage reset illustrated in part (a) of FIG. 15 has been performed.

When the level of the signal pSEL(n+1) becomes L-level at time t14, the selection state of the pixels in the n+1-th row is cancelled.

After that, when the horizontal scanning period HSCAN (n+1) is started, the level of the bias voltage Vsa(n+1) becomes H-level at time t15, and a state in which the photoelectric conversion unit PC1 does not store holes occurs again.

After the bias voltage Vsa has become L-level, the level of the signal PHST becomes H-level at time t15. In response to this, the column selecting circuit 150 starts scanning of the column signal processors. The column selecting circuit 150 operates in synchronization with a clock signal (not illustrated) and thus signals from the column signal processors are sequentially output from the output amplifier 170.

As described above, as for the pixels in the n-th row, pixel signals based on the two photoelectric conversion units provided for the same microlens are read and used as image pickup signals. On the other hand, as for the pixels in the n+1-th row, pixel signals based on only one of the two photoelectric conversion units provided for the same microlens are read and used as phase difference detection signals.

As in the first embodiment, the operation of the solid-state image pickup element 1000 is not limited to the above-described operation. The pixel from which an image pickup signal is to be read and the pixel from which a phase difference detection signal is to be read may be switched in the case of, for example, capturing a still image and capturing a moving image, or may be switched in accordance with the number of pixels from which pixel signals are to be read.

As described above, according to this embodiment, an image pickup signal and a phase difference signal can be obtained. Each of the pixels according to this embodiment includes two partial electrodes (here, counter electrodes 307) that are controlled independently of each other, and thus the pixel can be used as both of an image pickup pixel and a phase difference detection pixel. Accordingly, unlike in Japanese Patent Laid-Open No. 2014-67948, the position of a phase difference detection pixel can be dynamically changed. Further, in the structure described in Japanese Patent Laid-Open No. 2014-67948, a light shielding film is provided to cover part of the phase difference detection pixel, and thus the phase difference detection pixel and the image pickup pixel may have different optical characteristics. In contrast, the pixels according to this embodiment are advantageous in that a pixel used as a phase difference detection pixel and a pixel used as an image pickup pixel have optical characteristics equivalent to each other.

Fifth Embodiment

Figure 18:
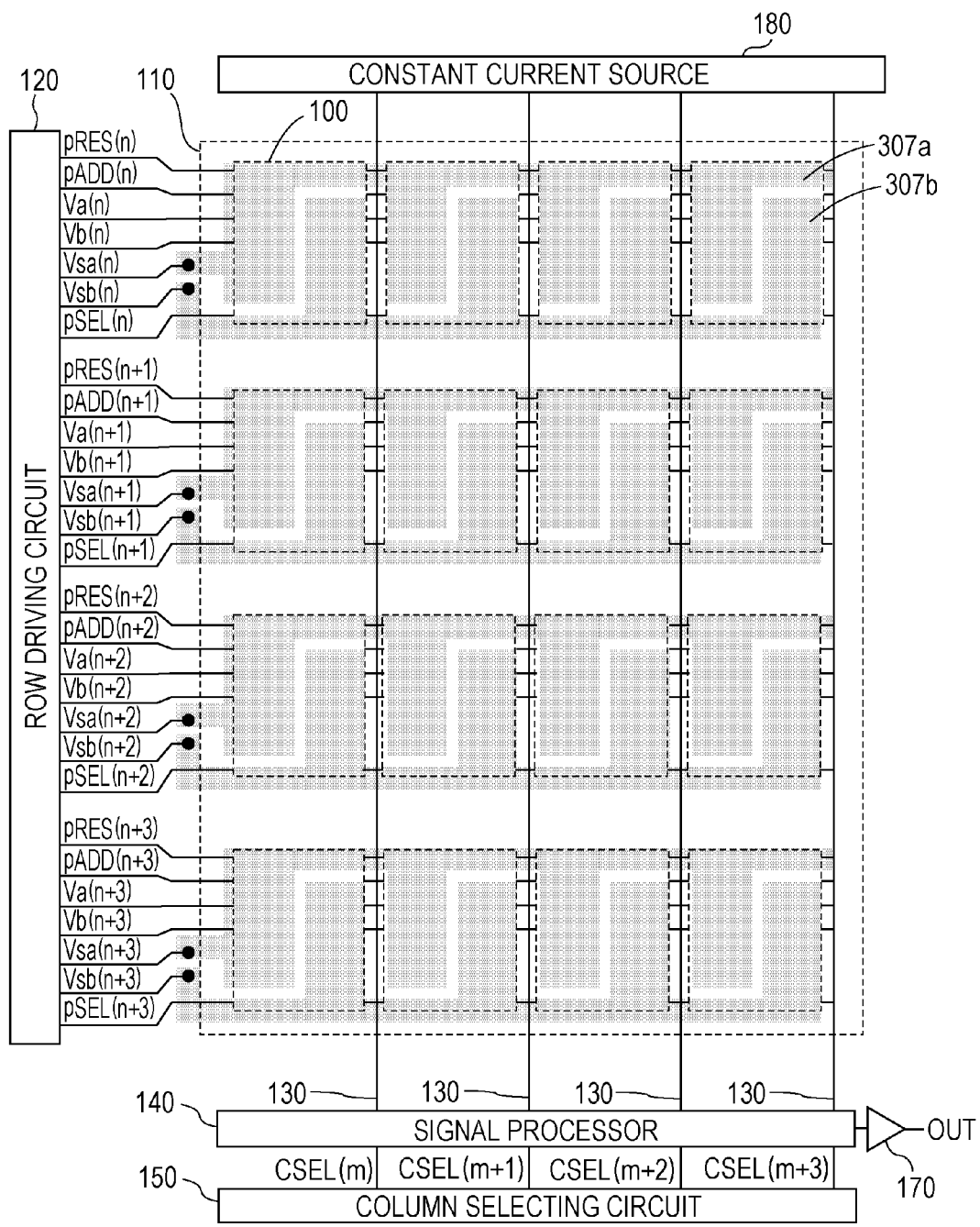
FIG. 18 is a block diagram illustrating an example configuration of a solid-state image pickup element according to a fifth embodiment.

FIG. 18 illustrates an example configuration of a solid-state image pickup element according to a fifth embodiment. The same components as those of the solid-state image pickup element illustrated in FIG. 1 are denoted by the same reference numerals. Hereinafter, a description will be given mainly of a difference from the configuration illustrated in FIG. 1.

The solid-state image pickup element according to this embodiment is different from the solid-state image pickup element illustrated in FIG. 1 in that each pixel 100 includes two counter electrodes 307a and 307b. Thus, the row driving circuit 120 supplies, to the pixels in each row, bias voltages Vsa and Vsb to be applied to the counter electrodes in addition to bias voltages Va and Vb to be applied to the drive capacitors. The two counter electrodes 307a and 307b are disposed such that the photoelectric conversion layer is sandwiched between the counter electrodes 307a and 307b and the pixel electrodes 303a and 303b, so as to constitute two photoelectric conversion units PC1 and PC2. In other words, in this embodiment, each of the pixel electrode 303 and the counter electrode 307 includes partial electrodes that are controllable independently of each other.

Figure 19:
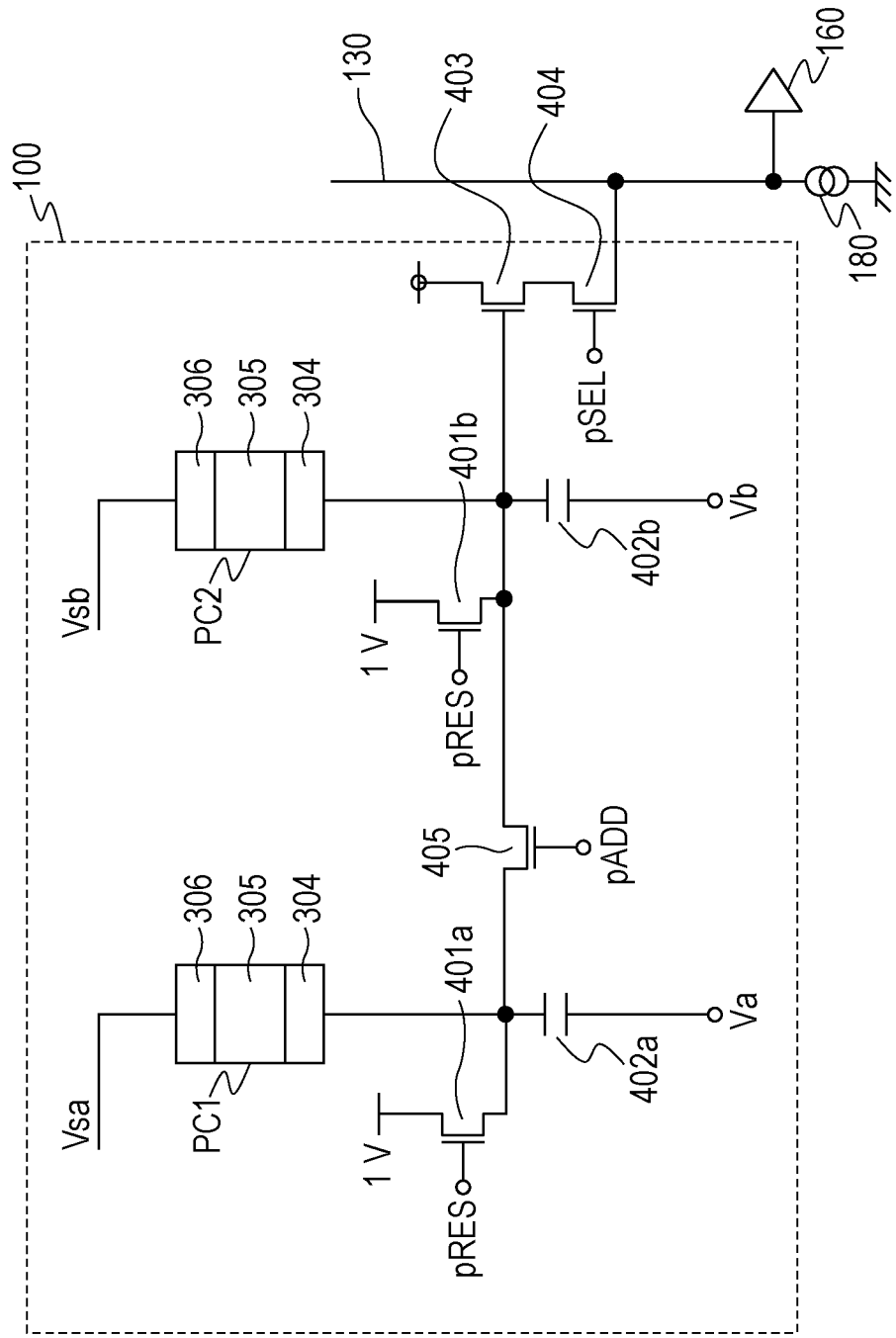
FIG. 19 is an equivalent circuit diagram illustrating an example configuration of a pixel according to the fifth embodiment.

FIG. 19 is an equivalent circuit diagram illustrating an example configuration of the pixel 100. In FIG. 3, only the bias voltage Vs is applied to the counter electrode 307. In contrast, in this embodiment, the bias voltages Vsa and Vsb that are independent of each other are applied to the two photoelectric conversion units PC1 and PC2.

Figure 20:
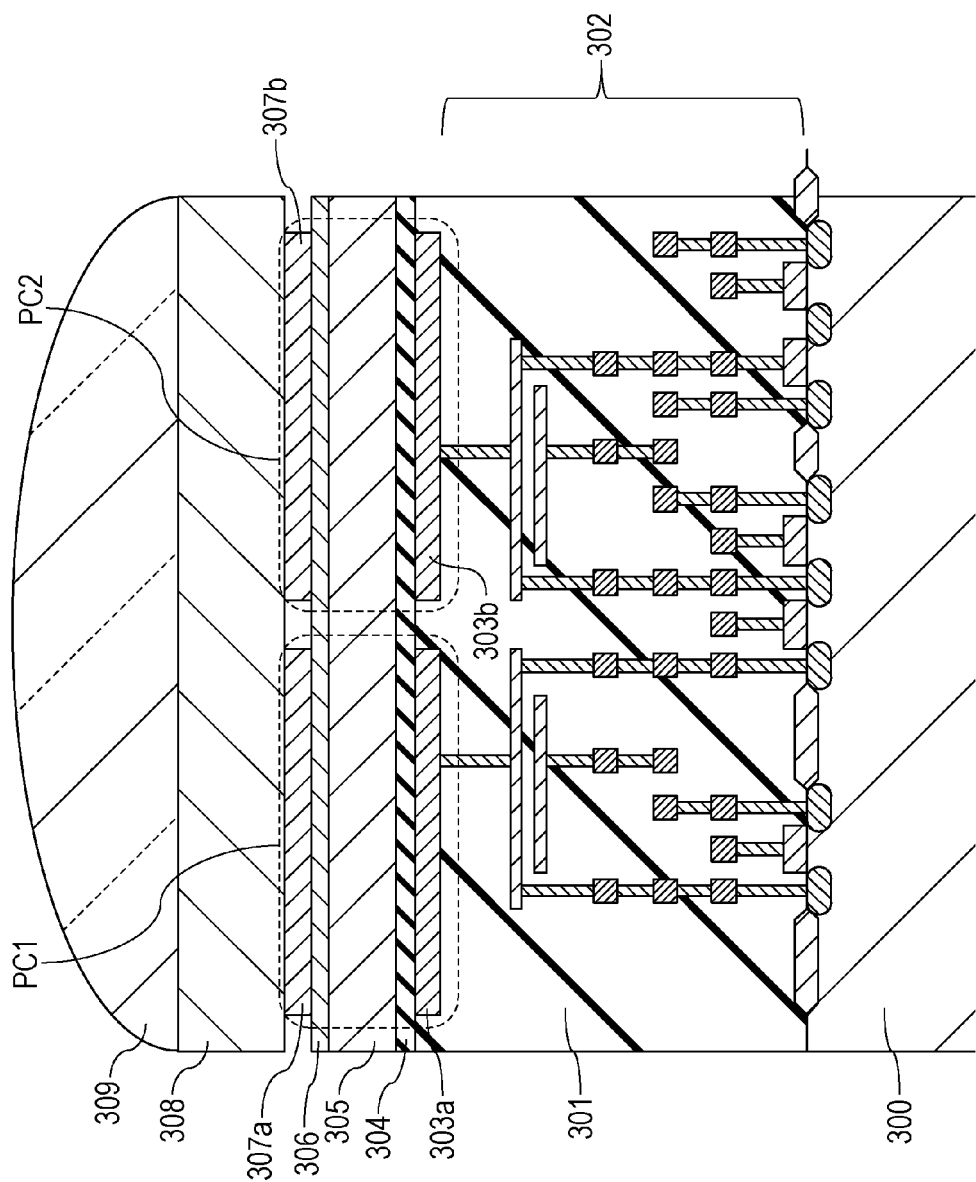
FIG. 20 is a diagram illustrating an example of a cross-sectional structure of the pixel according to the fifth embodiment.

FIG. 20 is a cross-sectional view illustrating the example configuration of the pixel 100. The only difference from FIG. 2 is that the counter electrodes 307a and 307b separated from each other are provided instead of the counter electrode 307. An insulating member or a light shielding member may be provided between the counter electrodes 307a and 307b, and thereby cross talk between the two photoelectric conversion units can be suppressed.

Figure 21:
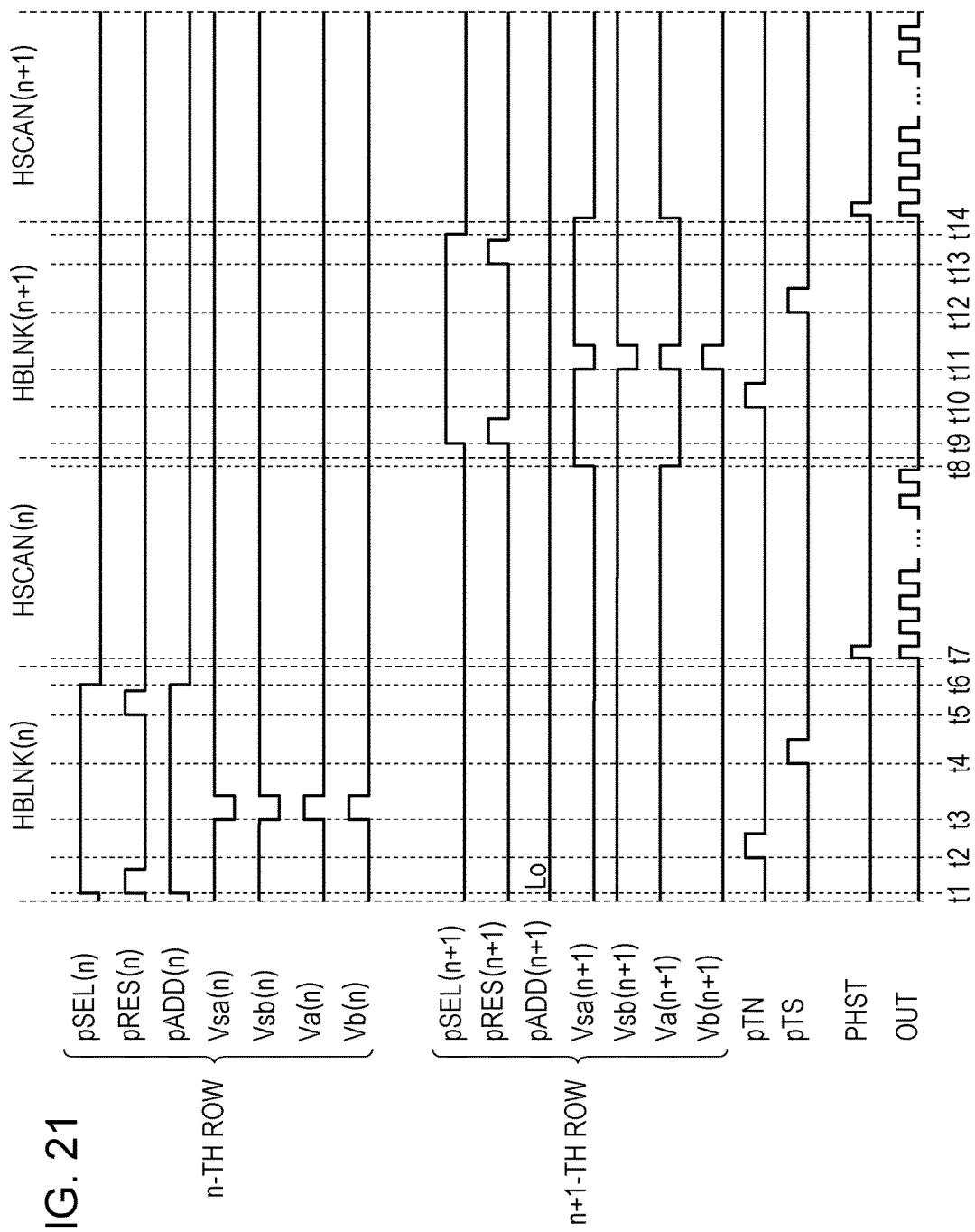
FIG. 21 is a timing chart for describing an operation of the solid-state image pickup element according to the fifth embodiment.

FIG. 21 is a timing chart for describing an operation of the solid-state image pickup element according to this embodiment. In this embodiment, rolling shutter is performed. Pixel signals based on the two photoelectric conversion units are obtained from the pixels in the n-th row, whereas pixel signals based on one of the two photoelectric conversion units are obtained from the pixels in the n+1-th row.

In this embodiment, the signals other than the bias voltages Vsa and Vsb applied to the counter electrodes are the same as those illustrated in FIG. 6. The bias voltages Vsa and Vsb are the same as those illustrated in FIG. 17. Accordingly, pixel signals based on the two photoelectric conversion units can be obtained from the pixels in the n-th row, whereas pixel signals based on one of the two photoelectric conversion units can be obtained from the pixels in the n+1-th row.

Each of the pixels according to this embodiment includes the two pixel electrodes 303 and the two counter electrodes 307 that are controlled independently of each other, and thus can be used as both of an image pickup pixel and a phase difference detection pixel. Accordingly, unlike in Japanese Patent Laid-Open No. 2014-67948, the position of a phase difference detection pixel can be dynamically changed. Further, in the structure described in Japanese Patent Laid-Open No. 2014-67948, a light shielding film is provided to cover part of the phase difference detection pixel, and thus the phase difference detection pixel and the image pickup pixel may have different optical characteristics. In contrast, the pixels according to this embodiment are advantageous in that a pixel used as a phase difference detection pixel and a pixel used as an image pickup pixel have optical characteristics equivalent to each other.

Sixth Embodiment

Figure 22:
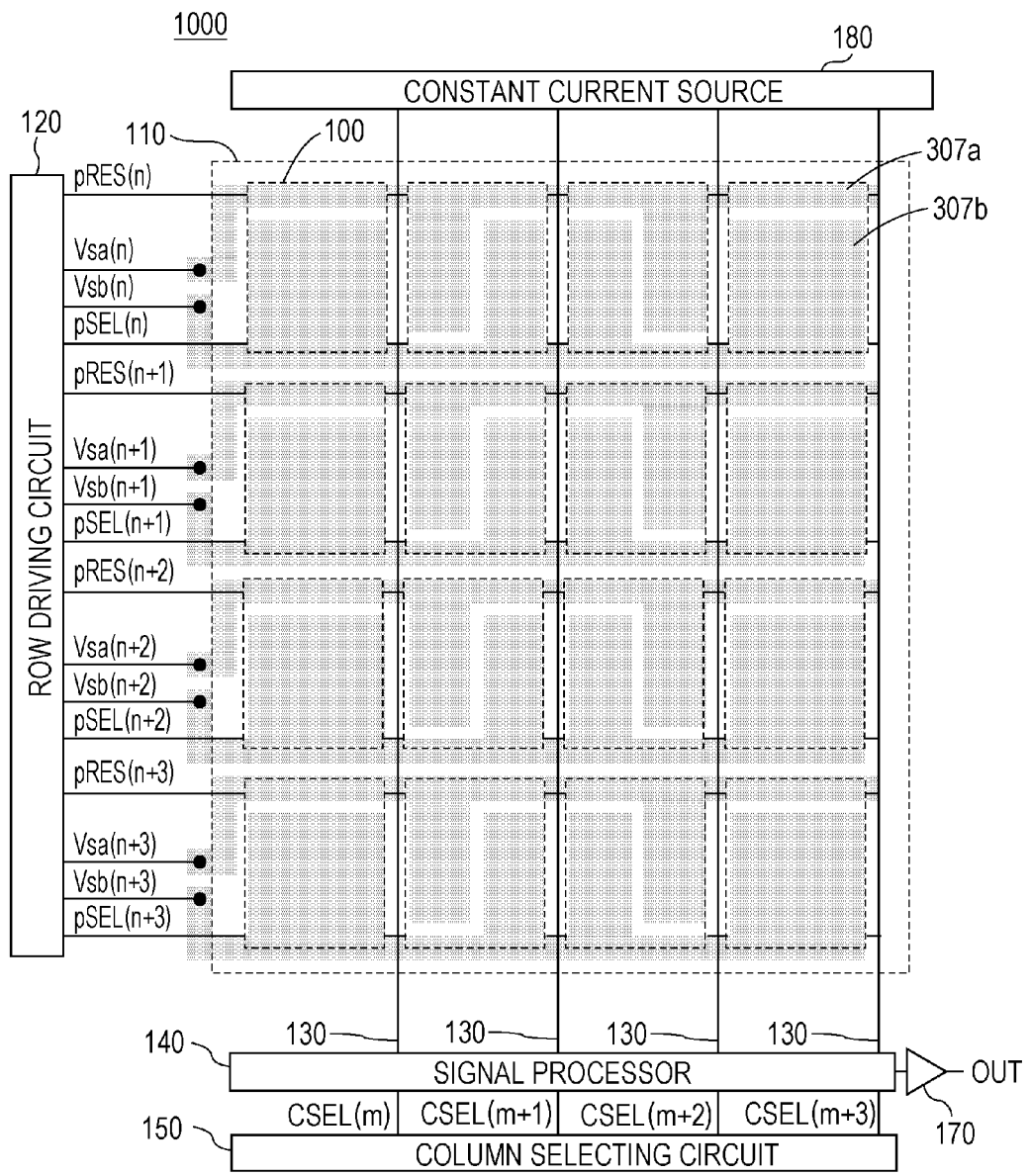
FIG. 22 is a block diagram illustrating an example configuration of a solid-state image pickup element according to a sixth embodiment.

FIG. 22 is a block diagram illustrating an example configuration of a solid-state image pickup element according to a sixth embodiment. In the solid-state image pickup element illustrated in FIG. 18, all the pixels 100 in four rows×four columns have two counter electrodes 307a and 307b. In contrast, in this embodiment, among the pixels illustrated in FIG. 22, the pixels in the m+1-th column and the pixels in the m+2-th column have two counter electrodes 307a and 307b, whereas the pixels in the m-th column and the pixels in the m+3-th column have one counter electrode 307. Further, in FIG. 18, the two counter electrodes 307a and 307b included in each pixel are translationally symmetrical in the pixel array, but in this embodiment, the counter electrodes 307a and 307b included in each of the pixels in the m+1-th column and the m+2-th column are line-symmetrical.

Figure 23:
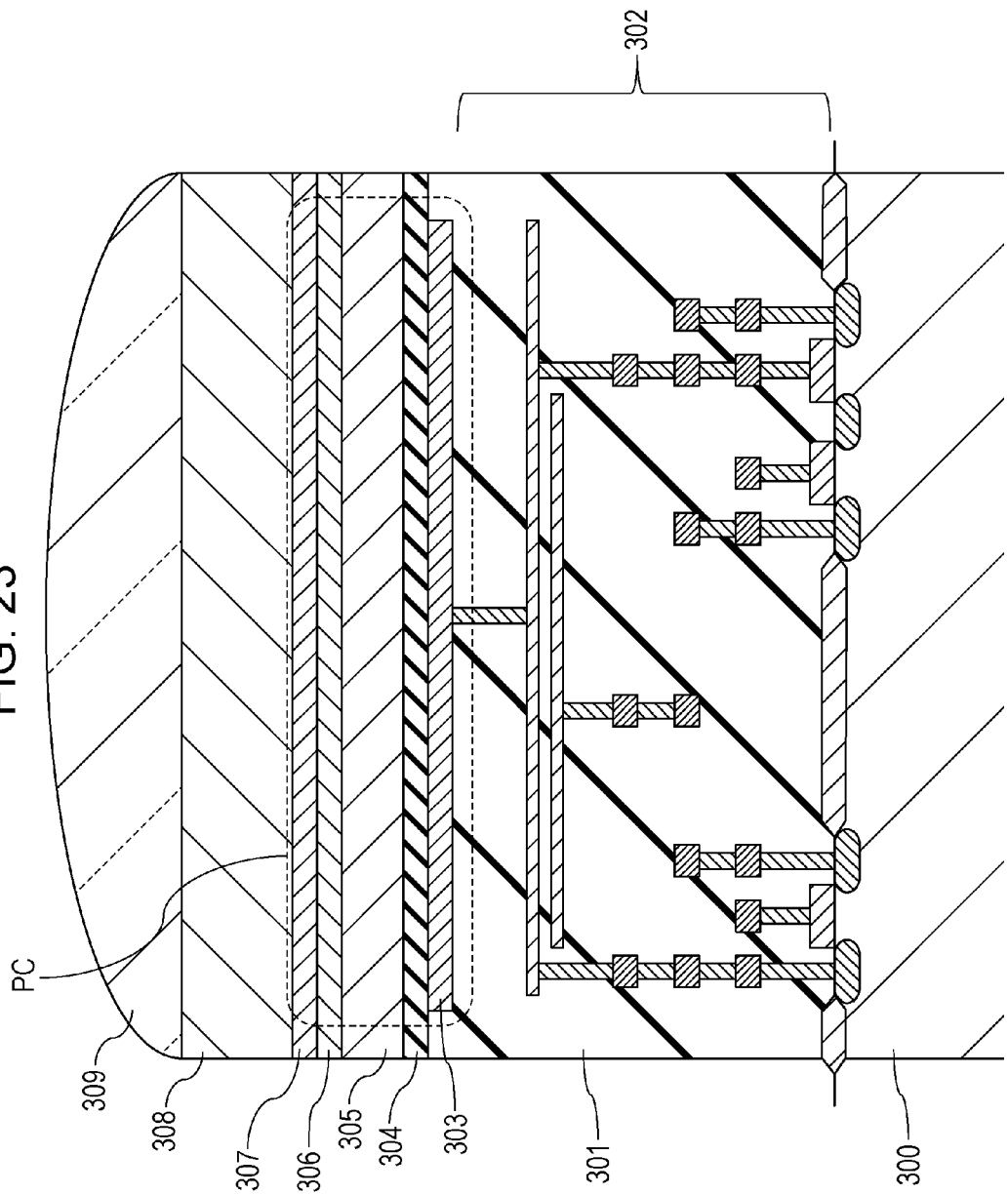
FIG. 23 is a diagram illustrating an example of a cross-sectional structure of a pixel according to the sixth embodiment.

FIG. 23 is a cross-sectional view of the pixels in the m-th column and the m+3-th column. As illustrated in FIG. 23, each of the pixels includes one pixel electrode 303 and one counter electrode 307, and the photoelectric conversion layer 305 is sandwiched between the pixel electrode 303 and the counter electrode 307, so as to constitute one photoelectric conversion unit PC.

Figure 24:
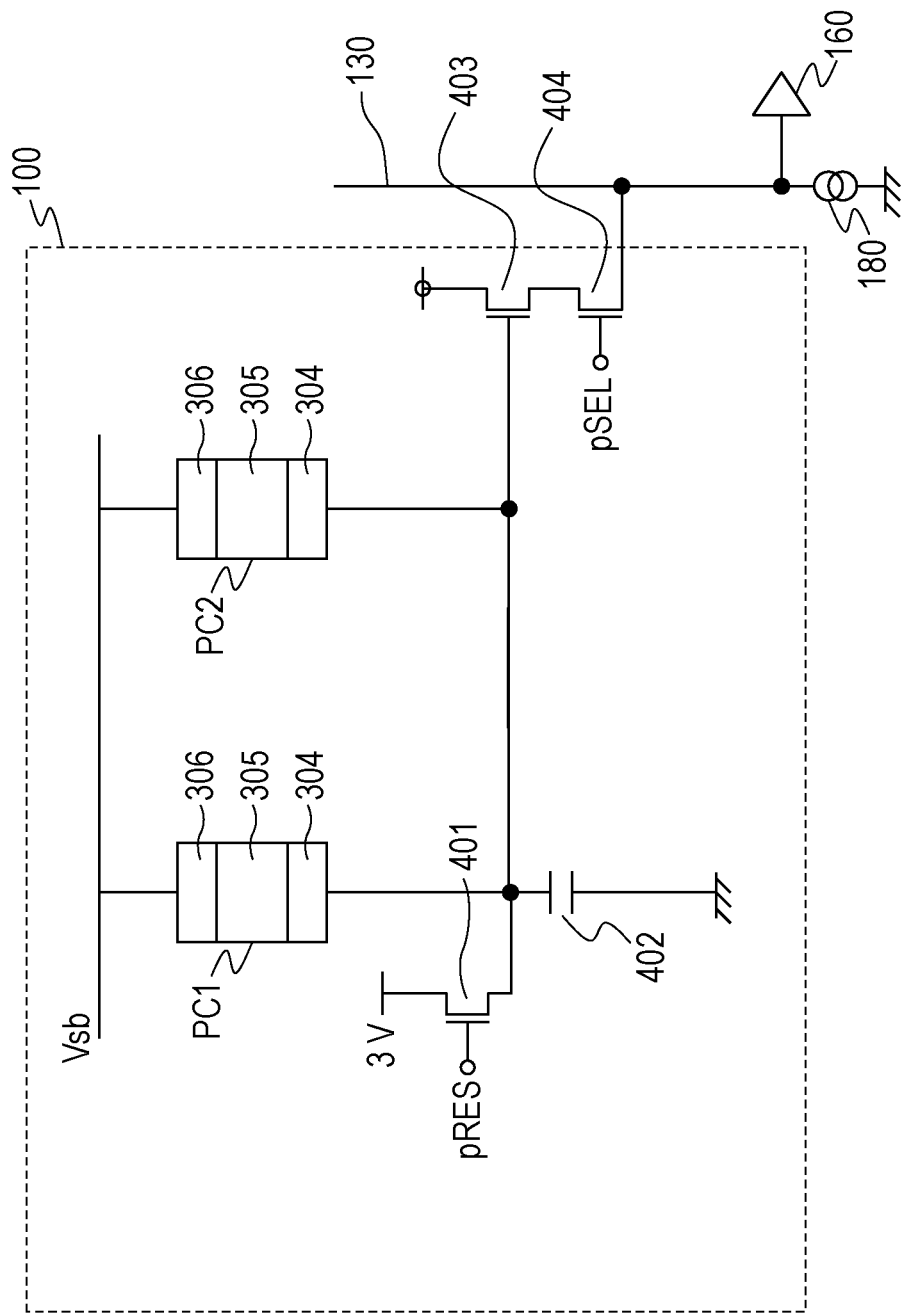
FIG. 24 is an equivalent circuit diagram illustrating an example configuration of the pixel according to the sixth embodiment.

FIG. 24 is an equivalent circuit diagram of the pixels in the m-th column and the m+3-th column. This configuration is obtained by removing, from the configuration of the pixel illustrated in FIG. 3, the reset transistor 401b, the drive capacitor 402b, and the switch 405.

The pixels in the m+1-th column have the same equivalent circuit diagram as that illustrated in FIG. 14. The pixels in the m+2-th column have a configuration in which, in the equivalent circuit diagram illustrated in FIG. 14, the bias voltage Vsb is supplied to the photoelectric conversion unit PC1 and the bias voltage Vsa is supplied to the photoelectric conversion unit PC2.

The operation according to this embodiment will be described with reference to the timing chart illustrated in FIG. 25.

Image pickup signals can be obtained from the individual pixels in the n-th row. The same operation as that in the n-th row illustrated in FIG. 17 is performed in the m-th column and the m+3-th column, but this embodiment is different in that each pixel includes only one photoelectric conversion unit. With the same operation as that in the n-th row illustrated in FIG. 17 being performed, signals based on the charges stored in the two photoelectric conversion units PC1 and PC2 can be obtained from the pixels in the m+1-th column and the m+2-th column.

Figure 25:
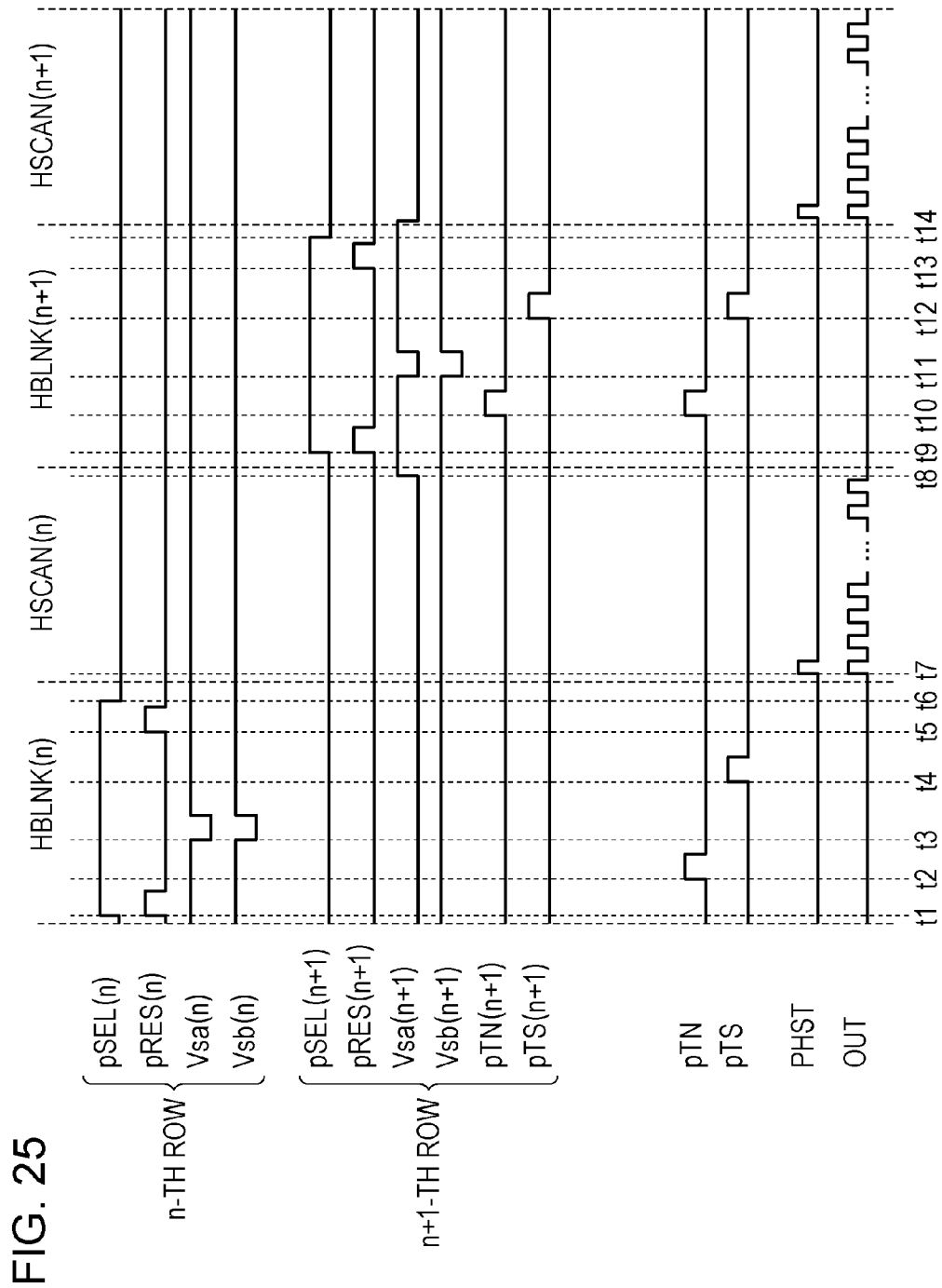
FIG. 25 is a timing chart for describing an operation of the solid-state image pickup element according to the sixth embodiment.

FIG. 25 is a timing chart for describing an operation according to this embodiment. As for the n+1-th row, image pickup signals can be obtained from the pixels in the m-th column and the m+3-th column as in the n-th row. As for the m+1-th column, signals based on the photoelectric conversion units on the right in FIG. 22 are read. As for the m+2-th column, signals based on the photoelectric conversion units on the left in FIG. 22 are read. The signals based on the photoelectric conversion units on the left of the pixels in the m+1-th column and the signals based on the photoelectric conversion units on the right of the pixels in the m+2-th column are not read and discharged from the counter electrodes. In this way, the signals obtained from the pixels in the m+1-th column and the m+2-th column are used as phase difference detection signals.

As for the n+2-th row and thereafter, the same operation as that for the n-th row may be performed or the same operation as that for the n+1-th row may be performed in accordance with the accuracy that is necessary for phase difference detection. That is, according to this embodiment, switching between a row in which only image pickup signals are obtained and a row in whish phase difference detection signals are obtained can be dynamically performed.

In this embodiment, some of the pixels include two partial electrodes that are controlled independently of each other (here, counter electrodes 307), and thus these pixels can be used as both of an image pickup pixel and a phase difference detection pixel. Accordingly, unlike in Japanese Patent Laid-Open No. 2014-67948, the position of a phase difference detection pixel can be dynamically changed. Further, in the structure described in Japanese Patent Laid-Open No. 2014-67948, a light shielding film is provided to cover part of the phase difference detection pixel, and thus the phase difference detection pixel and the image pickup pixel may have different optical characteristics. In contrast, the pixels according to this embodiment are advantageous in that a pixel used as a phase difference detection pixel and a pixel used as an image pickup pixel have optical characteristic equivalent to each other.

Seventh Embodiment

Figure 26:
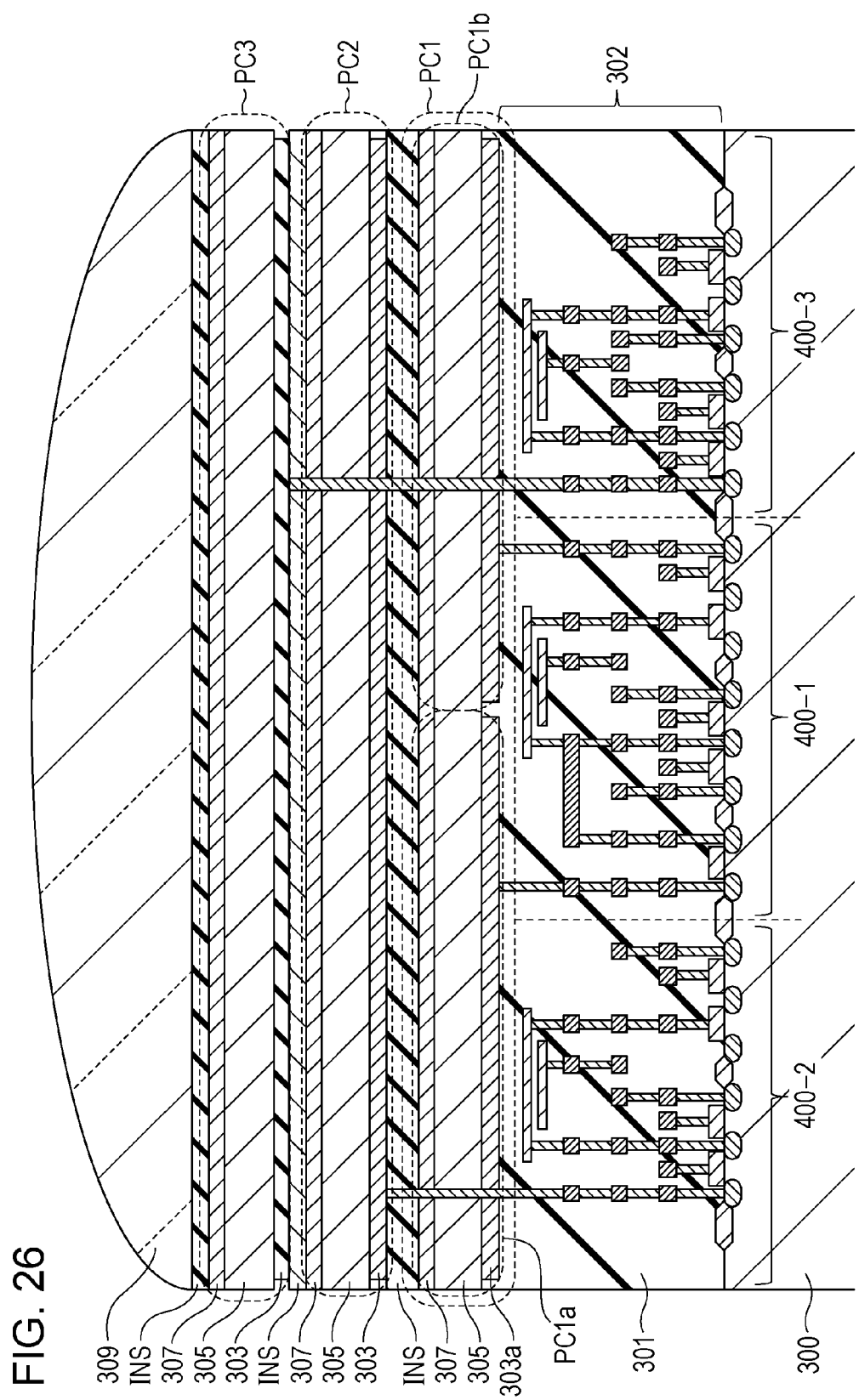
FIG. 26 is a diagram illustrating an example of a cross-sectional structure of a pixel according to a seventh embodiment.

FIG. 26 is a diagram for describing a cross-sectional structure of a pixel according to a seventh embodiment. A difference from the above-described embodiments is that a plurality of photoelectric conversion units are stacked. To simplify the figure, FIG. 26 does not illustrate the interlayer insulating layer 304 and the blocking layer 306.

FIG. 26 illustrates a configuration in which three photoelectric conversion units PC1, PC2, and PC3 are stacked in order from the semiconductor substrate toward the microlens. The photoelectric conversion unit PC1 includes photoelectric conversion units PC1a and PC1b. A material having a light transmission characteristic is used for individual layers disposed between photoelectric conversion layers 305a, 305b, and 305c, and thereby such a configuration can be obtained. An interlayer insulating layer INS is disposed between the pixel electrode 303 of the photoelectric conversion unit PC3 and the counter electrode 307 of the photoelectric conversion unit PC2. Also, an interlayer insulating layer INS is disposed between the pixel electrode 303 of the photoelectric conversion unit PC2 and the counter electrode 307 of the photoelectric conversion unit PC1. Further, an interlayer insulating layer INS is disposed between the counter electrode 307 of the photoelectric conversion unit PC3 and the microlens layer 309.

In a case where the film thicknesses of the individual photoelectric conversion layers 305 are set so that, among the three layers of photoelectric conversion units, the top layer absorbs a blue color component of incident light, the second layer absorbs a green color component, and the bottom layer absorbs a red color component, signal components of B, G, and R can be obtained from light that has entered the same microlens, without providing color filters.

In this embodiment, each of the photoelectric conversion units PC2 and PC3 includes one pixel electrode and one counter electrode, and the photoelectric conversion unit PC1 includes one counter electrode and two pixel electrodes 303a and 303b. With this configuration, image pickup signals can be obtained from the photoelectric conversion units PC2 and PC3 in the two layers close to the microlens among the three layers, and phase difference detection signals can be obtained from the photoelectric conversion unit PC1 in the bottom layer.

A signal reading circuit is provided for each photoelectric conversion layer. The signal reading circuit described above in the above-described embodiments may be used, or a signal reading circuit having another configuration may be used.

Figure 27A:
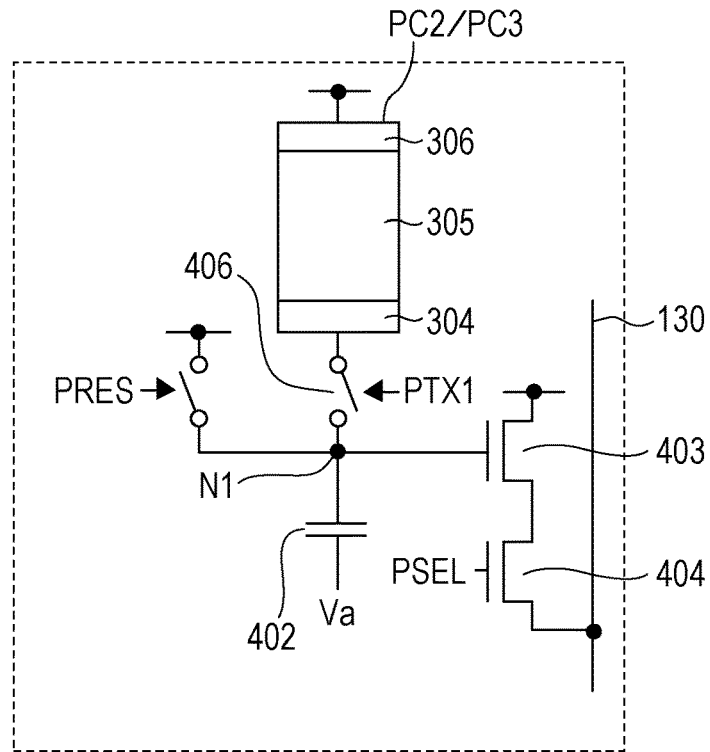
FIGS. 27A and 27B are equivalent circuit diagrams illustrating example configurations of a signal reading circuit according to the seventh embodiment.
Figure 27B:
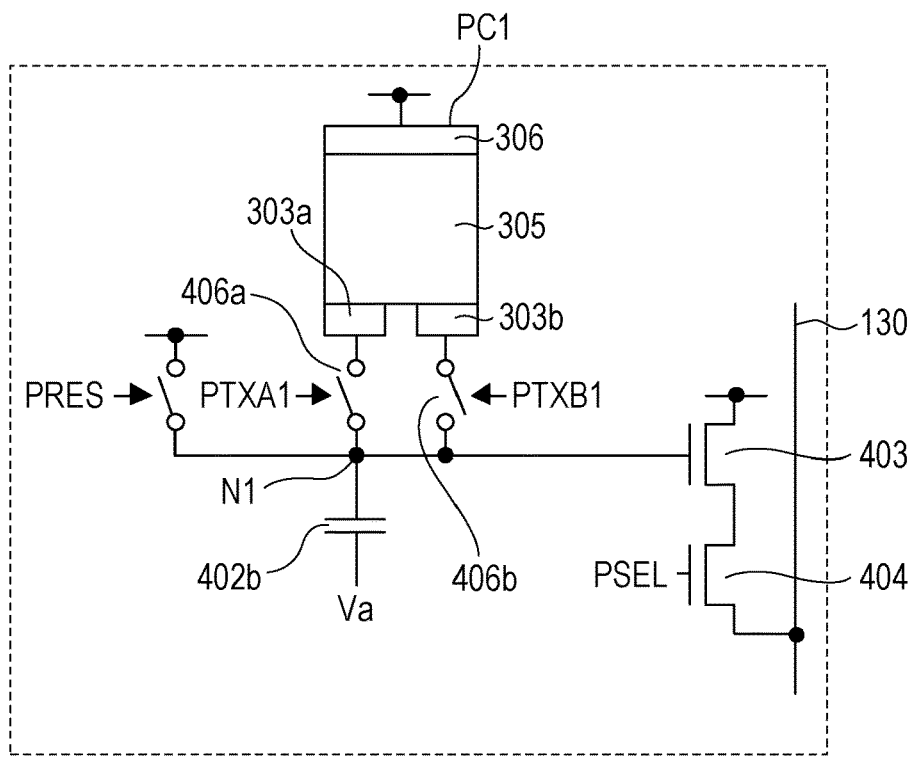

FIGS. 27A and 27B illustrate example configurations of a signal reading circuit. FIG. 27A is an equivalent circuit diagram of the signal reading circuit corresponding to the photoelectric conversion units PC2 and PC3 among the three photoelectric conversion units PC1 to PC3. This configuration is obtained by providing a transfer transistor 406 in the configuration of one photoelectric conversion unit and signal reading circuit in the structure illustrated in FIG. 9. FIG. 27B is an equivalent circuit diagram of the signal reading circuit corresponding to the photoelectric conversion unit PC1. This configuration is obtained by removing one photoelectric conversion unit, the reset transistor 401b, the drive capacitor 402b, and the switch 405 from the structure illustrated in FIG. 3, and providing transfer transistors 406a and 406b. Outputs of the signal reading circuits provided for the individual photoelectric conversion units are connected to different vertical signal lines. As in the above-described embodiments, the pixels provided in the same column of the pixel array 110 share the same vertical signal line.

Figure 28:
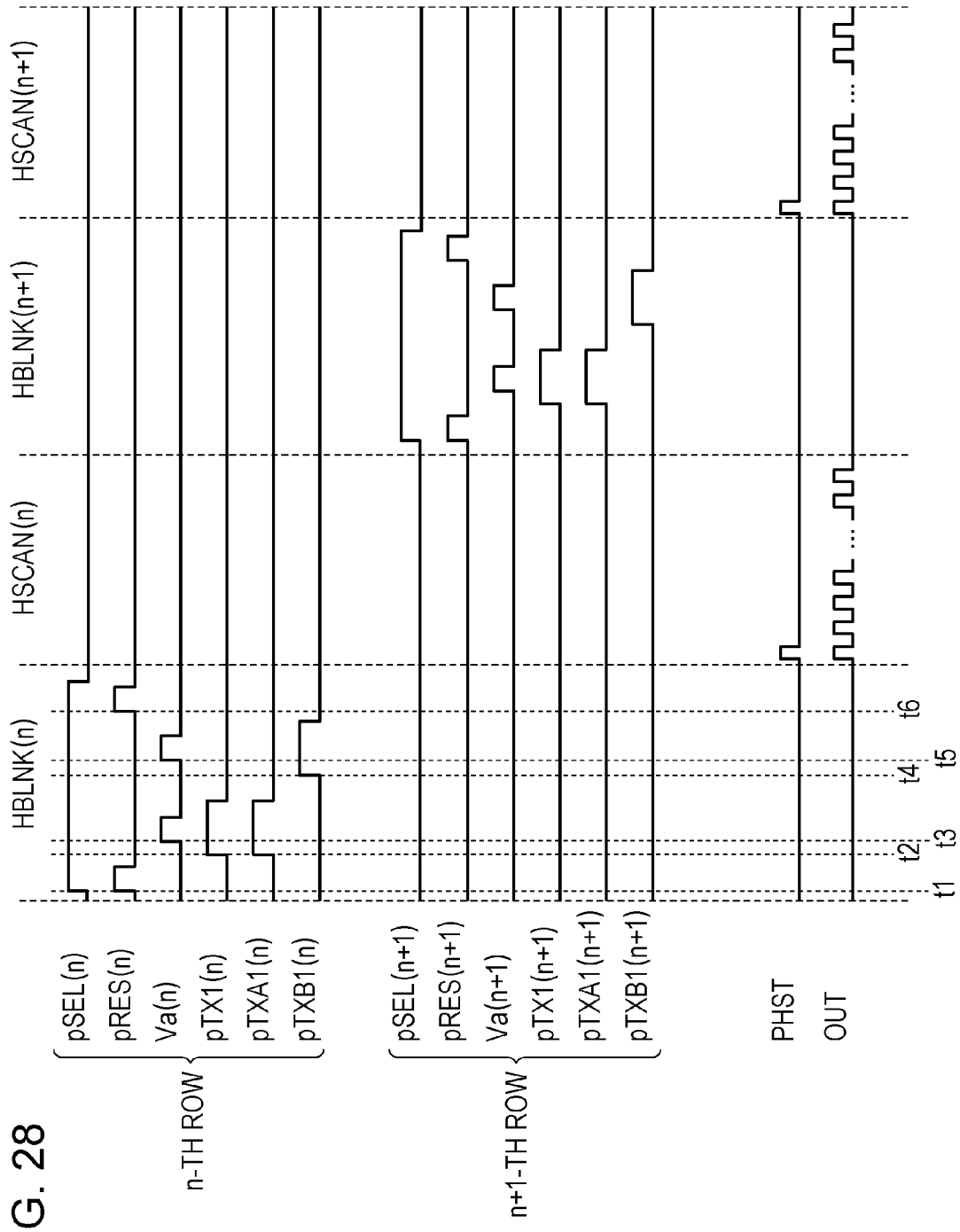
FIG. 28 is a timing chart for describing an operation of a solid-state image pickup element according to the seventh embodiment.

FIG. 28 is a timing chart according to this embodiment. In this embodiment, a description will be given of an operation of reading image pickup signals from the photoelectric conversion units PC2 and PC3 and reading phase difference detection signals and image pickup signals from the photoelectric conversion unit PC1.

At time t1, the levels of the signals pSEL(n) and pRES(n) become H-level. Accordingly, the pixels in the n-th row are selected, and the node N1 is reset. A signal obtained after the node N1 has been reset is sampled and held by the column signal processor, and thereby the above-described N-signal reading operation is performed.

At time t2, the levels of the signals pTX1(*n*) and pTXA1(*n*) become H-level. After that, when the bias voltage Va(n) to be supplied to the drive capacitor is brought into H-level at time t3, signals corresponding to the amount of charges stored in the photoelectric conversion units PC2 and PC3 and the amount of charges stored in the photoelectric conversion unit PC1*a* are output from the amplification transistor 403. The signals output from the amplification transistor 403 are sampled and held by the column signal processor, and thereby the above-described S-signal reading operation is performed. As for the photoelectric conversion units PC2 and PC3, a difference from the signal obtained through N-signal reading is obtained, and thereby an image pickup signal with reduced noise can be obtained. On the other hand, as for the photoelectric conversion unit PC1*a*, a difference from the signal obtained through N-signal reading is obtained, and thereby a phase difference detection signal with reduced noise can be obtained.

At time t4, the level of the signal pTXB1(*n*) becomes H-level. After that, when the level of the bias voltage Va(n) becomes H-level at time t5, the signal based on the charges stored in the photoelectric conversion unit PC1*b* is superposed on the signal based on the charges stored in the photoelectric conversion unit PC1*a*. The resulting signal is a signal based on the total sum of the charges stored in the photoelectric conversion units PC1*a* and PC1*b*, and thus the signal output from the amplification transistor 403 can also be used as an image pickup signal. This signal is sampled and held by the column signal processor. Further, after the level of the signal pTXA1(*n*) becomes L-level and before time t4, a difference from the sampled and held signal is obtained to calculate a signal based on the charges stored in only the photoelectric conversion unit PC1*b*. Accordingly, both of an image pickup signal and a phase difference detection signal can be obtained from the photoelectric conversion unit PC1.

The operation for the n+1-th row and thereafter is the same as that for the n-th row, and thus the description thereof is omitted.

Figure 29A:
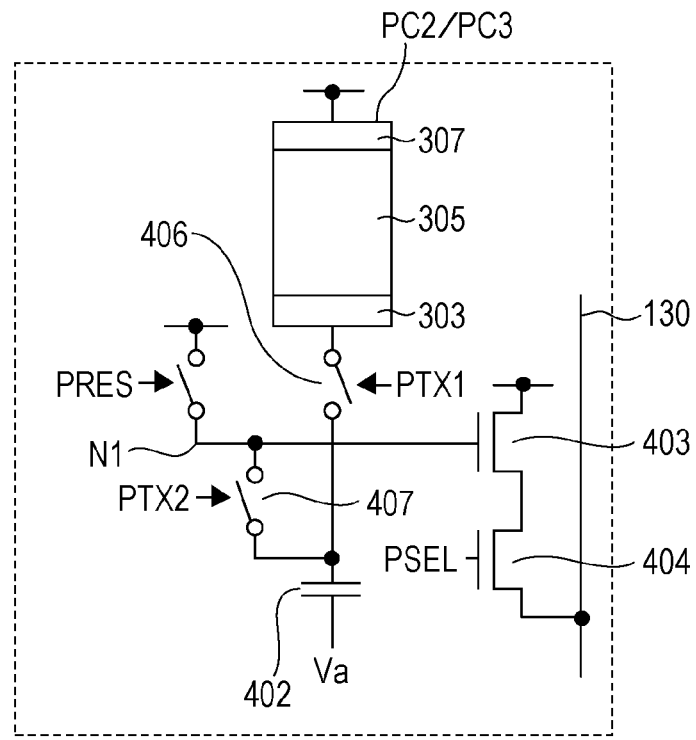
FIGS. 29A and 29B are equivalent circuit diagrams illustrating example configurations of a signal reading circuit according to the seventh embodiment.
Figure 29B:
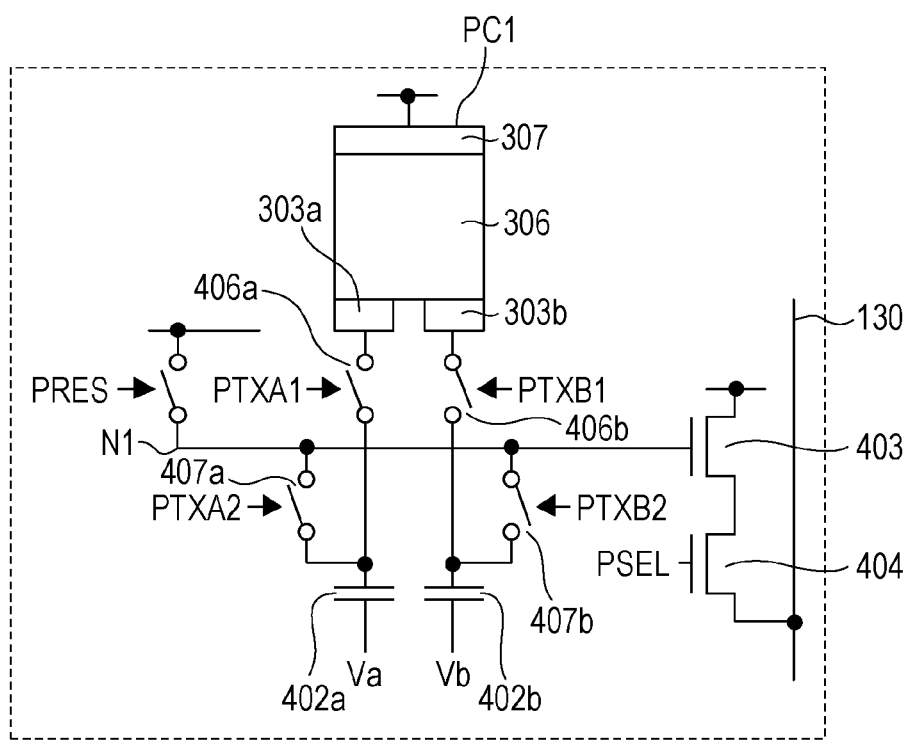

FIGS. 29A and 29B are diagrams illustrating other example configurations of the signal reading circuit according to this embodiment. FIG. 29A is an equivalent circuit diagram of the signal reading circuit corresponding to the photoelectric conversion units PC2 and PC3 among the three photoelectric conversion units PC1 to PC3. FIG. 29B is an equivalent circuit diagram of the signal reading circuit corresponding to the photoelectric conversion unit PC1. Outputs of the signal reading circuits provided for the individual photoelectric conversion units are connected to different vertical signal lines. As in the above-described embodiments, the individual pixels provided in the same column of the pixel array 110 share the same vertical signal line.

The signal reading circuit illustrated in FIG. 29A is different from the configuration illustrated in FIG. 27A in that the transfer transistor 406 and the drive capacitor are not connected to the node N1 and are connected to the node N1 via a second transfer transistor 407.

Likewise, the signal reading circuit illustrated in FIG. 29B is different from the configuration illustrated in FIG. 27B in that the transfer transistors 406*a* and 406*b* and the drive capacitor are not connected to the node N1 and are connected to the node N1 via second transfer transistors 407*a* and 407*b*.

Figure 30:
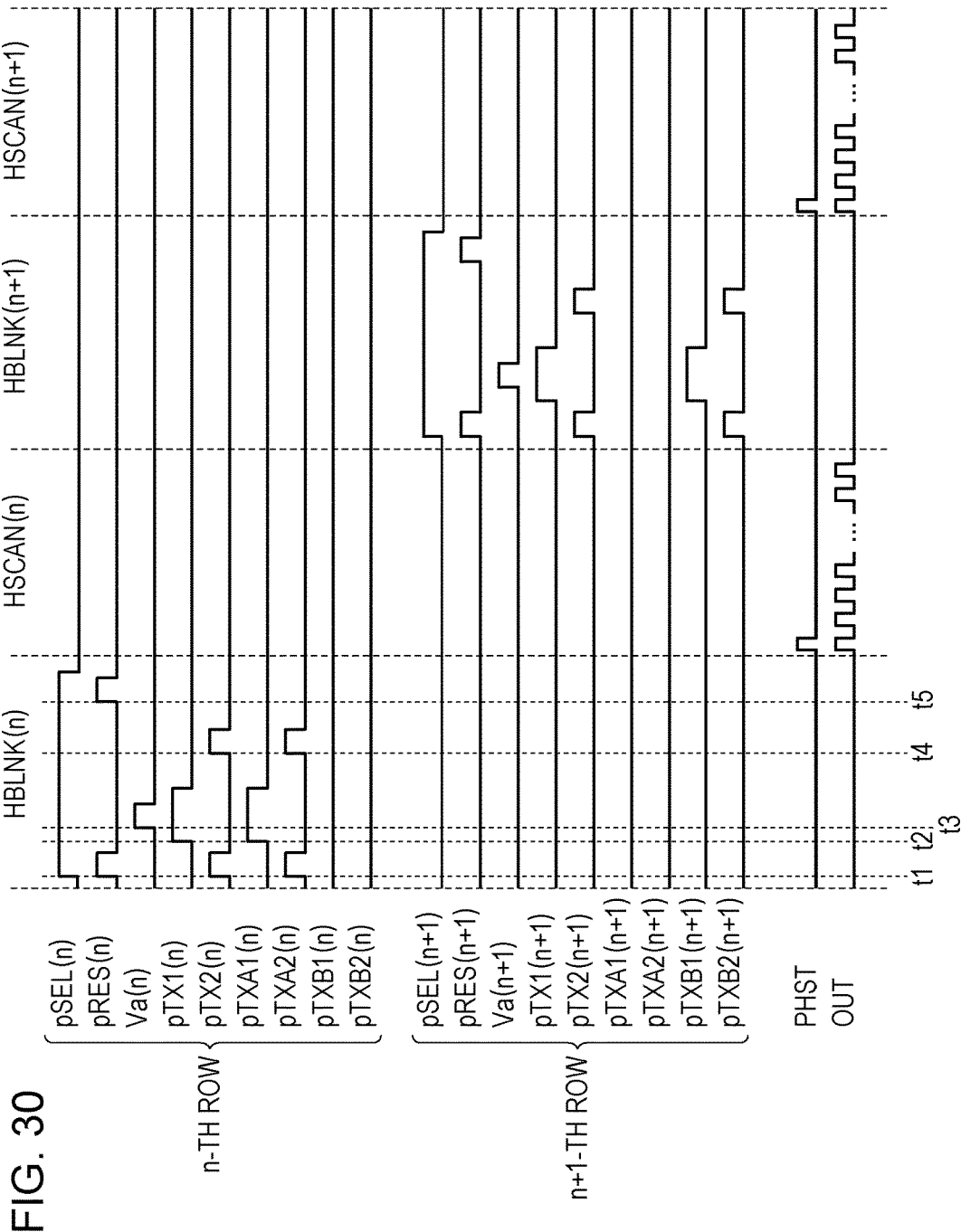
FIG. 30 is a timing chart for describing an operation of the solid-state image pickup element according to the seventh embodiment.

Next, an operation of the signal reading circuit illustrated in FIGS. 29A and 29B will be described with reference to FIG. 30.

At time t1, the levels of the signals pSEL(n) and pRES(n) become H-level, and also the levels of the signals pTX2(*n*) and pTXA2(*n*) become H-level. Accordingly, the node N1 is reset. A signal obtained after the node N1 has been reset is sampled and held by the column signal processor, and thereby the above-described N-signal reading operation is performed.

At time t2, the levels of the signals pTX1(*n*) and pTXA1(*n*) become H-level. After that, when the level of the bias voltage Va(n) to be supplied to the drive capacitor temporarily becomes H-level from time t3, a voltage corresponding to the amount of charges stored in the photoelectric conversion units PC2 and PC3 and the photoelectric conversion unit PC1*a* is held by the drive capacitor 402.

When the levels of the signals PTX2(*n*) and PTXA2(*n*) become H-level at time t4, the drive capacitor 402 is connected to the node N1. Accordingly, a signal corresponding to the voltage held by the drive capacitor 402 is output from the amplification transistor 403. The signal output from the amplification transistor 403 is sampled and held by the column signal processor, and thereby the above-described S-signal reading operation is performed. As for the photoelectric conversion units PC2 and PC3, a difference from the signal obtained through the N-signal reading is obtained, and thereby an image pickup signal with reduced noise is obtained. On the other hand, as for the photoelectric conversion unit PC1*a*, a difference from the signal obtained through the N-signal reading is obtained, and thereby a phase difference detection signal with reduced noise is obtained.

In the operation in the horizontal blanking period HBLNK (n+1) that is substantially performed, the signals pTXA1 and pTXA2 are kept in L-level, and the signals pTXB1 and pTXB2 have the same waveforms as the signals pTXA1 and pTXA2 in the horizontal blanking period HBLNK(n). Accordingly, as for the photoelectric conversion unit PC1, a signal based on only the photoelectric conversion unit PC1*b* is read. This signal is used as a phase difference detection signal, and may be used as an image pickup signal as a result of being added to the signal read from the photoelectric conversion unit PC1*a* in HBLNK(n). That is, according to this embodiment, image pickup signals can be obtained from all of the three photoelectric conversion units PC1 to PC3, and also a phase difference detection signal can be obtained from the photoelectric conversion unit PC1 in the bottom layer.

The image pickup signal based on the photoelectric conversion units PC2 and PC3 are read twice during this operation. Only the signal read in the horizontal blanking period HBLNK(n) may be used to form an image, or the signal read in the horizontal blanking period HBLNK(n+1) may be added to form an image.

Figure 31A:
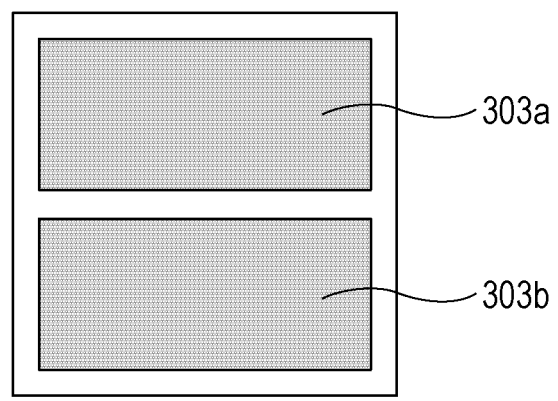
FIGS. 31A and 31B are schematic plan views illustrating an example disposition of signal reading circuits according to the seventh embodiment.
Figure 31B:
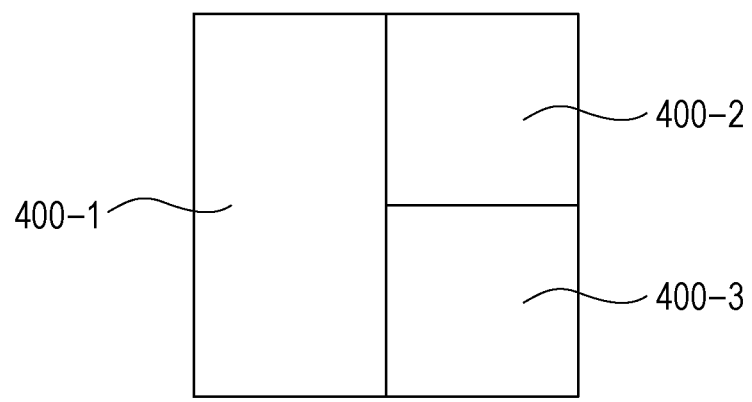

FIGS. 31A and 31B are schematic plan views illustrating an example disposition of signal reading circuits according to this embodiment. A signal reading circuit 400-1 corresponding to the photoelectric conversion unit PC1 includes a larger number of components than signal reading circuits 400-2 and 400-3 corresponding to the photoelectric conversion units PC2 and PC3, and thus has a larger area, as illustrated in FIG. 31B. The disposition of the signal reading circuits and the disposition of the pixel electrodes 303a and 303b can be freely determined. For example, as illustrated in FIG. 31A, the pixel electrode 303a may be disposed so as to cover the signal reading circuits 400-1 and 400-2, and the pixel electrode 303b may be disposed so as to cover the signal reading circuits 400-1 and 400-3.

In this embodiment, a description has been given of the configuration in which the three photoelectric conversion units PC1 to PC3 are stacked in this order in the direction from the semiconductor substrate toward the microlens. The number of photoelectric conversion units is not limited to three, but may be two or may be four or more.

In this embodiment, a description has been given of the case where a phase difference detection signal is obtained from only the photoelectric conversion unit in the bottom layer, but a phase difference detection signal may be obtained from another layer. However, to perform phase difference detection, the microlens may be designed so that incident light is focused on the interface of the photoelectric conversion layer 305 on the side of the counter electrode 307 or inside the photoelectric conversion layer 305. In this case, it is difficult to obtain a phase difference detection signal by using the photoelectric conversion unit that is the closest to the microlens, and thus a phase difference detection signal may be obtained from a photoelectric conversion unit other than the photoelectric conversion unit that is the closest to the microlens.

In this embodiment, each pixel includes the two counter electrodes 307 that are controlled independently of each other, and thus the pixel can be used as both of an image pickup pixel and a phase difference detection pixel. Accordingly, unlike in Japanese Patent Laid-Open No. 2014-67948, the position of a phase difference detection pixel can be dynamically changed. Further, in the structure described in Japanese Patent Laid-Open No. 2014-67948, a light shielding film is provided to cover part of a phase difference detection pixel, and thus the phase difference detection pixel and an image pickup pixel may have different optical characteristics. In contrast, the pixels according to this embodiment are advantageous in that a pixel used as a phase difference detection pixel and a pixel used as an image pickup pixel have optical characteristics equivalent to each other.

Eighth Embodiment

Figure 32:
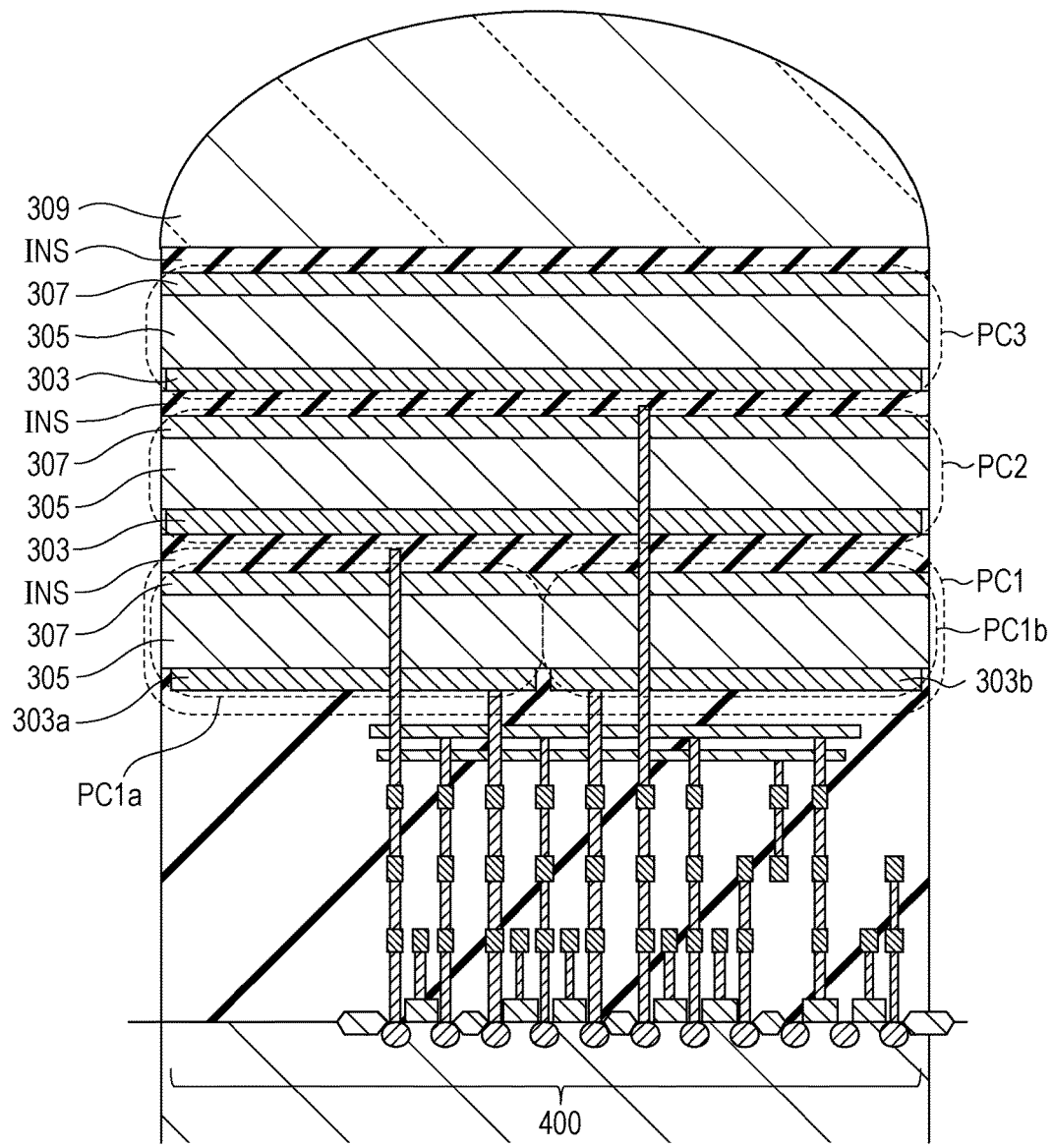
FIG. 32 is a diagram illustrating an example of a cross-sectional structure of a pixel according to an eighth embodiment.

FIG. 32 illustrates a cross-sectional structure of a pixel according to an eighth embodiment. A difference from FIG. 26 is that one signal reading circuit is provided for three photoelectric conversion units that are stacked.

Figure 33A:
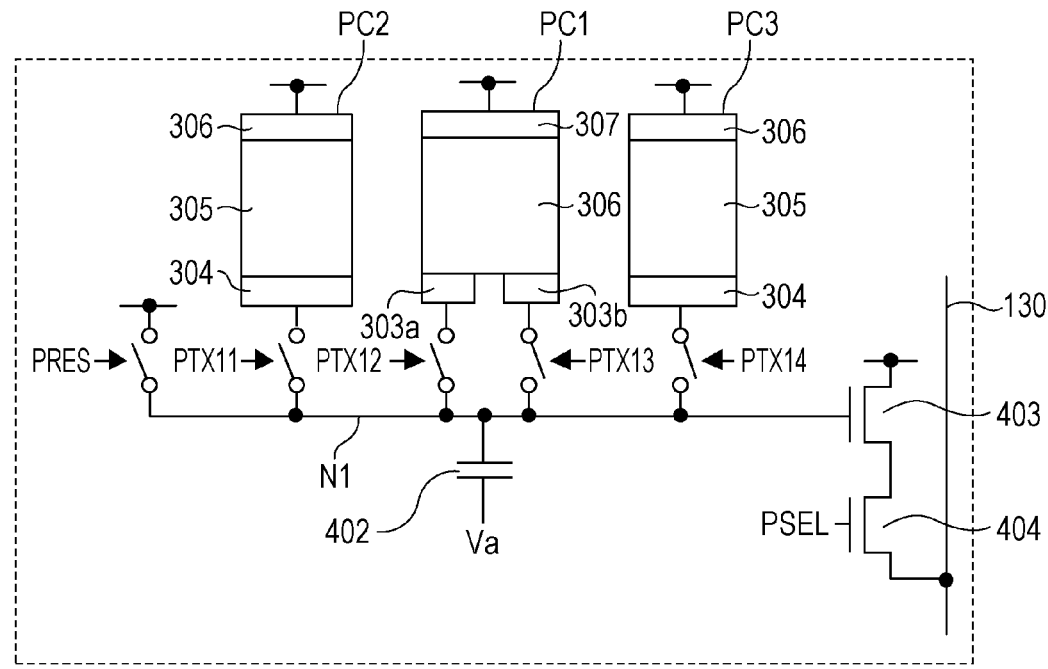
FIGS. 33A and 33B are equivalent circuit diagrams illustrating example configurations of a signal reading circuit according to the eighth embodiment.
Figure 33B:
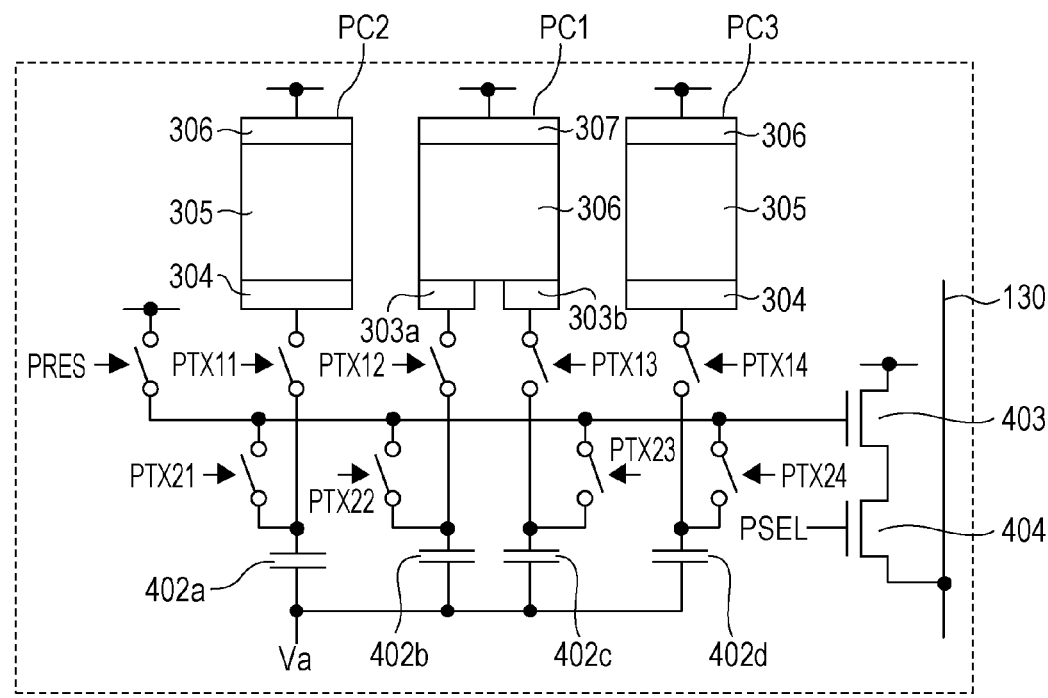

FIGS. 33A and 33B are equivalent circuit diagrams of the signal reading circuit according to this embodiment. The circuit illustrated in FIG. 33A is similar to the signal reading circuit illustrated in FIGS. 27A and 27B, but is different from the signal reading circuit illustrated in FIGS. 27A and 27B in that a common amplification transistor 403 is provided for the plurality of photoelectric conversion units PC1 to PC3. The circuit illustrated in FIG. 33B is similar to the signal reading circuit illustrated in FIGS. 29A and 29B, but is different from the signal reading circuit illustrated in FIGS. 29A and 29B in that the common amplification transistor 403 is provided for the plurality of photoelectric conversion units PC1 to PC3. With this configuration, the scale of the signal reading circuit can be reduced compared to the configuration according to the seventh embodiment, which is advantageous to increase the number of pixels in the pixel array and reducing the size of the pixels.

Figure 34:
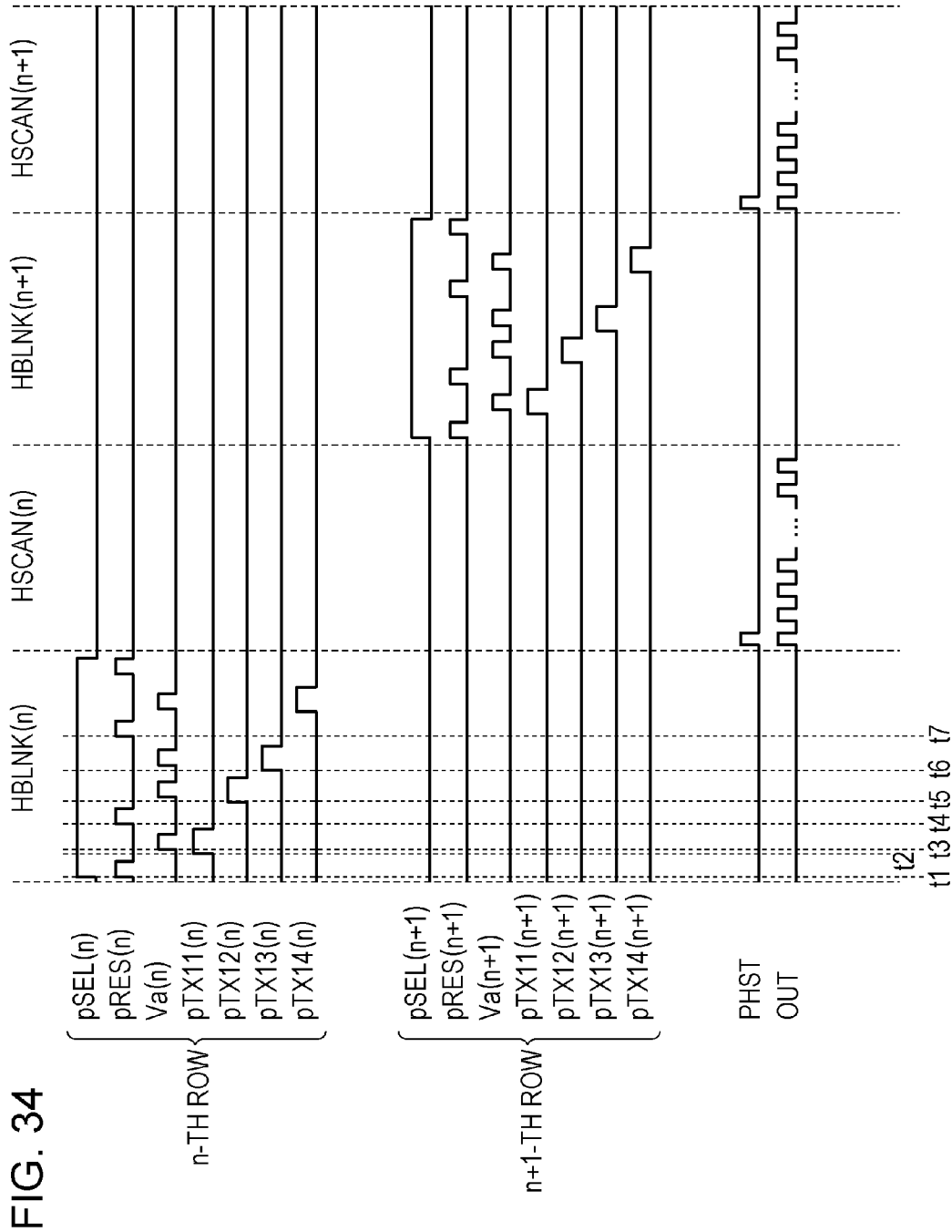
FIG. 34 is a timing chart for describing an operation of a solid-state image pickup element according to the eighth embodiment.

FIG. 34 is a timing chart for describing an operation of reading signals from the photoelectric conversion units in three layers in a case where the configuration illustrated in FIG. 33A is used for the signal reading circuit 400.

First, a signal based on the photoelectric conversion unit PC2 is read. At time t1, the levels of the signals pSEL(n) and pRES(n) become H-level, and the gate node N1 of the amplification transistor 403 is reset. After the level of the signal pRES(n) has been changed to L-level, the column signal processor samples and holds the signal output to the vertical signal line 130.

At time t2, the level of the signal pTX11(n) becomes H-level. At time t3 while the signal pTX11(n) is kept in H-level, the level of the bias voltage Va applied to the drive capacitor 402 becomes H-level. Accordingly, a signal based on the charges stored in the photoelectric conversion unit PC2 is output to the vertical signal line 130, and the signal is sampled and held by the column signal processor. Also in this embodiment, a signal with reduced noise can be obtained by obtaining a difference from a signal obtained by resetting the node N1.

At time t4, reading of a signal based on the photoelectric conversion unit PC1 is started. The level of the signal pRES(n) becomes H-level at time t4, and thus the node N1 is reset again. Accordingly, the signal output to the vertical signal line 130 is sampled and held by the column signal processor.

When the levels of the signal pTX12(n) and the bias voltage Va sequentially become H-level from time t5, a signal based on the charges stored in the photoelectric conversion unit PC1a is output to the vertical signal line 130. The signal output to the vertical signal line 130 is sampled and held by the column signal processor.

When the levels of the signal pTX13(n) and the bias voltage Va sequentially become H-level from time t6, the potential of the node N1 is changed in accordance with the amount of charges stored in the photoelectric conversion unit PC1b. As a result, a signal based on the sum of the charges stored in the photoelectric conversion units PC1a and PC1b is output to the vertical signal line 130. The signal output to the vertical signal line 130 is sampled and held by the column signal processor. As in the above-described embodiments, a signal that is sampled and held from time t5 to time t6 can be used as a phase difference detection signal, and a signal read in the operation starting from time t6 can be used as an image pickup signal. Further, with the difference between both the signals being obtained, a phase difference detection signal based on only the charges stored in the photoelectric conversion unit PC1b can be obtained.

From time t7, a signal based on the photoelectric conversion unit PC3 is read. This operation is the same as the operation of reading a signal based on the photoelectric conversion unit PC2, and thus the description thereof is omitted.

Accordingly, signals can be individually read from the photoelectric conversion units PC1 to PC3 that are stacked.

Figure 35:
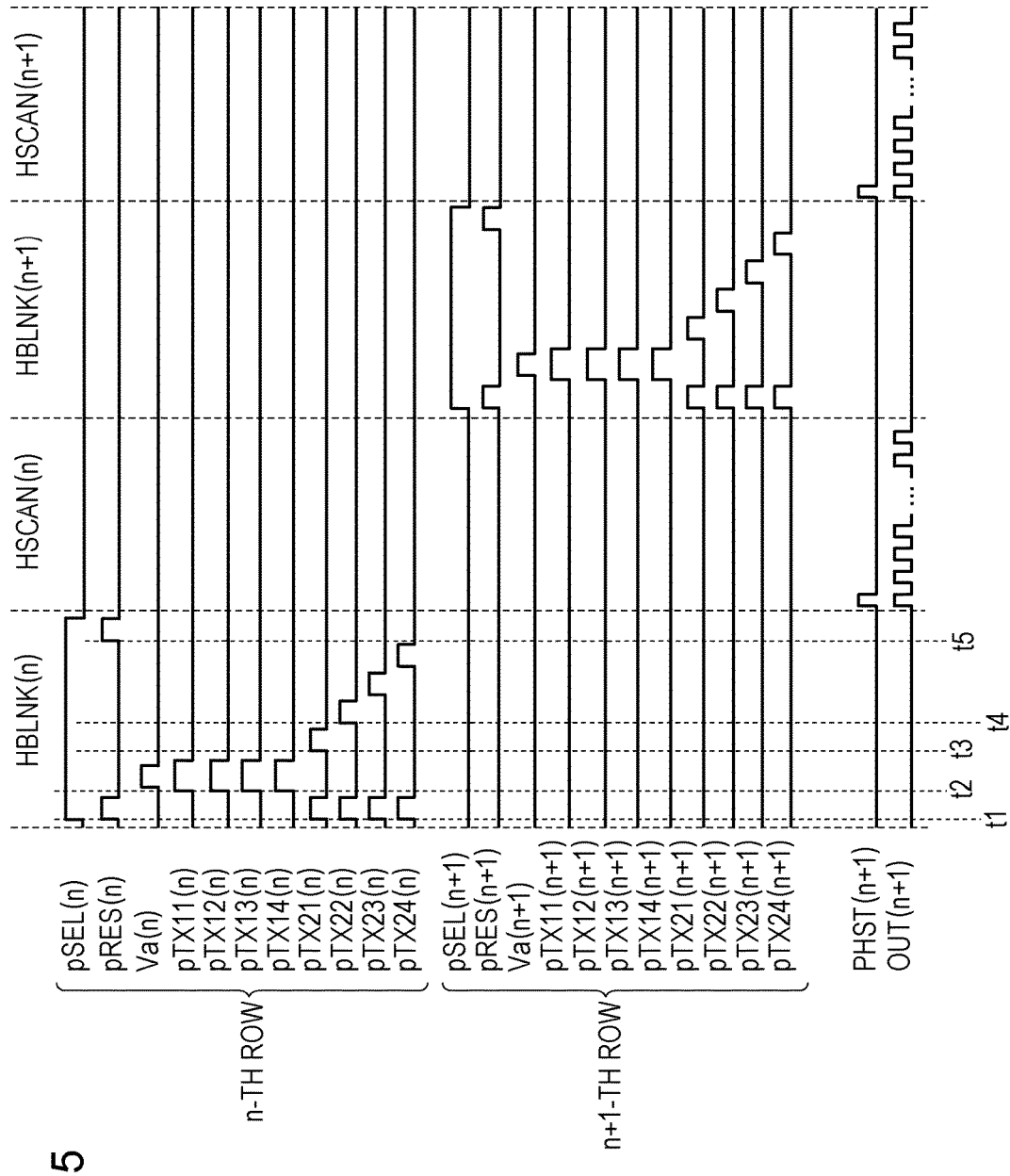
FIG. 35 is a timing chart for describing an operation of the solid-state image pickup element according to the eighth embodiment.

FIG. 35 is a timing chart for describing an operation of reading signals from the photoelectric conversion units in three layers in a case where the configuration illustrated in FIG. 33B is used for the signal reading circuit 400. In this embodiment, charges stored in the individual photoelectric conversion units are simultaneously transferred to the corresponding drive capacitors, and then signals are sequentially output from an amplification transistor. Hereinafter, it is assumed that the capacitance of the capacitor accompanying the node N1 is sufficiently small relative to the capacitance of each drive capacitor.

At time t1, the levels of the signals pSEL(n) and pRES(n) become H-level, and the gate node N1 of the amplification transistor 403 is reset. After the level of the signal pRES(n) has been changed to L-level, the column signal processor samples and holds a signal output to the vertical signal line 130. At time t1, the levels of the signals pTX21(n), pTX22(n), pTX23(n), and pTX24(n) become H-level, and thus the drive capacitors 402a to 402d are reset.

From time t2, the levels of the signals pTX11(n), pTX12(n), pTX13(n), and pTX14(n) become H-level. While the signals pTX11(n), pTX12(n), pTX13(n), and pTX14(n) are kept in H-level, the level of the bias voltage Va for the drive capacitor becomes H-level, and accordingly voltages based on the charges stored in the individual photoelectric conversion units are held by the corresponding drive capacitors 402a to 402d.

After that, when the level of the signal pTX21(n) becomes H-level at time t3, the potential of the node N1 is changed in accordance with the charge held in the drive capacitor 402a. A signal output thereby from the amplification transistor is sampled and held by the column signal processor. This signal is based on the photoelectric conversion unit PC2.

Subsequently, when the level of the signal pTX22(n) becomes H-level at time t4, the potential of the node N1 is changed in accordance with the charge stored in the drive capacitor 402b. A signal output thereby from the amplification transistor is sampled and held by the column signal processor. This signal is based on the photoelectric conversion unit PC1a. At time t4, the charge based on the photoelectric conversion unit PC2 is held by the node N1. However, since the capacitance of the capacitor accompanying the node N1 is sufficiently smaller than the capacitance of each drive capacitor, it is not necessary to reset the node N1 before the level of the signal pTX22(n) becomes H-level. In a case where the capacitor of the capacitance accompanying the node N1 is large relative to the capacitance of each drive capacitor and is not negligible, it is necessary to reset the node N1 before the level of the signal pTX22 becomes H-level.

After that, the levels of the signals pTX23(n) and pTX24(n) sequentially become H-level, and a signal output from the amplification transistor 403 is sampled and held by the column signal processor.

In this way, signals can be individually read from the photoelectric conversion units PC1 to PC3 that are stacked.

The order in which the signals are read is not limited to the orders illustrated in FIGS. 34 and 35. For example, the signal based on the photoelectric conversion unit PC1 may be read before the signals based on the photoelectric conversion units PC2 and PC3.

Also in this embodiment, as in the seventh embodiment, a phase difference detection signal may be obtained by using a photoelectric conversion unit other than the photoelectric conversion unit PC3 that is the closest to the microlens. Further, in this embodiment, photoelectric conversion units in two layers or photoelectric conversion units in four layers or more may be used.

In this embodiment, the same effect as that in the seventh embodiment can be obtained, and a signal based on the total amount of charges stored in the stacked photoelectric conversion units can be read.

Ninth Embodiment

FIG. 36 is a diagram illustrating an example configuration of an image pickup system. An image pickup system 800 includes, for example, an optical unit 810, the solid-state image pickup element 1000, a video signal processor 830, a recording/communication unit 840, a timing controller 850, a system controller 860, and a playback/display unit 870. An image pickup device 820 includes the solid-state image pickup element 1000 and the video signal processor 830. As the solid-state image pickup element 1000, any of the solid-state image pickup elements according to the individual embodiments described above is used.

The optical unit 810, which is an optical system including a lens and so forth, causes light from a subject to be focused on the pixel array 110, including a plurality of pixels arranged in a two dimensional manner, of the solid-state image pickup element 1000, and forms an image of the subject. The solid-state image pickup element 1000 outputs a signal corresponding to the light focused on the pixel array 110 at a timing based on a signal from the timing controller 850. The signal output from the solid-state image pickup element 1000 is input to the video signal processor 830, which is a video signal processor, and the video signal processor 830 performs signal processing on the signal in accordance with a method defined by a program or the like. The signal obtained through the processing performed by the video signal processor 830 is transmitted as image data to the recording/communication unit 840. The recording/communication unit 840 transmits a signal for forming an image to the playback/display unit 870, and causes the playback/display unit 870 to play back and display a moving image or a still image. Also, the recording/communication unit 840 communicates with the system controller 860 and records a signal for forming an image on a recording medium (not illustrated) in response to a signal from the video signal processor 830.

The system controller 860 controls the operation of the image pickup system in a centralized manner, and controls drive of the optical unit 810, the timing controller 850, the recording/communication unit 840, and the playback/display unit 870. The system controller 860 includes a storage device (not illustrated), which is a recording medium, for example. A program that is necessary to control the operation of the image pickup system and so forth is recorded in the storage device. The system controller 860 supplies, to the image pickup system, a signal for switching a drive mode or sensitivity in accordance with a user operation. Specific examples include change of a row to be read or a row to be reset, change of an angle of view in accordance with electronic zooming, and change of an angle of view in accordance with electronic image stabilizing. Switching of the sensitivity of the image pickup system in response to a user input enables switching of the sensitivity of the solid-state image pickup element 1000. That is, the system controller 860 has a function as a sensitivity selecting unit for selecting the sensitivity of the image pickup system 800, and the sensitivity of the solid-state image pickup element 1000 can be switched in accordance with a selected sensitivity.

The timing controller 850 controls the drive timing of the solid-state image pickup element 1000 and the video signal processor 830 on the basis of control performed by the system controller 860. The timing controller 850 can function as a sensitivity setting unit for setting the image pickup sensitivity of the solid-state image pickup element 1000.

OTHER EMBODIMENTS

In the first embodiment, each pixel includes two pixel electrodes 303a and 303b. The two pixel electrodes 303a and 303b may be disposed in the pixel in various manners. FIGS. 37A to 37E are schematic plan views of a pixel for describing examples of disposing pixel electrodes. In FIGS. 37A to 37E, the horizontal direction is a direction along the rows of the pixel array, and the direction perpendicular thereto is a direction along the columns of the pixel array.

Figure 37A:
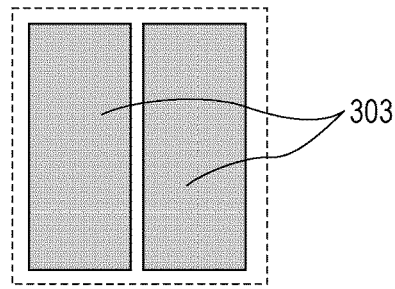
FIGS. 37A to 37E are schematic plan views of a pixel, describing examples of disposing pixel electrodes.

FIG. 37A illustrates an example in which the pixel electrodes 303a and 303b are disposed in the direction along the rows.

Figure 37B:
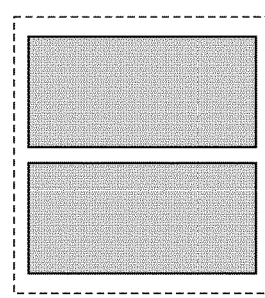

FIG. 37B illustrates an example in which the pixel electrodes 303a and 303b are disposed in the direction along the columns.

Figure 37C:
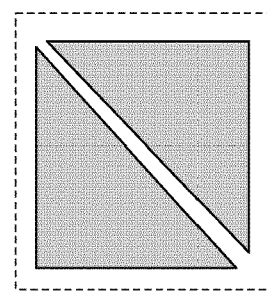

FIG. 37C illustrates an example in which the pixel electrodes 303a and 303b are disposed along a direction that forms 45 degrees with respect to the direction along the rows and the direction along the columns.

With a plurality of pixels having the configurations illustrated in FIGS. 37A to 37C, phase difference detection can be performed along a plurality of directions in the pixel array. For example, a plurality of pixels having the configuration illustrated in FIG. 37A are disposed in the direction along the columns, and a plurality of pixels having the configuration illustrated in FIG. 37B are disposed in the direction along the rows, and thereby phase difference detection can be performed in the vertical direction and the horizontal direction on the imaging surface. This is particularly useful in an image pickup system such as a digital camera because phase difference detection in a plurality of directions, not in only one direction, is necessary.

Figure 37D:
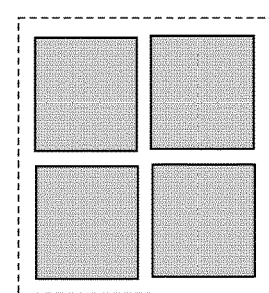
Figure 37E:
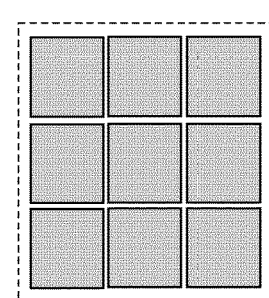

FIGS. 37D and 37E illustrate example configurations in a case where three or more pixel electrodes are provided.

FIG. 37D illustrates an example in which four pixel electrodes are disposed in two rows×two columns. With the individual pixel electrodes being controllable independently of one another, the pixel electrodes can be operated with the disposition illustrated in FIG. 37A in a certain operation mode, and the pixel electrodes can be operated with the disposition illustrated in FIG. 37B in another operation mode. That is, the direction of phase difference detection can be dynamically switched.

Also, with the disposition illustrated in FIG. 37E, a set of pixel electrodes to be simultaneously operated can be dynamically switched.

The pixel electrodes have been described above, but the same effect can be obtained by disposing counter electrodes in the same manner as in FIGS. 37A to 37E.

In the above-described embodiments, a description has been given of examples in which a continuous photoelectric conversion layer, that is, a common photoelectric conversion layer, is provided for a plurality of photoelectric conversion units included in the same pixel. The photoelectric conversion layer may be divided into portions by a photoelectric conversion layer separating unit that includes at least one of an insulating member and a light shielding member. Accordingly, the accuracy of phase difference detection can be increased.

Also, the photoelectric conversion layers of adjacent pixels may be separated from each other by a photoelectric conversion layer separating unit that includes at least one of an insulating member and a light shielding member.

The shapes of microlenses provided in individual pixels are not necessarily the same. For example, with the increasing distance from the center of the pixel array 110, an incident angle of light that enters the pixel becomes more parallel to the semiconductor substrate. Thus, even in a case where even light is applied to the solid-state image pickup element, the signal level obtained thereby increases as the distance from the center of the pixel array decreases. With the shapes of microlenses being changed in consideration of this point, even signals can be obtained in response to even incident light. More specifically, the curvatures or cross-section shapes of microlenses may vary.

The above-described embodiments are merely examples, and changes can be made without deviating from the spirit of the present disclosure. For example, the embodiments may be combined with one another.

While the present inventions have been described with reference to exemplary embodiments, it is to be understood that the inventions are not limited to the disclosed exemplary embodiments. The scope of the following claims is to be accorded the broadest interpretation so as to encompass all such modifications and equivalent structures and functions.

This application claims the benefit of Japanese Patent Application No. 2014-156789, filed Jul. 31, 2014, which is hereby incorporated by reference herein in its entirety.

What is claimed is:

1. A solid-state image pickup element including a plurality of pixels that are arranged in a two-dimensional manner, each of the plurality of pixels comprising:
    a plurality of photoelectric conversion units each including a pixel electrode, a photoelectric conversion layer disposed on the pixel electrode, and a counter electrode disposed on the photoelectric conversion layer;
    an amplification transistor in a substrate;
    a capacitor having a first wiring, a second wiring disposed facing the first wiring, and an insulating layer disposed between the first wiring and the second wiring, and
    a plurality of wiring layers including the first wiring and the second wiring, wherein the plurality of wiring layers are disposed between the plurality of photoelectric conversion units and the substrate
    wherein each of the plurality of photoelectric conversion units has a first photoelectric conversion unit and a second photoelectric conversion unit,
    wherein light collected by one microlens enters the first photoelectric conversion unit and the second photoelectric conversion unit,
    wherein the first wiring is electrically connected to a gate of the amplification transistor,
    wherein the second wiring is electrically connected to a bias voltage, and
    wherein in the plurality of wiring layers, another wiring layer is disposed between the substrate and both of the first wiring and the second wiring.

2. The solid-state image pickup element according to claim 1, wherein the plurality of photoelectric conversion units included in each of the plurality of pixels shares one of the pixel electrode and the counter electrode.

3. The solid-state image pickup element according to claim 1, wherein the plurality of photoelectric conversion units included in each of the plurality of pixels shares the photoelectric conversion layer.

4. The solid-state image pickup element according to claim 1, wherein the plurality of photoelectric conversion units included in each of the plurality of pixels includes at least one photoelectric conversion layer separating unit including at least one of a light shielding member and an insulating member, the at least one photoelectric conversion layer separating unit being disposed between the photoelectric conversion layers.

5. The solid-state image pickup element according to claim 1, wherein a light shielding film is disposed on the counter electrode and between two adjacent pixels among the plurality of pixels.

6. The solid-state image pickup element according to claim 5, wherein a protective film is disposed on the light shielding film.

7. The solid-state image pickup element according to claim 1, wherein the photoelectric conversion layer is composed of any of an intrinsic hydrogenated amorphous silicon, a compound semiconductor, and an organic semiconductor.

8. The solid-state image pickup element according to claim 1, wherein the counter electrodes included in the photoelectric conversion units included in the plurality of pixels are supplied with signals through different wiring lines.

9. The solid-state image pickup element according to claim 1,
wherein each of the plurality of pixels further comprises a signal reading circuit, and
wherein the signal reading circuit includes the capacitor that includes one node connected to the pixel electrode.

10. The solid-state image pickup element according to claim 9, further including a pixel electrode controller configured to control a potential of the pixel electrode via the capacitor.

11. The solid-state image pickup element according to claim 1, wherein each of the plurality of pixels further comprises a photoelectric conversion unit disposed between the plurality of photoelectric conversion units and the microlens.

12. The solid-state image pickup element according to claim 1, wherein an output node of the first photoelectric conversion unit and an output node of the second photoelectric conversion unit are connected to one and same input node of the amplification transistor.

13. The solid-state image pickup element according to claim 1,
wherein a signal for phase difference detection is read from the plurality of photoelectric conversion units, and
wherein a signal for image pickup is read from the first photoelectric conversion unit and the second photoelectric conversion unit.

14. The solid-state image pickup element according to claim 13, wherein the signal for phase difference detection and the signal for image pickup are read from the same circuit.

15. A solid-state image pickup element including a plurality of pixels that are arranged in a two-dimensional manner, each of the plurality of pixels comprising:
a photoelectric conversion unit including a pixel electrode, a photoelectric conversion layer disposed on the pixel electrode, and a counter electrode disposed on the photoelectric conversion layer;
one microlens disposed on the photoelectric conversion unit;
an amplification transistor in a substrate;
a capacitor having a first wiring, a second wiring disposed facing the first wiring, and an insulating layer disposed between the first wiring and the second wiring, and
a plurality of wiring layers including the first wiring and the second wiring, wherein the plurality of wiring layers are disposed between the plurality of photoelectric conversion units and the substrate
wherein at least one of the pixel electrode and the counter electrode included in each of the plurality of pixels includes a plurality of partial electrodes that are controllable independently of one another,
wherein each of the plurality of partial electrodes have a first partial electrode and a second partial electrode,
wherein the one microlens overlaps both the first partial electrode and the second partial electrode in planar view,
wherein the first wiring is electrically connected to a gate of the amplification transistor,
wherein the second wiring is electrically connected to a bias voltage, and
wherein in the plurality of wiring layers, another wiring layer is disposed between the substrate and both of the first wiring and the second wiring.

16. The solid-state image pickup element according to claim 15, wherein the pixel electrode includes the plurality of partial electrodes.

17. The solid-state image pickup element according to claim 15, wherein the counter electrode includes the plurality of partial electrodes.

18. The solid-state image pickup element according to claim 15, wherein an output node of the first partial electrode and an output node of the second partial electrode are connected to one and same input node of the amplification transistor.

19. The solid-state image pickup element according to claim 15,
wherein a signal for phase difference detection is read from the plurality of partial electrodes, and
wherein an image pickup signal is read from the first partial electrode and the second partial electrode.

20. The solid-state image pickup element according to claim 19, wherein the signal for phase difference detection and the signal for image pickup signal are read from the same circuit.

21. An image pickup system comprising:
the solid-state image pickup element according to claim 1;
an optical system configured to form an image on the plurality of pixels; and
a signal processor configured to process a signal for phase difference detection to generate phase difference data and configured to process the signal for image pickup to generate image data.

22. An image pickup system comprising:
the solid-state image pickup element according to claim 15;
an optical system configured to form an image on the plurality of pixels; and
a signal processor configured to process a signal for phase difference detection to generate phase difference data and configured to process the signal for image pickup to generate image data.

* * * * *